(12) United States Patent
Kohno et al.

(10) Patent No.: US 9,746,781 B2
(45) Date of Patent: Aug. 29, 2017

(54) EXPOSURE APPARATUS AND METHOD FOR PRODUCING DEVICE

(71) Applicants: NIKON CORPORATION, Tokyo (JP); NIKON ENGINEERING CO., LTD., Yokohama (JP)

(72) Inventors: Hirotaka Kohno, Ageo (JP); Takeshi Okuyama, Yokohama (JP); Hiroyuki Nagasaka, Kumagaya (JP); Katsushi Nakano, Kumagaya (JP)

(73) Assignees: NIKON CORPORATION, Tokyo (JP); NIKON ENGINEERING CO., LTD., Yokohama-shi (JP)

( * ) Notice: Subject to any disclaimer, the term of this patent is extended or adjusted under 35 U.S.C. 154(b) by 72 days.

(21) Appl. No.: 14/314,664

(22) Filed: Jun. 25, 2014

(65) Prior Publication Data

US 2014/0307238 A1    Oct. 16, 2014

Related U.S. Application Data

(62) Division of application No. 11/718,063, filed as application No. PCT/JP2006/301508 on Jan. 31, 2006, now abandoned.

(30) Foreign Application Priority Data

Jan. 31, 2005   (JP) .................. 2005-023026
Feb. 21, 2005   (JP) .................. 2005-044017
Jul. 21, 2005   (JP) .................. 2005-211317

(51) Int. Cl.
*G03B 27/52*    (2006.01)
*G03F 7/20*     (2006.01)

(52) U.S. Cl.
CPC .................. *G03F 7/70341* (2013.01)

(58) Field of Classification Search
CPC ............... G03F 7/2041; G03F 7/70341; G03F 7/70858; G03F 7/70866; G03F 7/70875;
(Continued)

(56) References Cited

U.S. PATENT DOCUMENTS 3,573,975 A    4/1971   Dhaka et al.
3,648,587 A    3/1972   Stevens
(Continued)

FOREIGN PATENT DOCUMENTS

CN    1501173 A    6/2004
DE    206 607      2/1909
(Continued)

OTHER PUBLICATIONS

May 27, 2009 Office Action in U.S. Appl. No. 11/790,878.
(Continued)

*Primary Examiner* — Christina Riddle
(74) *Attorney, Agent, or Firm* — Oliff PLC

(57) ABSTRACT

A liquid immersion exposure apparatus exposes a substrate with an exposure beam via a liquid immersion area formed on a portion of a surface of the substrate. The apparatus includes a projection system, a first nozzle member having an aperture through which the exposure beam is projected, the first nozzle member having a liquid supply inlet and a liquid recovery outlet, a second nozzle member having a gas supply inlet via which a gas is supplied to a space surrounding the liquid immersion area during the exposure, a driving system which moves the second nozzle member relative to the first nozzle member, and a stage system having a holder which holds the substrate and which is movable relative to and below the projection system, the first nozzle member and the second nozzle member.

54 Claims, 27 Drawing Sheets

(58) Field of Classification Search
  CPC ............ G03F 7/70883; G03F 7/70891; G03F 7/70916; G03F 7/70925; G03F 7/70933; G03F 7/70716
  USPC .............. 355/30, 52, 53, 55, 67, 72–75, 77; 430/5, 8, 22, 30, 311, 312, 321, 322, 394; 250/492.1, 492.2, 492.22, 548
  See application file for complete search history.

(56) References Cited

U.S. PATENT DOCUMENTS

| | | |
|---|---|---|
| 4,346,164 A | 8/1982 | Tabarelli et al. |
| 4,390,273 A | 6/1983 | Loebach et al. |
| 4,396,705 A | 8/1983 | Akeyama et al. |
| 4,480,910 A | 11/1984 | Takanashi et al. |
| 4,509,852 A | 4/1985 | Tabarelli et al. |
| 4,704,348 A | 11/1987 | Koizumi et al. |
| 4,729,932 A | 3/1988 | McElroy |
| 4,849,027 A | 7/1989 | Simmons |
| 5,040,020 A | 8/1991 | Rauschenbach et al. |
| 5,107,757 A | 4/1992 | Ohshita et al. |
| 5,121,256 A | 6/1992 | Corle et al. |
| 5,207,915 A | 5/1993 | Hagen et al. |
| 5,238,547 A | 8/1993 | Tsubouchi et al. |
| 5,610,683 A | 3/1997 | Takahashi |
| 5,715,039 A | 2/1998 | Fukuda et al. |
| 5,825,043 A | 10/1998 | Suwa |
| 5,900,354 A | 5/1999 | Batchelder |
| 5,969,441 A | 10/1999 | Loopstra et al. |
| 6,191,429 B1 | 2/2001 | Suwa |
| 6,208,407 B1 | 3/2001 | Loopstra |
| 6,236,634 B1 | 5/2001 | Lee et al. |
| 6,262,796 B1 | 7/2001 | Loopstra et al. |
| 6,341,007 B1 | 1/2002 | Nishi et al. |
| 6,400,441 B1 | 6/2002 | Nishi et al. |
| 6,549,269 B1 | 4/2003 | Nishi et al. |
| 6,560,032 B2 | 5/2003 | Hatano |
| 6,590,634 B1 | 7/2003 | Nishi et al. |
| 6,600,547 B2 | 7/2003 | Watson et al. |
| 6,603,130 B1 | 8/2003 | Bisschops et al. |
| 6,633,365 B2 | 10/2003 | Suenaga |
| 6,778,257 B2 | 8/2004 | Bleeker et al. |
| 6,781,670 B2 | 8/2004 | Krautschik |
| 6,788,477 B2 | 9/2004 | Lin |
| 6,867,844 B2 | 3/2005 | Vogel et al. |
| 6,988,327 B2 | 1/2006 | Garcia et al. |
| 7,053,983 B2 | 5/2006 | Tokita |
| 7,292,313 B2 | 11/2007 | Poon et al. |
| 7,339,650 B2 | 3/2008 | Coon et al. |
| 7,602,470 B2 | 10/2009 | Kemper et al. |
| 2002/0020821 A1 | 2/2002 | Van Santen et al. |
| 2002/0163629 A1 | 11/2002 | Switkes et al. |
| 2003/0030916 A1 | 2/2003 | Suenaga |
| 2003/0123040 A1 | 7/2003 | Almogy |
| 2003/0174408 A1 | 9/2003 | Rostalski et al. |
| 2004/0000627 A1 | 1/2004 | Schuster |
| 2004/0021844 A1 | 2/2004 | Suenaga |
| 2004/0075895 A1 | 4/2004 | Lin |
| 2004/0109237 A1 | 6/2004 | Epple et al. |
| 2004/0114117 A1 | 6/2004 | Bleeker et al. |
| 2004/0118184 A1 | 6/2004 | Violette |
| 2004/0119954 A1 | 6/2004 | Kawashima et al. |
| 2004/0125351 A1 | 7/2004 | Krautschik |
| 2004/0135099 A1 | 7/2004 | Simon et al. |
| 2004/0136494 A1 | 7/2004 | Lof et al. |
| 2004/0160582 A1 | 8/2004 | Lof et al. |
| 2004/0165159 A1 | 8/2004 | Lof et al. |
| 2004/0169834 A1 | 9/2004 | Richter et al. |
| 2004/0169924 A1 | 9/2004 | Flagello et al. |
| 2004/0180294 A1 | 9/2004 | Baba-Ali et al. |
| 2004/0180299 A1 | 9/2004 | Rolland et al. |
| 2004/0207824 A1 | 10/2004 | Lof et al. |
| 2004/0211920 A1 | 10/2004 | Derksen et al. |
| 2004/0224265 A1 | 11/2004 | Endo et al. |
| 2004/0224525 A1 | 11/2004 | Endo et al. |
| 2004/0227923 A1 | 11/2004 | Flagello et al. |
| 2004/0233405 A1 | 11/2004 | Kato et al. |
| 2004/0239954 A1 | 12/2004 | Bischoff |
| 2004/0253547 A1 | 12/2004 | Endo et al. |
| 2004/0253548 A1 | 12/2004 | Endo et al. |
| 2004/0257544 A1 | 12/2004 | Vogel et al. |
| 2004/0259008 A1 | 12/2004 | Endo et al. |
| 2004/0259040 A1 | 12/2004 | Endo et al. |
| 2004/0263808 A1 | 12/2004 | Sewell |
| 2004/0263809 A1 | 12/2004 | Nakano |
| 2005/0002004 A1 | 1/2005 | Kolesnychenko et al. |
| 2005/0007569 A1* | 1/2005 | Streefkerk ............. G03F 7/709 355/30 |
| 2005/0007570 A1 | 1/2005 | Streefkerk et al. |
| 2005/0018155 A1 | 1/2005 | Cox et al. |
| 2005/0018156 A1 | 1/2005 | Mulkens et al. |
| 2005/0024609 A1 | 2/2005 | De Smit et al. |
| 2005/0030497 A1 | 2/2005 | Nakamura |
| 2005/0030498 A1 | 2/2005 | Mulkens |
| 2005/0030506 A1 | 2/2005 | Schuster |
| 2005/0036121 A1 | 2/2005 | Hoogendam et al. |
| 2005/0036183 A1 | 2/2005 | Yeo et al. |
| 2005/0036184 A1 | 2/2005 | Yeo et al. |
| 2005/0036213 A1 | 2/2005 | Mann et al. |
| 2005/0037269 A1 | 2/2005 | Levinson |
| 2005/0041225 A1 | 2/2005 | Sengers et al. |
| 2005/0042554 A1 | 2/2005 | Dierichs et al. |
| 2005/0046813 A1 | 3/2005 | Streefkerk et al. |
| 2005/0046934 A1 | 3/2005 | Ho et al. |
| 2005/0048223 A1 | 3/2005 | Pawloski et al. |
| 2005/0052632 A1 | 3/2005 | Miyajima |
| 2005/0068639 A1 | 3/2005 | Pierrat et al. |
| 2005/0073670 A1 | 4/2005 | Carroll |
| 2005/0084794 A1 | 4/2005 | Meagley et al. |
| 2005/0094116 A1 | 5/2005 | Flagello et al. |
| 2005/0094125 A1 | 5/2005 | Arai |
| 2005/0100745 A1 | 5/2005 | Lin et al. |
| 2005/0110973 A1 | 5/2005 | Streefkerk et al. |
| 2005/0117224 A1 | 6/2005 | Shafer et al. |
| 2005/0122497 A1 | 6/2005 | Lyons et al. |
| 2005/0122505 A1 | 6/2005 | Miyajima |
| 2005/0132914 A1 | 6/2005 | Mulkens et al. |
| 2005/0134815 A1 | 6/2005 | Van Santen et al. |
| 2005/0134817 A1 | 6/2005 | Nakamura |
| 2005/0140948 A1 | 6/2005 | Tokita |
| 2005/0141098 A1 | 6/2005 | Schuster |
| 2005/0145265 A1 | 7/2005 | Ravkin et al. |
| 2005/0145803 A1 | 7/2005 | Hakey et al. |
| 2005/0146693 A1 | 7/2005 | Ohsaki |
| 2005/0146694 A1 | 7/2005 | Tokita |
| 2005/0146695 A1 | 7/2005 | Kawakami |
| 2005/0147920 A1 | 7/2005 | Lin et al. |
| 2005/0151942 A1 | 7/2005 | Kawashima |
| 2005/0153424 A1 | 7/2005 | Coon |
| 2005/0158673 A1 | 7/2005 | Hakey et al. |
| 2005/0164502 A1 | 7/2005 | Deng et al. |
| 2005/0174549 A1 | 8/2005 | Duineveld et al. |
| 2005/0175776 A1 | 8/2005 | Streefkerk et al. |
| 2005/0175940 A1 | 8/2005 | Dierichs |
| 2005/0185269 A1 | 8/2005 | Epple et al. |
| 2005/0190435 A1 | 9/2005 | Shafer et al. |
| 2005/0190455 A1 | 9/2005 | Rostalski et al. |
| 2005/0200815 A1 | 9/2005 | Akamatsu |
| 2005/0205108 A1 | 9/2005 | Chang et al. |
| 2005/0213061 A1 | 9/2005 | Hakey et al. |
| 2005/0213065 A1 | 9/2005 | Kitaoka |
| 2005/0213066 A1 | 9/2005 | Sumiyoshi |
| 2005/0213072 A1 | 9/2005 | Schenker et al. |
| 2005/0217135 A1 | 10/2005 | O'Donnell et al. |
| 2005/0217137 A1 | 10/2005 | Smith et al. |
| 2005/0217703 A1 | 10/2005 | O'Donnell |
| 2005/0219481 A1 | 10/2005 | Cox et al. |
| 2005/0219482 A1 | 10/2005 | Baselmans et al. |
| 2005/0219489 A1 | 10/2005 | Nei et al. |
| 2005/0219499 A1 | 10/2005 | Zaal et al. |
| 2005/0225737 A1 | 10/2005 | Weissenrieder et al. |
| 2005/0231694 A1 | 10/2005 | Kolesnychenko et al. |
| 2005/0233081 A1 | 10/2005 | Tokita |
| 2005/0237501 A1 | 10/2005 | Furukawa et al. |
| 2005/0237504 A1 | 10/2005 | Nagasaka et al. |

(56) References Cited

U.S. PATENT DOCUMENTS

| | | |
|---|---|---|
| 2005/0243292 A1 | 11/2005 | Baselmans et al. |
| 2005/0245005 A1 | 11/2005 | Benson |
| 2005/0253090 A1 | 11/2005 | Gau et al. |
| 2005/0259232 A1 | 11/2005 | Streefkerk et al. |
| 2005/0259233 A1 | 11/2005 | Streefkerk et al. |
| 2005/0259234 A1 | 11/2005 | Hirukawa et al. |
| 2005/0263068 A1 | 12/2005 | Hoogendam et al. |
| 2005/0264778 A1 | 12/2005 | Lof et al. |
| 2005/0270505 A1 | 12/2005 | Smith |
| 2005/0280791 A1 | 12/2005 | Nagasaka et al. |
| 2005/0282405 A1 | 12/2005 | Harpham et al. |
| 2006/0023184 A1* | 2/2006 | Coon .......... G03F 7/2041 355/53 |
| 2006/0038968 A1 | 2/2006 | Kemper et al. |
| 2006/0087630 A1 | 4/2006 | Kemper et al. |
| 2006/0103817 A1 | 5/2006 | Ten Kate et al. |
| 2006/0158627 A1 | 7/2006 | Kemper et al. |
| 2006/0221315 A1 | 10/2006 | Beckers et al. |
| 2006/0250591 A1 | 11/2006 | Straaijer |
| 2006/0250593 A1 | 11/2006 | Nishii |
| 2007/0139631 A1 | 6/2007 | Novak et al. |
| 2007/0146663 A1 | 6/2007 | Nagasaka |
| 2007/0195303 A1 | 8/2007 | Poon et al. |
| 2007/0242241 A1 | 10/2007 | Nagasaka et al. |
| 2008/0084546 A1 | 4/2008 | Owa et al. |

FOREIGN PATENT DOCUMENTS

| | | | | |
|---|---|---|---|---|
| DE | 242 880 | 1/1912 | | |
| DE | 221 563 A1 | 4/1985 | | |
| DE | 224 448 A1 | 7/1985 | | |
| EP | 0 023 231 | 2/1981 | | |
| EP | 0 418 427 A2 | 3/1991 | | |
| EP | 1 039 511 A1 | 9/2000 | | |
| EP | 1 420 298 A2 | 5/2004 | | |
| EP | 1420298 A2 | 5/2004 | | |
| EP | 1420299 A2 | 5/2004 | | |
| EP | 1 429 188 A2 | 6/2004 | | |
| EP | 1 431 710 A2 | 6/2004 | | |
| EP | 1 477 856 A1 | 11/2004 | | |
| EP | 1 494 079 A1 | 1/2005 | | |
| EP | 1 571 695 A1 | 9/2005 | | |
| EP | 1 571 697 A1 | 9/2005 | | |
| EP | 1 598 855 A1 | 11/2005 | | |
| EP | 1 612 850 A1 | 1/2006 | | |
| EP | 1 703 548 A1 | 9/2006 | | |
| EP | 1 753 016 A1 | 2/2007 | | |
| EP | 1796146 A1 | 6/2007 | | |
| FR | 2 474 708 | 1/1980 | | |
| JP | A-57-153433 | 9/1982 | | |
| JP | A-58-189018 | 11/1983 | | |
| JP | A 58-202448 | 11/1983 | | |
| JP | A 59-019912 | 2/1984 | | |
| JP | A 62-065326 | 3/1987 | | |
| JP | A-62-121417 | 6/1987 | | |
| JP | A 4-305915 | 10/1992 | | |
| JP | A 4-305917 | 10/1992 | | |
| JP | A 5-062877 | 3/1993 | | |
| JP | A 6-124873 | 5/1994 | | |
| JP | A-7-132262 | 5/1995 | | |
| JP | A 7-220990 | 8/1995 | | |
| JP | A 8-316125 | 11/1996 | | |
| JP | A 10-163099 | 6/1998 | | |
| JP | A 63-157419 | 6/1998 | | |
| JP | A 10-214783 | 8/1998 | | |
| JP | A-10-228661 | 8/1998 | | |
| JP | A-10-255319 | 9/1998 | | |
| JP | A 10-303114 | 11/1998 | | |
| JP | A 10-340846 | 12/1998 | | |
| JP | A 11-135400 | 5/1999 | | |
| JP | A 11-176727 | 7/1999 | | |
| JP | A 2000-058436 | 2/2000 | | |
| JP | A 2000-505958 | 5/2000 | | |
| JP | A 2000-164504 | 6/2000 | | |
| JP | A 2000-323404 | 11/2000 | | |
| JP | A-2001-91849 | 4/2001 | | |
| JP | WO 2004053955 A1 * | 6/2004 | ......... | G03F 7/70341 |
| JP | A-2004-193252 | 7/2004 | | |
| JP | A 2004-207710 | 7/2004 | | |
| JP | A-2004-207711 | 7/2004 | | |
| JP | A-2004-282023 | 10/2004 | | |
| JP | A 2004-289126 | 10/2004 | | |
| JP | 2004-343114 | 12/2004 | | |
| JP | A 2005-012228 | 1/2005 | | |
| JP | A 2005-019864 | 1/2005 | | |
| JP | A 2005-045223 | 2/2005 | | |
| JP | A-2005-85789 | 3/2005 | | |
| JP | A-2005-191344 | 7/2005 | | |
| JP | A-2006-295107 | 10/2006 | | |
| JP | A-2007-504662 | 3/2007 | | |
| NL | WO 2004055803 A1 * | 7/2004 | ......... | G03F 7/70341 |
| WO | WO 99/49504 | 9/1999 | | |
| WO | WO 01/35168 A1 | 5/2001 | | |
| WO | WO 02/091078 A1 | 11/2002 | | |
| WO | WO 03/077036 A1 | 9/2003 | | |
| WO | WO 03/077037 A1 | 9/2003 | | |
| WO | WO 2004/019128 A2 | 3/2004 | | |
| WO | WO 2004/053596 A2 | 6/2004 | | |
| WO | WO 2004/053950 A1 | 6/2004 | | |
| WO | WO 2004/053951 A1 | 6/2004 | | |
| WO | WO 2004/053952 A1 | 6/2004 | | |
| WO | WO 2004/053953 A1 | 6/2004 | | |
| WO | WO 2004/053954 A1 | 6/2004 | | |
| WO | WO 2004/053955 A1 | 6/2004 | | |
| WO | WO 2004/053956 A1 | 6/2004 | | |
| WO | WO 2004/053957 A1 | 6/2004 | | |
| WO | WO 2004/053958 A1 | 6/2004 | | |
| WO | WO 2004/053959 A1 | 6/2004 | | |
| WO | WO 2004/055803 A1 | 7/2004 | | |
| WO | WO 2004/057589 A1 | 7/2004 | | |
| WO | WO 2004/057590 A1 | 7/2004 | | |
| WO | WO 2004/077154 A2 | 9/2004 | | |
| WO | WO 2004/081666 A1 | 9/2004 | | |
| WO | WO 2004/086468 A1 | 10/2004 | | |
| WO | WO 2004/090577 A2 | 10/2004 | | |
| WO | WO 2004/090633 A2 | 10/2004 | | |
| WO | WO 2004/090634 A2 | 10/2004 | | |
| WO | WO 2004/090956 A1 | 10/2004 | | |
| WO | WO 2004/092830 A2 | 10/2004 | | |
| WO | WO 2004/092833 A2 | 10/2004 | | |
| WO | WO 2004/093130 A2 | 10/2004 | | |
| WO | WO 2004/093159 A2 | 10/2004 | | |
| WO | WO 2004/093160 A2 | 10/2004 | | |
| WO | WO 2004/095135 A2 | 11/2004 | | |
| WO | WO 2005/001432 A2 | 1/2005 | | |
| WO | WO 2005/001572 A2 | 1/2005 | | |
| WO | WO 2005/003864 A2 | 1/2005 | | |
| WO | WO 2005/006026 A2 | 1/2005 | | |
| WO | WO 2005/008339 A2 | 1/2005 | | |
| WO | WO 2005/010611 A2 | 2/2005 | | |
| WO | WO 2005/013008 A2 | 2/2005 | | |
| WO | WO 2005/015283 A1 | 2/2005 | | |
| WO | WO 2005/017625 A2 | 2/2005 | | |
| WO | WO 2005/019935 A2 | 3/2005 | | |
| WO | WO 2005/022266 A2 | 3/2005 | | |
| WO | WO 2005/022616 A1 | 3/2005 | | |
| WO | WO 2005/024325 A2 | 3/2005 | | |
| WO | WO 2005/024517 A2 | 3/2005 | | |
| WO | WO 2005/029559 A1 | 3/2005 | | |
| WO | WO 2005/034174 A2 | 4/2005 | | |
| WO | WO 2005/050324 A2 | 6/2005 | | |
| WO | WO 2005/054953 A2 | 6/2005 | | |
| WO | WO 2005/054955 A2 | 6/2005 | | |
| WO | WO 2005/059617 A2 | 6/2005 | | |
| WO | WO 2005/059618 A2 | 6/2005 | | |
| WO | WO 2005/059645 A2 | 6/2005 | | |
| WO | WO 2005/059654 A1 | 6/2005 | | |
| WO | WO 2005/062128 A2 | 7/2005 | | |
| WO | WO 2005/064400 A2 | 7/2005 | | |
| WO | WO 2005/064405 A2 | 7/2005 | | |
| WO | WO 2005/067013 A1 | 7/2005 | | |
| WO | WO 2005/069055 A2 | 7/2005 | | |
| WO | WO 2005/069078 A1 | 7/2005 | | |

(56) References Cited

FOREIGN PATENT DOCUMENTS

| WO | WO 2005/069081 A2 | 7/2005 |
|---|---|---|
| WO | WO 2005/071491 A2 | 8/2005 |
| WO | WO 2005/071717 A1 | 8/2005 |
| WO | WO 2005/074606 A2 | 8/2005 |
| WO | WO 2005/076084 A1 | 8/2005 |
| WO | WO 2005/081030 A1 | 9/2005 |
| WO | WO 2005/081067 A1 | 9/2005 |
| WO | WO 2005/098504 A1 | 10/2005 |
| WO | WO 2005/098505 A1 | 10/2005 |
| WO | WO 2005/098506 A1 | 10/2005 |
| WO | WO 2005/104195 A1 | 11/2005 |
| WO | WO 2005/106589 A1 | 11/2005 |
| WO | WO 2005/111689 A2 | 11/2005 |
| WO | WO 2005/111722 A2 | 11/2005 |
| WO | WO 2005/119368 A2 | 12/2005 |
| WO | WO 2005/119369 A1 | 12/2005 |

OTHER PUBLICATIONS

Mar. 12, 2010 Office Action in U.S. Appl. No. 11/790,878.
Mar. 29, 2010 Search Report issued in corresponding European Patent Application No. 06712651.6.
European Search Report issued for European Patent Application No. 07000192, dated Mar. 16, 2007.
European Official Action issued for European Patent Application No. 05254920.1-2222, dated Mar. 21, 2007.
San et al., "Dewatering Testing of a Ceramic Capillary Filter Produced from a High Silica-Containing Glaze," Key Engineering Materials, vols. 264-268 (2004), pp. 2223-2226.
San, "Microstructural Characterization of Capillary Filter Produced from a High Silica-Containing Glaze," Elsevier Science B.V., Materials Letters 57 (2003) 2189-2192.
European Search Report issued for Application No. EP 05254920. 1-2222, dated Jan. 30, 2006.
M. Switkes et al., "Immersion Lithography at 157 nm", MIT Lincoln Lab, Orlando 2001-1, Dec. 17, 2001.
M. Switkes et al., "Immersion Lithography at 157 nm", J. Vac. Sci. Technol. B., vol. 19, No. 6, Nov./Dec. 2001, pp. 2353-2356.
M. Switkes et al., "Immersion Lithography: Optics for the 50 nm Node", 157 Anvers-1, Sep. 4, 2002.
B.J. Lin, "Drivers, Prospects and Challenges for Immersion Lithography", TSMC, Inc., Sep. 2002.
B.J. Lin, "Proximity Printing Through Liquid", IBM Technical Disclosure Bulletin, vol. 20, No. 11B, Apr. 1978, p. 4997.
B.J. Lin, "The Paths to Subhalf-Micrometer Optical Lithography", SPIE vol. 922, Optical/Laser Microlithography (1988), pp. 256-269.
G.W.W. Stevens, "Reduction of Waste Resulting from Mask Defects", Solid State Technology, Aug. 1978, vol. 21 008, pp. 68-72.
S. Owa et al., "Immersion Lithography; its potential performance and issues", SPIE Microlithography 2003, 5040-186, Feb. 27, 2003.
S. Owa et al., "Advantage and Feasibility of Immersion Lithography", Proc. SPIE 5040 (2003).
Nikon Precision Europe GmbH, "Investor Relations—Nikon's Real Solutions", May 15, 2003.
H. Kawata et al., "Optical Projection Lithography using Lenses with Numerical Apertures Greater than Unity", Microelectronic Engineering 9 (1989), pp. 31-36.
J.A. Hoffnagle et al., "Liquid Immersion Deep-Ultraviolet Interferometric Lithography", J. Vac. Sci. Technol. B., vol. 17, No. 6, Nov./Dec. 1999, pp. 3306-3309.
B.W. Smith et al., "Immersion Optical Lithography at 193nm", Future FAB International, vol. 15, Jul. 11, 2003.
H. Kawata et al., "Fabrication of 0.2.mu.m Fine Patterns Using Optical Projection Lithography with an Oil Immersion Lens", Jpn. J. Appl. Phys. vol. 31 (1992), pp. 4174-4177.
G. Owen et al., "1/8.mu.m Optical Lithography", J. Vac. Sci. Technol. B., vol. 10, No. 6, Nov./Dec. 1992, pp. 3032-3036.

H. Hogan, "New Semiconductor Lithography Makes a Splash", Photonics Spectra, Photonics TechnologyWorld, Oct. 2003 Edition, pp. 1-3.
S. Owa and N. Nagasaka, "Potential Performance and Feasibility of Immersion Lithography", NGL Workshop 2003, Jul. 10, 2003, Slide Nos. 1-33.
S. Owa et al., "Update on 193nm Immersion exposure tool", Litho Forum, International SEMATECH, Los Angeles, Jan. 27-29, 2004, Slide Nos. 1-51.
H. Hata, "The Development of Immersion Exposure Tools", Litho Forum, International SEMATECH, Los Angeles, Jan. 27-29, 2004, Slide Nos. 1-24.
T. Matsuyama et al., "Nikon Projection Lens Update", SPIE Microlithography 2004, 5377-65, Mar. 2004.
"Depth-of-Focus Enhancement Using High Refractive Index Layer on the Imaging Layer", IBM Technical Disclosure Bulletin, vol. 27, No. 11, Apr. 1985, p. 6521.
A. Suzuki, "Lithography Advances on Multiple Fronts", EEdesign, EE Times, Jan. 5, 2004.
B. Lin, The .kappa..sub.3 coefficient in nonparaxial .lamda./NA scaling equations for resolution, depth of focus, and immersion lithography, J. Microlith., Microfab., Microsyst. 1(1):7-12 (2002).
Oct. 30, 2007 Notice of Allowance in U.S. Appl. No. 11/705,001.
Emerging Lithographic Technologies VI, Proceedings of SPIE, vol. 4688 (2002), Semiconductor Foundry, Lithography and Partners, B.J. Lin, pp. 11-24.
Optical Microlithography XV, Proceedings of SPIE, vol. 4691 (2002), "Resolution Enhancement of 157 nm Lithography by Liquid Immersion", M. Switkes et al., pp. 459-465.
J. Microlith., Microfab., Microsyst., vol. 1 No. 3, Oct. 2002, Society of Photo-Optical Instrumentation Engineers, "Resolution enhancement of 157 nm lithography by liquid immersion", M. Switkes et al., pp. 1-4.
Optical Microlithography XVI, Proceedings of SPIE vol. 5040 (2003), "Immersion lithography; its potential performance and issues", Soichi Owa et al., pp. 724-733.
Jul. 24, 2007 Office Action in U.S. Appl. No. 11/705,001.
Notice of Reasons for Rejection for Japanese Patent Application No. 2005-237216 dated Jul. 15, 2008.
Information Disclosure Statement filed Feb. 12, 2007 for U.S. Appl. No. 11/705,001.
Information Disclosure Statement filed Apr. 24, 2007 for U.S. Appl. No. 11/790,233.
Aug. 21, 2007 Notice of Allowance in U.S. Appl. No. 11/212,921.
Mar. 7, 2008 Office Action in U.S. Appl. No. 11/212,921.
Dec. 8, 2008 Office Action in U.S. Appl. No. 11/212,921.
Jun. 26, 2009 Notice of Allowance in U.S. Appl. No. 11/212,921.
Oct. 26, 2011 Office Action issued in Japanese Application No. 2006-021169 (w/translation).
Apr. 12, 2011 Office Action issued in Japanese Application No. 2006-021169 (w/translation).
May 14, 2012 Office Action issued in EP Application No. 06 712 651.6.
May 8, 2012 Office Action issued in U.S. Appl. No. 11/790,878.
May 16, 2006 International Search Report issued in Application No. PCT/JP2006/301508 (with English translation).
May 16, 2006 Written Opinion issued in Application No. PCT/JP2006/301508 (with English translation).
Dec. 4, 2012 Office Action issued in Japanese Patent Application No. 2010-255403 (with translation).
Aug. 2, 2011 Office Action issued in Japanese Patent Application No. 2006-021168 (with translation).
Jun. 14, 2013 Office Action issued in Korean Patent Application No. 10-2013-7010896 (with translation).
Apr. 18, 2013 Search Report issued in European Patent Application No. 12174372.8.
Feb. 25, 2010 Office Action issued in U.S. Appl. No. 11/718,063.
Nov. 15, 2010 Office Action issued in U.S. Appl. No. 11/718,063.
Jan. 17, 2013 Office Action issued in U.S. Appl. No. 11/718,063.
Sep. 30, 2013 Office Action issued in U.S. Appl. No. 11/718,063.
Mar. 25, 2014 Notice of Allowance issued in U.S. Appl. No. 11/718,063.

(56) References Cited

OTHER PUBLICATIONS

Nov. 9, 2015 Office Action issued in Korean Application No. 2014-7033113.
Aug. 22, 2016 Office Action issued in Korean Patent Application No. 10-2014-7033113.
Aug. 19, 2016 Search Report issued in European Patent Application No. 16160376.6.

* cited by examiner (A)

(B)

⇒ SCANNING MOVEMENT (A)

(B)

(A)

(B)

SCANNING MOVEMENT

EXPOSURE APPARATUS AND METHOD FOR PRODUCING DEVICE

TECHNICAL FIELD

This is a Divisional of U.S. patent application Ser. No. 11/718,063 (now abandoned), which is the U.S. National Stage of International Application No. PCT/JP2006/301508 filed Jan. 31, 2006. The entire disclosure of each of the prior applications is hereby incorporated by reference herein in its entirety.

The present invention relates to an exposure apparatus which exposes a substrate Through a liquid, and a method for producing a device.

BACKGROUND ART

An exposure apparatus, which projects a pattern formed on a mask onto a photosensitive substrate to perform the exposure, is used in the photolithography step as one of the steps of producing microdevices such as semiconductor devices and liquid crystal display devices. The exposure apparatus includes a mask stage which is movable while retaining the mask and a substrate stage which is movable while retaining the substrate. The image of the pattern of the mask is projected onto the substrate via a projection optical system while successively moving the mask stage and the substrate stage. In the microdevice production, it is required to realize a fine and minute pattern to be formed on the substrate in order to achieve a high density of the device. In order to respond to this requirement, it is demanded to realize a higher resolution of the exposure apparatus. A liquid immersion exposure apparatus, in which the optical path space of the exposure light between the projection optical system and the substrate is filled with a liquid to expose the substrate via the projection optical system and the liquid, has been contrived as one of means to realize the high resolution, as disclosed in International Publication No. 99/49504.

DISCLOSURE OF THE INVENTION

Task to be Solved by the Invention

As for the exposure apparatus, it is demanded to realize a high movement velocity of the substrate (substrate stage) in order to improve, for example, the productivity of the device. However, if the movement velocity is highly increased, there is such a possibility that it is difficult to satisfactorily retain the liquid in the optical path space between the projection optical system and the substrate. For example, when the movement velocity is highly increased, there is such a possibility that the liquid, with which the optical path space is filled, may leak. If the liquid leaks, the following inconvenience arises. That is, for example, any rust and/or any malfunction arises in peripheral members and/or devices, and the environment (for example, humidity and cleanness), in which the exposure apparatus is placed, is fluctuated. It is feared that the exposure accuracy and various measurement accuracies may be deteriorated.

The present invention has been made taking the foregoing circumstances into consideration, an object of which is to provide an exposure apparatus which makes it possible to avoid or suppress the leakage of the liquid with which the optical path space of the exposure light is filled, and a method for producing a device based on the use of the exposure apparatus.

Solution for the Task

In order to achieve the object as described above, the present invention adopts the following constructions corresponding to respective drawings as illustrated in embodiments.

According to a first aspect of the present invention, there is provided an exposure apparatus which exposes a substrate by irradiating an exposure light onto the substrate through a liquid; the exposure apparatus including a recovery port which recovers the liquid; a blow port which is provided at the outside of the recovery port with respect to an optical path space of the exposure light and which blows a gas therefrom; and a gas discharge port which is provided between the recovery port and the blow port and which discharges at least a part of the gas blown from the blow port.

According to the first aspect of the present invention, the gas blows from the blow port, and at least a part of the gas blown from the blow port is discharged from the gas discharge port. Accordingly, the predetermined flow of the gas can be generated in the vicinity of the recovery port. The liquid, with which the optical path space of the exposure light is filled, can be prevented from leaking by means of the generated flow of the gas.

According to a second aspect of the present invention, there is provided a method for producing a device; including exposing a substrate by using the exposure apparatus as defined in the foregoing aspect; developing the exposed substrate; and processing the developed substrate.

According to the second aspect of the present invention, it is possible to produce the device by using the exposure apparatus wherein the liquid, with which the optical path space is filled, is prevented from leaking.

According to a third aspect of the present invention, there is provided an exposure apparatus for exposing a substrate by irradiating an exposure light onto the substrate through a liquid; the exposure apparatus including a recovery port which recovers the liquid; and a suction port which is provided at the outside of the recovery port with respect to an optical path space of the exposure light and which sucks only a gas.

According to the third aspect of the present invention, a predetermined flow of the gas can be generated in the vicinity of the recovery port by sucking the gas from the suction port. It is possible to prevent the liquid from leaking by means of the generated flow of the gas.

According to a fourth aspect of the present invention, there is provided a method for producing a device; including exposing a substrate by using the exposure apparatus as defined in the foregoing aspect; developing the exposed substrate; and processing the developed substrate.

According to the fourth aspect of the present invention, it is possible to produce the device by using the exposure apparatus wherein the liquid, with which the optical path space is filled, is prevented from leaking.

Effect of the Invention

According to the present invention, the liquid, with which the optical path space of the exposure light is filled, can be prevented from leaking, and it is possible to maintain the exposure accuracy and the measurement accuracy.

BEST MODE FOR CARRYING OUT THE INVENTION

Embodiments of the present invention will be explained below with reference to the drawings. However, the present invention is not limited thereto.

First Embodiment

Figure 1:
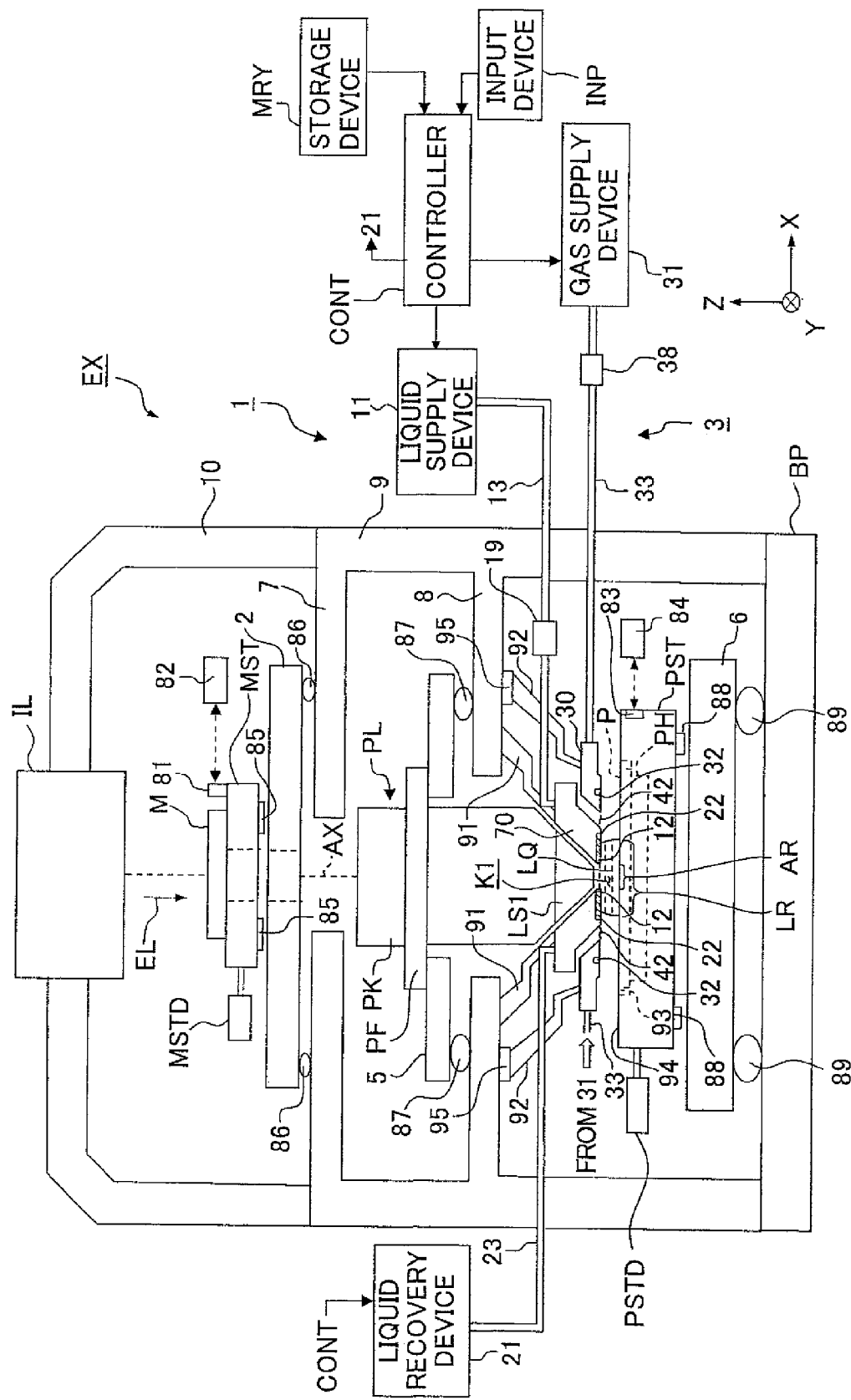
FIG. 1 shows a schematic arrangement illustrating an exposure apparatus according to a first embodiment.

FIG. 1 shows a schematic arrangement illustrating an exposure apparatus according to a first embodiment. With reference to FIG. 1, the exposure apparatus EX is provided with a mask stage MST which is movable while retaining a mask M, a substrate stage PST which is movable while retaining a substrate P, an illumination optical system IL which illuminates, with an exposure light beam (exposure light) EL, the mask M retained by the mask stage MST, a projection optical system PL which projects an image of a pattern of the mask M illuminated with the exposure light beam EL onto the substrate P retained by the substrate stage PST, and a controller CONT which integrally controls the operation of the entire exposure apparatus EX. A storage device MRY, which stores various information in relation to the exposure process, is connected to the controller CONT. Further, an input device INP, which makes it possible to input various information in relation to the exposure process to the controller CONT, is connected to the controller CONT.

The exposure apparatus EX of the embodiment of the present invention is the liquid immersion exposure apparatus in which the liquid immersion method is applied in order that the exposure wavelength is substantially shortened to improve the resolution and the depth of focus is substantially widened. The exposure apparatus EX is provided with a liquid immersion mechanism 1 which is provided to fill, with a liquid LQ, an optical path space K1 for the exposure light beam EL disposed on the image plane side of the projection optical system PL. The liquid immersion mechanism 1 includes a first nozzle member 70 which is provided in the vicinity of the optical path space K1 and which has supply ports 12 for supplying the liquid LQ and a recovery port 22 for recovering the liquid LQ, a liquid supply device 11 which supplies the liquid LQ via a first supply tube 13 and the supply ports 12 provided for the first nozzle member 70, and a liquid recovery device 21 which recovers the liquid LQ via a recovery tube 23 and the recovery ports 22 provided for the first nozzle member 70. As described in detail later on, a flow passage (supply flow passage) 14, which connects the supply port 12 and the first supply tube 13, is provided in the first nozzle member 70. Further, a flow passage (recovery flow passage) 24, which connects the recovery port 22 and the recovery tube 23, is provided in the first nozzle member 70. The first nozzle member 70 is formed to have an annular shape to surround a first optical element LS1 which is closest to the image plane of the projection optical system PL among a plurality of optical elements for constructing the projection optical system PL.

The exposure apparatus EX of this embodiment adopts the local liquid immersion system in which a liquid immersion area LR of the liquid LQ is locally formed on a part of the substrate P including a projection area AR of the projection optical system PL, the liquid immersion area LR being larger than the projection area AR and smaller than the substrate P. The exposure apparatus EX transfers the pattern of the mask M to the substrate P by irradiating, onto the substrate P, the exposure light beam EL passed through the mask M via the projection optical system PL and the liquid LQ with which the optical path space K1 is filled, while the optical path space K1 for the exposure light beam EL, which is between the first optical element LS1 closest to the image plane of the projection optical system PL and the substrate P arranged on the image plane side of the projection optical system PL, is filled with the liquid LQ at least during a period in which the pattern image of the mask M is projected onto the substrate P. The controller CONT drives the liquid supply device 11 of the liquid supply mechanism 1 and the liquid recovery device 21 such that a predetermined amount of the liquid LQ is supplied and a predetermined amount of the liquid LQ is recovered to form the liquid immersion area LR of the liquid LQ locally on the substrate P by filling the optical path space K1 with the liquid LQ.

The following explanation will be made principally about a case in which the optical path space K1 is filled with the liquid LQ in a state in which the projection optical system PL and the substrate P are opposite to one another. However, the present invention is also applicable equivalently when the optical path space K1 is filled with the liquid LQ in a state in which any object (for example, the upper surface of the substrate stage PST) other than the substrate P is opposite to the projection optical system PL.

The exposure apparatus EX is provided with a gas supply mechanism 3 which blows the gas therefrom. The gas supply mechanism 3 includes a second nozzle member 30 which is provided in the vicinity of the first nozzle member 70 and which has a blow port 32 from which the gas blows, and a gas supply device 31 which blows the gas therefrom via a second supply tube 33 and the blow port 32 provided for the second nozzle member 30. As described in detail later on, a flow passage (supply flow passage) 34, which connects the blow port 32 and the second supply tube 33, is provided in the second nozzle member 30. The second nozzle member 30 is formed to have an annular shape to surround the optical path space K1 and the first nozzle member 70. The gas blows uniformly from the surroundings of the liquid immersion area LR. The exposure apparatus EX further includes a gas discharge port 42 which is provided between the recovery port 22 and the blow port 32 and which discharges at least a part of the gas blown from the blow port 32.

The embodiment of the present invention will be explained as exemplified by a case of the use of the scanning type exposure apparatus (so-called scanning stepper) as the exposure apparatus EX in which the substrate P is exposed with the pattern formed on the mask M while synchronously moving the mask M and the substrate P in the mutually different directions (opposite directions) in the scanning directions. In the following explanation, the X axis direction resides in the synchronous movement direction (scanning direction) for the mask M and the substrate P in the horizontal plane, the Y axis direction (non-scanning direction) resides in the direction which is perpendicular to the X axis direction in the horizontal plane, and the Z axis direction resides in the direction which is perpendicular to the X axis direction and the Y axis direction and which is coincident with the optical axis AX of the projection optical system PL. The directions of rotation (inclination) about the X axis, the Y axis, and the Z axis are designated as θX, θY, and θZ directions respectively. The term "substrate" referred to herein includes those obtained by coating a base material such as a semiconductor wafer, for example, with a film member such as a photosensitive material (photoresist), and the term "mask" includes the reticle on which a device pattern to be subjected to the reduction projection onto the substrate is formed.

The exposure apparatus EX is provided with a base BP which is provided on the floor surface, and a main column 9 which is installed on the base BP. The main column 9 is provided with an upper stepped portion 7 and a lower stepped portion 8 which protrude inwardly. The illumination optical system IL is provided so that the mask M, which is retained by the mask stage MST, is illuminated with the exposure light beam EL. The illumination optical system IL is supported by a support frame 3 which is fixed to an upper portion of the main column 9.

The illumination optical system IL includes, for example, an optical integrator which uniformizes the illuminance of the light flux irradiated from an exposure light source, a condenser lens which collects the exposure light beam EL supplied from the optical integrator, a relay lens system, and a field diaphragm which defines the illumination area on the mask M illuminated with the exposure light beam EL. The predetermined illumination area on the mask M is illuminated with the exposure light beam EL having a uniform illuminance distribution by means of the illumination optical system IL. Those usable as the exposure light beam EL irradiated from the illumination optical system IL include, for example, emission lines (g-ray, h-ray, i-ray) irradiated, for example, from a mercury lamp, far ultraviolet light beams (DUV light beams) such as the KrF excimer laser beam (wavelength: 248 nm), and vacuum ultraviolet light beams (VUV light beams) such as the ArF excimer laser beam (wavelength: 193 nm) and the $F_2$ laser beam (wavelength: 157 nm). In this embodiment, the ArF excimer laser beam is used.

In this embodiment, pure water is used as the liquid LQ. Not only the ArF excimer laser beam but also the emission line (g-ray, h-ray, i-ray) irradiated, for example, from a mercury lamp and the far ultraviolet light beam (DUV light beam) such as the KrF excimer laser beam (wavelength: 248 nm) are also transmissive through pure water.

The mask stage MST is movable while retaining the mask M. The mask stage MST retains the mask M by means of the vacuum attraction (or the electrostatic attraction). A plurality of gas bearings (air bearings) 85, which are non-contact bearings, are provided on the lower surface of the mask stage MST. The mask stage MST is supported in a non-contact manner with respect to an upper surface (guide surface) of a mask stage surface plate 2 by means of the air bearings 85. Openings, through which the pattern image of the mask M passes, are formed at central portions of the mask stage MST and the mask stage surface plate 2 respectively. The mask stage surface plate 2 is supported by the upper stepped portion 7 of the main column 9 by the aid of a vibration-preventive device 86. That is, the mask stage MST is supported by the upper stepped portion 7 of the main column 9 by the aid of the vibration-preventive device 86 and the mask stage surface plate 2. The mask stage surface plate 2 and the main column 9 are separated from each other in view of the vibration by means of the vibration-preventive device 86 so that the vibration of the main column 9 is not transmitted to the mask stage surface plate 2 which supports the mask stage MST.

The mask stage MST is two-dimensionally movable in the plane perpendicular to the optical axis AX of the projection optical system PL, i.e., in the XY plane, and it is finely rotatable in the θZ direction on the mask stage surface plate 2 in a state in which the mask M is retained, in accordance with the driving operation of the mask stage-driving device MSTD including, for example, a linear motor controlled by the controller CONT. A movement mirror 81, which is movable together with the mask stage MST, is fixedly secured on the mask stage MST. A laser interferometer 82 is provided at a position opposite to the movement mirror 81. The position in the two-dimensional direction and the angle of rotation in the θZ direction of the mask M on the mask stage MST are measured in real-time by the laser interferometer 82. The angles of rotation in the θX and θY directions may be measured by the laser interferometer 82. The result of the measurement of the laser interferometer 82 is outputted to the controller CONT. The controller CONT drives the mask stage-driving device MSTD on the basis of the result of the measurement obtained by the laser interferometer 82 to control the position of the mask M retained by the mask stage MST.

The projection optical system PL projects the image of the pattern of the mask M onto the substrate P at a predetermined projection magnification β. The projection optical system PL is provided with a plurality of optical elements. The optical elements are retained by a barrel PK. In this embodiment, the projection optical system PL is based on the reduction system having the projection magnification β which is, for example, ¼, ⅕, or ⅛. The projection optical system PL may be based on any one of the 1× magnification system and the magnifying system. The projection optical system PL may be based on any one of the dioptric system including no catoptric optical element, the catoptric system including no dioptric optical element, and the cata-dioptric system including dioptric and catoptric optical elements. The first optical element LS1, which is closest to the image plane of the projection optical system PL among the plurality of optical elements for constructing the projection optical system PL, is exposed from the barrel PK.

A flange PF is provided on the outer circumference of the barrel PK which retains the projection optical system PL. The projection optical system PL is supported by a barrel surface plate 5 by the aid of the flange PF. The barrel surface plate 5 is supported by the lower stepped portion 8 of the main column 9 by the aid of a vibration-preventive device 87. That is, the projection optical system PL is supported by the lower stepped portion 8 of the main column 9 by the aid of the vibration-preventive device 87 and the barrel surface plate 5. The barrel surface plate 5 is separated from the main column 9 in view of vibration by the vibration-preventive device 87 so that the vibration of the main column 9 is not transmitted to the barrel surface plate 5 which supports the projection optical system PL.

The substrate stage PST has the substrate holder PH which retains the substrate P. The substrate stage PST is movable while retaining the substrate P. The substrate holder PH retains the substrate P, for example, by means of the vacuum attraction. A recess 93 is provided on the substrate stage PST. The substrate holder PH for retaining the substrate P is arranged in the recess 93. The upper surface 94, which is disposed around the recess 93 of the substrate stage PST, forms a flat surface to provide approximately the same height as that of (is flush with) the surface of the substrate P retained by the substrate holder PH.

A plurality of gas bearings (air bearings) 88, which are the non-contact bearings, are provided on the lower surface of the substrate stage PST. The substrate stage PST is supported in a non-contact manner by the air bearings 88 with respect to the upper surface (guide surface) of the substrate stage surface plate 6. The substrate stage surface plate 6 is supported on the base BP by the aid of a vibration-preventive device 89. The substrate stage surface plate 6 is separated from the main column 9 and the base BP (floor surface) in view of vibration by the vibration-preventive device 89 so that the vibration of the base BP (floor surface) and the main column 9 is not transmitted to the substrate stage surface plate 6 which supports the substrate stage PST.

The substrate stage PST is two-dimensionally movable in the XY plane, and it is finely rotatable in the θZ direction on the substrate stage surface plate 6 in a state in which the substrate P is retained by the aid of the substrate holder PH, in accordance with the driving operation of the substrate stage-driving device PSTD including, for example, the linear motor which is controlled by the controller CONT. Further, the substrate stage PST is also movable in the Z axis direction, the θX direction, and the θY direction. Therefore, the surface of the substrate P retained by the substrate stage PST is movable in the directions of six degrees of freedom of the X axis, Y axis, Z axis, θX, θY, and θZ directions. A movement mirror 83, which is movable together with the substrate stage PST, is secured to the side surface of the substrate stage PST. A laser interferometer 84 is provided at a position opposite to the movement mirror 83. The angle of rotation and the position in the two-dimensional direction of the substrate P on the substrate stage PST are measured in real-time by the laser interferometer 84. The exposure apparatus EX is provided with a focus/leveling-detecting system based on the oblique incidence system which detects the surface position information about the surface of the substrate P retained by the substrate stage PST, as disclosed, for example, in Japanese Patent Application Laid-open No. 2004-207710. The result of the measurement performed by the laser interferometer 84 is outputted to the controller CONT. The result of the detection performed by the focus/leveling-detecting system is also outputted to the controller CONT. The controller CONT drives the substrate stage-driving device PSTD on the basis of the detection result of the focus/leveling-detecting system to control the angle of inclination (θX, θY) and the focus position (Z position) of the substrate P so that the surface of the substrate P is adjusted to match the image plane formed via the projection optical system PL and the liquid LQ, and the position of the substrate P is controlled in the X axis direction, the Y axis direction, and the θZ direction on the basis of the measurement result of the laser interferometer 84.

The liquid supply device 11 of the liquid immersion mechanism 1 is provided with, for example, a tank for accommodating the liquid LQ, a pressurizing pump, a temperature regulation device for regulating the temperature of the liquid LQ to be supplied, and a filter unit for removing any foreign matter contained in the liquid LQ. One end of the first supply tube 13 is connected to the liquid supply device 11. The other end of the first supply tube 13 is connected to the first nozzle member 70. The liquid supply operation of the liquid supply device 11 is controlled by the controller CONT. It is unnecessary that the exposure apparatus EX is provided with, for example, all of the tank, the pressurizing pump, the temperature regulation mechanism, and the filter unit of the liquid supply device 11. It is also allowable to substitutively use any equipment of the factory or the like in which the exposure apparatus EX is installed.

A flow rate controller 19 called "mass flow controller", which controls the amount of the liquid per unit time to be fed from the liquid supply device 11 and supplied to the image plane side of the projection optical system PL, is provided at an intermediate position of the first supply tube 13. The control of the liquid supply amount based on the use of the flow rate controller 19 is performed under the instruction signal of the controller CONT.

The liquid recovery device 21 of the liquid immersion mechanism 1 is provided with, for example, a vacuum system such as a vacuum pump, a gas/liquid separator for separating the gas from the recovered liquid LQ, and a tank for accommodating the recovered liquid LQ. One end of the recovery tube 23 is connected to the liquid recovery device 21. The other end of the recovery tube 23 is connected to the first nozzle member 70. The liquid recovery operation of the liquid recovery device 21 is controlled by the controller CONT. It is unnecessary that the exposure apparatus EX is provided with, for example, all of the vacuum system, the gas/liquid separator, and the tank of the liquid recovery device 21. It is also allowable to substitutively use any equipment of the factory or the like in which the exposure apparatus EX is installed.

The gas supply device 31 of the gas supply mechanism 3 is provided with a filter unit including, for example, a chemical filter and a particle-removing filter. It is possible to supply the clean gas which passes through the filter unit. The gas supply device 31 supplies the gas which is approximately the same as the gas contained in the chamber in which the exposure apparatus EX is accommodated. In this embodiment, the gas supply device 31 supplies the air (dry air). The gas, which is to be supplied from the gas supply device 31, may be, for example, nitrogen gas (dry nitrogen). One end of the second supply tube 33 is connected to the gas supply device 31. The other end of the second supply tube 33 is connected to the second nozzle member 30. The gas supply operation of the gas supply device 31 is controlled by the controller CONT.

The gas supply mechanism 3 is provided with an adjusting device 38 which is provided at an intermediate position of the flow passage of the second supply tube 33 and which is capable of adjusting the amount per unit time of the gas supplied from the gas supply device 31 to the second nozzle member 30. The adjusting device 38 includes, for example, a valve mechanism. The operation of the adjusting device 38 is controlled by the controller CONT. The controller CONT can adjust the gas supply amount per unit time for the second nozzle member 30 by adjusting the opening degree of the valve of the adjusting device 38. The controller CONT can adjust the gas blow amount per unit time in which the gas is blown from the blow port 32 provided for the second nozzle member 30 by adjusting the gas supply amount per unit time for the second nozzle member 30 by using the adjusting device 38. Any arbitrary system may be adopted for the adjusting device 38 provided that the gas blow amount per unit time in which the gas is blown from the blow port 32 is adjustable.

The first nozzle member 70 is supported by a first support mechanism 91. The first support mechanism 91 is connected to the lower stepped portion 8 of the main column 9. The main column 9, which supports the first nozzle member 70 by the aid of the first support mechanism 91, is separated in view of vibration by the vibration-preventive device 87 from the barrel surface plate 5 which supports the barrel PK of the projection optical system PL by the aid of the flange PF. Therefore, the vibration, which is generated on the first nozzle member 70, is prevented from being transmitted to the projection optical system PL. The main column 9 is separated in view of vibration by the vibration-preventive device 89 from the substrate stage surface plate 6 which supports the substrate stage PST. Therefore, the vibration, which is generated on the first nozzle member 70, is prevented from being transmitted to the substrate stage PST via the main column 9 and the base BP. Further, the main column 9 is separated in view of vibration by the vibration-preventive device 86 from the mask stage surface plate 2 which supports the mask stage MST. Therefore, the vibration, which is generated on the first nozzle member 70, is prevented from being transmitted to the mask stage MST via the main column 9.

The second nozzle member 30 is supported by a second support mechanism 92. The second support mechanism 92 is connected to the lower stepped portion 8 of the main column 9. The main column 9 is separated in view of vibration by the vibration-preventive device 87 from the barrel surface plate 5. Therefore, the vibration, which is generated on the second nozzle member 30, is prevented from being transmitted to the projection optical system PL. The main column 9 is separated in view of vibration by the vibration-preventive device 89 from the substrate stage surface plate 6. Therefore, the vibration, which is generated on the second nozzle member 30, is prevented from being transmitted to the substrate stage PST. Further, the main column 9 is separated in view of vibration by the vibration-preventive device 86 from the mask stage surface plate 2. Therefore, the vibration, which is generated on the second nozzle member 30, is prevented from being transmitted to the mask stage MST.

The second support mechanism 92 is provided with a driving device 95 which drives the second nozzle member 30. The driving device 95 is capable of moving the second nozzle member 30 supported by the second support mechanism 92 in the directions of six degrees of freedom of the X axis, Y axis, Z axis, θX, θY, and θZ directions. The driving device 95 is composed of, for example, a linear motor or a voice coil motor driven by the Lorentz force. The voice coil motor or the like, which is driven by the Lorentz force, has a coil and a magnet. The coil and the magnet are driven in a non-contact state. Therefore, when the driving device 95, which drives the second nozzle member 30, is constructed by the driving device such as the voice coil motor driven by the Lorentz force, it is possible to suppress the generation of vibration.

The operation of the driving device 95 is controlled by the controller CONT. The controller CONT can adjust the position and the posture (inclination) of the second nozzle member 30 supported by the second support mechanism 92 by driving the driving device 95. The second nozzle member 30 is driven by the driving device 95. Therefore, the blow port 32, which is provided for the second nozzle member 30, is movable with respect to the recovery port 22 which is provided for the first nozzle member 70.

Figure 2:
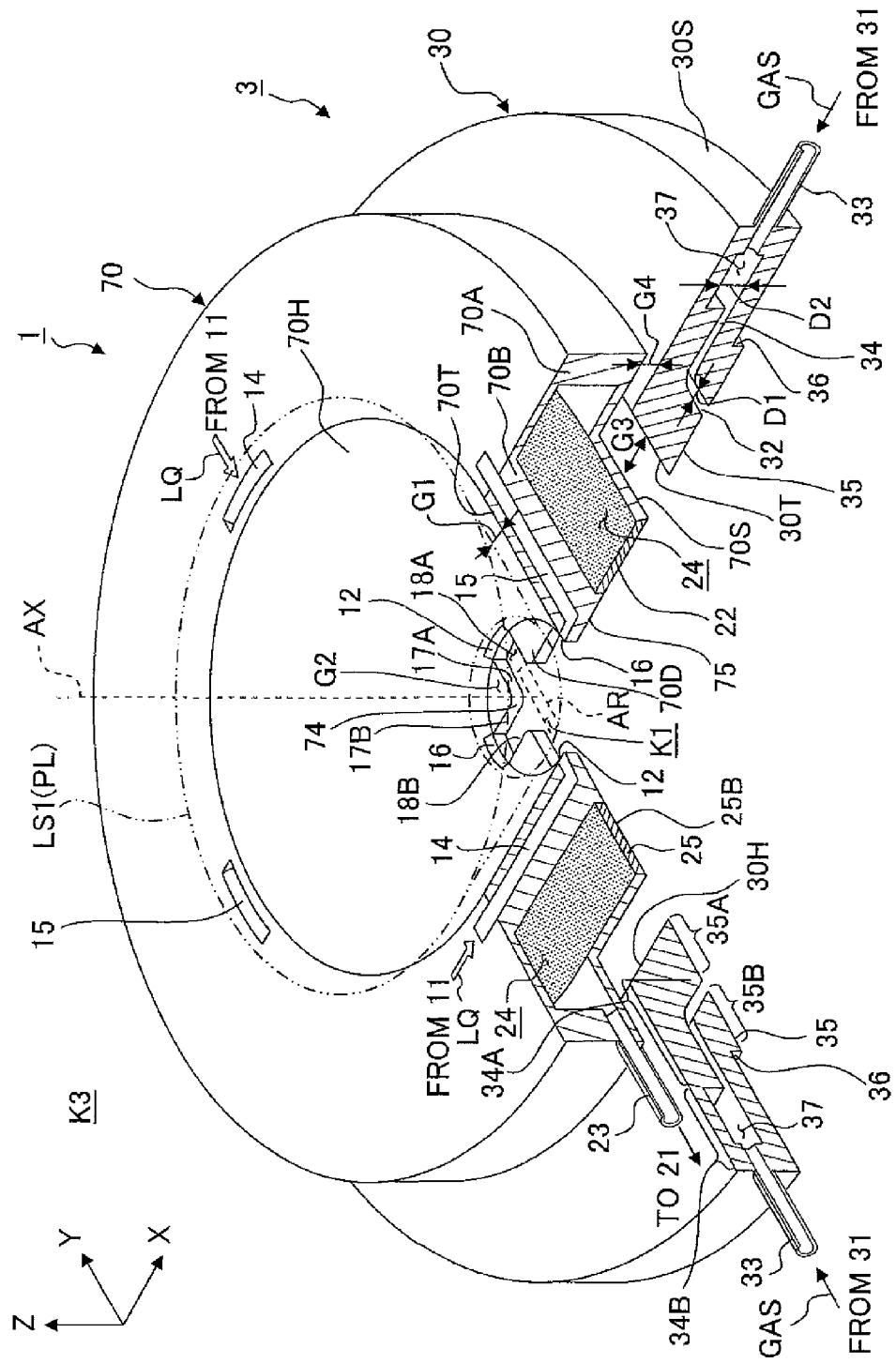
FIG. 2 shows, with partial cutout, a schematic perspective view illustrating magnified main components of the exposure apparatus according to the first embodiment.
Figure 3:
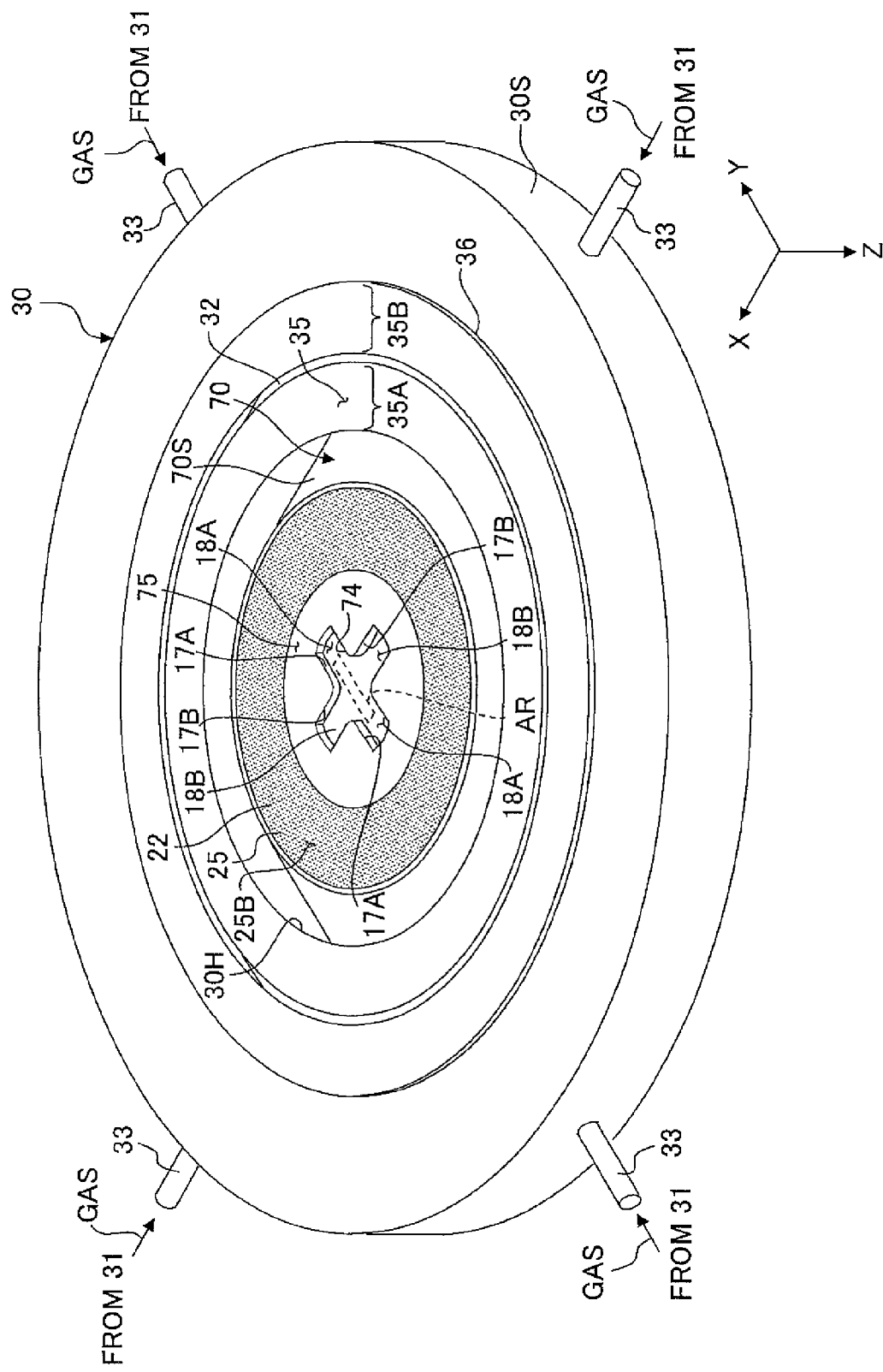
FIG. 3 shows a perspective view illustrating those shown in FIG. 2 as viewed from a lower position.
Figure 4:
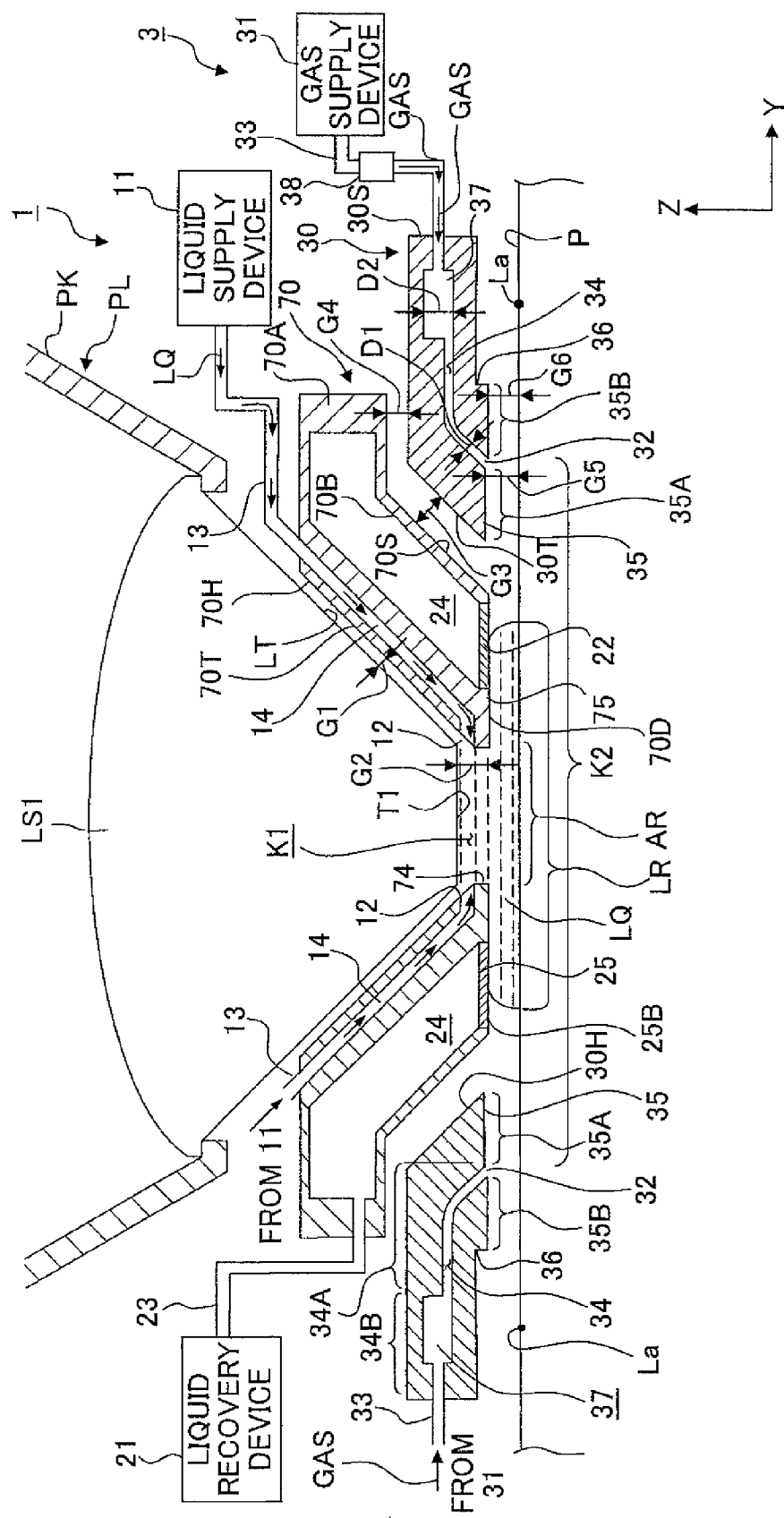
FIG. 4 shows a side sectional view taken in parallel to the YZ plane shown in FIG. 2.
Figure 5:
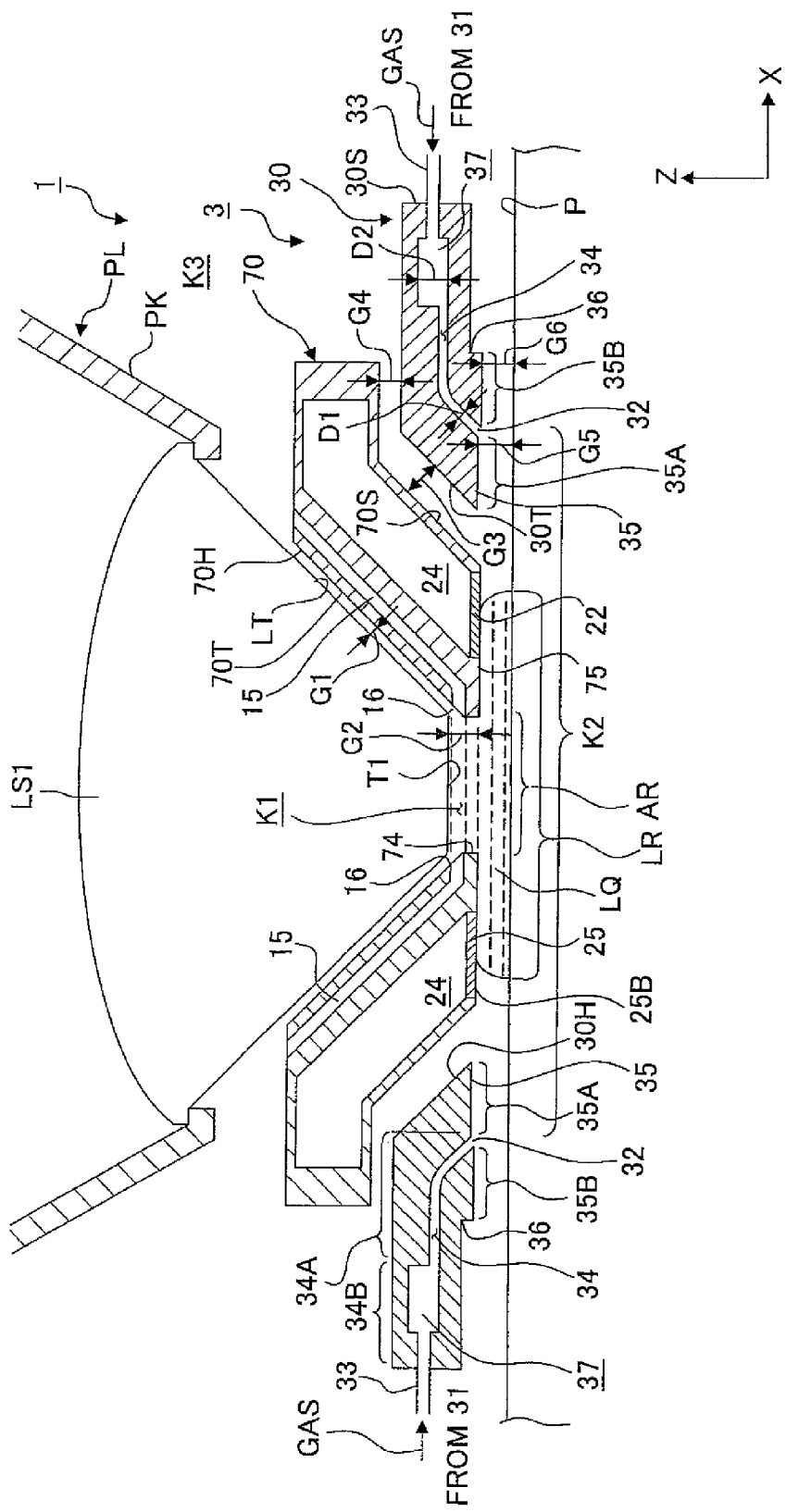
FIG. 5 shows a side sectional view taken in parallel to the XZ plane shown in FIG. 2.

Next, an explanation will be made about the first nozzle member 70 and the second nozzle member 30 with reference to FIGS. 2 to 5. FIG. 2 shows, with partial cutout, a schematic perspective view illustrating those disposed in the vicinity of the first nozzle member 70 and the second nozzle member 30. FIG. 3 shows a perspective view illustrating the first nozzle member 70 and the second nozzle member 30 as viewed from the lower side. FIG. 4 shows a side sectional view taken in parallel to the YZ plane. FIG. 5 shows a side sectional view taken in parallel to the XZ plane.

The first nozzle member 70 is provided in the vicinity of the first optical element LS1 which is closest to the image plane of the projection optical system PL. The first nozzle member 70 is an annular member. The first nozzle member 70 is arranged to surround the first optical element LS1 over or above the substrate P (substrate stage PST). The first nozzle member 70 has a hole 7011 disposed at its central portion in which the projection optical system PL (first optical element LS1) can be arranged. The first nozzle member 70 is constructed by combining a plurality of members. The first nozzle member 70 is formed to have a substantially circular shape as viewed in a plan view as a whole. The first nozzle member 70 may be constructed by one member. The first nozzle member 70 can be formed of, for example, aluminum, titanium, stainless steel, duralumin, or any alloy containing such metals.

A surface treatment is performed to at least a part of the first nozzle member 70 in order to suppress the elution of any impurity to the liquid LQ. Such a surface treatment includes a treatment in which chromium oxide is deposited or adhered to the first nozzle member 70. For example, there are exemplified the "GOLDEP" treatment and the "GOLDEP WHITE" treatment available from Kobelco Eco-Solutions Co., Ltd. In this embodiment, the surface treatment as described above is performed to at least a part of the liquid contact surface of the first nozzle member 70 to make contact with the liquid LQ.

The first nozzle member 70 has an inclined portion 70B, a protruding portion 70A which protrudes outwardly from the upper end of the inclined portion 70B with respect to the optical path space K1, and a bottom plate portion 70D which is provided inside the lower end of the inclined portion 70B with respect to the optical path space K1. The first optical element LS1 is arranged inside the hole 70H formed by the inclined portion 70B. The inner side surface 70T of the inclined portion 70B (inner side surface of the hole 70H) is formed to have a mortar-shaped form to extend along the side surface LT of the first optical element LS1 while opposing to the side surface LT of the first optical element LS1 of the projection optical system PL. Specifically, the side surface LT of the first optical element LS1 and the inner side surface 70T of the inclined portion 70B of the first nozzle member 70 are inclined so that the distance with respect to the substrate P is gradually decreased in relation to the direction directed from the outside to the inside of the optical path space K1. In this embodiment, the side surface LT of the first optical element LS1 and the inner side surface 70T of the inclined portion 70B of the first nozzle member 70 are inclined by a predetermined angle (for example, approximately 45°) with respect to the surface of the substrate P held by the substrate stage PST (i.e., the XY plane). A predetermined gap G1 is provided between the inner side surface 70T of the inclined portion 70B and the side surface LT of the first optical element LS1. Owing to the provision of the gap G1, the vibration, which is generated on the first nozzle member 70, is prevented from being directly transmitted to the side of the projection optical system PL (first optical element LS1). The inner side surface 70T of the inclined portion 70B is liquid-repellent (water-repellent) with respect to the liquid LQ, which suppresses the inflow of the liquid LQ into the gap G1 between the side surface LT of the first optical element LS1 of the projection optical system PL and the inner side surface 70T of the inclined portion 70B. The liquid-repelling treatment, which is performed to make the inner side surface 70T of the inclined portion 70B liquid-repellent, includes, for example, treatments for the coating with any liquid-repellent material including, for example, a fluorine-based resin material such as polytetrafluoroethylene (Teflon, trade name), an acrylic resin material, and a silicon-based resin material.

A part of the bottom plate portion 70D is arranged between the substrate P (substrate stage PST) and the lower surface T1 of the first optical element LS1 of the projection optical system PL in relation to the Z axis direction. An opening 74, through which the exposure light beam EL passes, is formed at a central portion of the bottom plate portion 70D. The opening 74 is formed to be larger than the projection area AR onto which the exposure light beam EL is irradiated. Accordingly, the exposure light beam EL, which passes through the projection optical system PL, can arrive at the surface of the substrate P without being shielded by the bottom plate portion 70D. In this embodiment, the opening 74 is formed to have a substantially cross-shaped form as viewed in a plan view.

The lower surface 75 of the first nozzle member 75, which is opposite to the surface of the substrate P held by the substrate stage PST, is a flat surface parallel to the XY plane. In this embodiment, the lower surface 75 of the first nozzle member 70 includes the lower surface of the bottom plate portion 70D and the lower surface of the inclined portion 70B. The lower surface of the bottom plate portion 70D is continued to the lower surface of the inclined portion 70B. In this arrangement, the surface of the substrate P held by the substrate stage PST is substantially parallel to the XY plane. Therefore, the lower surface 75 of the first nozzle member 70 is provided so that the lower surface 75 is opposite to the surface of the substrate P held by the substrate stage PST, and the lower surface 75 is substantially parallel to the surface of the substrate P. In the following description, the lower surface 75 of the first nozzle member 70 is appropriately referred to as "land surface 75".

The distance between the surface of the substrate P and the lower surface T1 of the first optical element LS1 is longer than the distance between the surface of the substrate P and the land surface 75. That is, the lower surface T1 of the first optical element LS1 is provided at the position higher than the land surface 75. The liquid LQ, with which the optical path space K1 is filled, makes contact with the land surface 75. The liquid LQ, with which the optical path space K1 is filled, also makes contact with the lower surface T1 of the first optical element LS1. That is, the land surface 75 of the first nozzle member 70 and the lower surface T1 of the first optical element LS1 are the liquid contact surfaces to make contact with the liquid LQ with which the optical path space K1 is filled.

The land surface 75 is provided at the position closest to the substrate P held by the substrate stage PST, of the first nozzle member 70. The land surface 75 is provided to surround the projection area AR between the substrate P and the lower surface T1 of the projection optical system PL. The bottom plate portion 70D is provided to make no contact with the lower surface T1 of the first optical element LS1 and the substrate P (substrate stage PST). A space having a predetermined gap G2 is provided between the lower surface T1 of the first optical element LS1 and the upper surface of the bottom plate portion 70D. In the following description, the space, which is disposed inside the first nozzle member 70 and which includes the space between the lower surface T1 of the first optical element LS1 and the upper surface of the bottom plate portion 70D, is appropriately referred to as "internal space G2".

The first nozzle member 70 is provided with the supply port 12 for supplying the liquid LQ and the recovery port 22 for recovering the liquid LQ. The first nozzle member 70 is provided with the supply flow passage 14 connected to the supply port 12 and the recovery flow passage 24 connected to the recovery port 22. Although the illustration is omitted or simplified in FIGS. 2 to 5, the supply flow passage 14 is connected to the other end of the first supply tube 13, and the recovery flow passage 24 is connected to the other end of the recovery tube 23.

As appreciated from FIG. 4, the supply flow passage 14 is formed by a slit-shaped through-hole which penetrates in the direction of inclination through the inclined portion 70B of the first nozzle member 70. The supply flow passage 14 is inclined so that the distance with respect to the substrate P is gradually decreased in relation to the direction directed from the outside to the inside of the optical path space K1.

In this embodiment, the supply flow passage 14 is provided substantially in parallel to the inner side surface 70T of the inclined portion 70B. In this embodiment, the supply flow passages 14 are provided on the both sides in the Y axis direction with respect to the optical path space K1 (projection area AR) respectively. The upper end of the supply flow passage (through-hole) 14 is connected to the other end of the first supply tube 13. Accordingly, the supply flow passage 14 is connected to the liquid supply device 11 via the first supply tube 13. On the other hand, the lower end of the supply flow passage 14 is connected to the internal space G2 between the first optical element LS1 and the bottom plate portion 70D. The lower end of the supply flow passage 14 is the supply port 12. The supply ports 12 are provided at the predetermined positions on the both sides in the Y axis direction with the optical path space K1 intervening therebetween respectively at the outside of the optical path space K1 for the exposure light beam EL. The supply port 12 makes it possible to supply the liquid LQ to the internal space G2.

As shown in FIG. 5, the first nozzle member 70 includes the discharge port 16 which discharges (evacuates) the gas contained in the internal space G2 to the external space (atmospheric space) K3, and the discharge flow passage 15 which is connected to the discharge port 16. The discharge flow passage 15 is formed by a slit-shaped through-hole which penetrates in the direction of inclination through the inclined portion 70B of the first nozzle member 70. The discharge flow passage 15 is inclined so that the distance with respect to the substrate P is gradually decreased in relation to the direction directed from the outside to the inside of the optical path space K1. In this embodiment, the discharge flow passage 15 is provided substantially in parallel to the inner side surface 70T of the inclined portion 70B. In this embodiment, the discharge flow passages 15 are provided on the both sides in the X axis direction with respect to the optical path space K1 (projection area AR) respectively. The upper end of the discharge flow passage (through-hole) 15 is connected to the external space (atmospheric space) K3, which is in a state of being open to the atmospheric air. On the other hand, the lower end of the discharge flow passage 15 is connected to the internal space G2 between the first optical element LS1 and the bottom plate portion 70D. The lower end of the discharge flow passage 15 is the discharge port 16. The discharge ports 16 are provided at the predetermined positions on the both sides in the X axis direction with the optical path space K1 intervening therebetween respectively at the outside of the optical path space K1 for the exposure light beam EL. The discharge port 16 is connected to the gas contained in the internal space G2, i.e., the gas existing around the image plane of the projection optical system PL. Therefore, the gas contained in the internal space G2 can be discharged (evacuated) to the external space (atmospheric space) K3 from the upper end of the discharge flow passage 15 via the discharge ports 16.

The upper end of the discharge flow passage 15 connected to the internal space G2 may be connected to a suction device to forcibly discharge the gas contained in the internal space G2.

The bottom plate portion 70D functions as a guide member for guiding the flow of the liquid LQ supplied from the supply port 12. The bottom plate portion 70D guides the flow so that the liquid LQ, which is supplied from the supply port 12, flows toward the position at which the discharge port 16 is provided or the vicinity thereof. As shown in FIGS. 2 and 3, the bottom plate portion 70D has a first guide portion 17A which forms the flow directed from the position of provision of the supply port 12 to the optical path space K1 for the exposure light beam EL (projection area AR), and a second guide portion 17B which forms the flow directed from the optical path space K1 for the exposure light beam EL to the position of provision of the discharge port 16. That is, a flow passage 18A, which allows the liquid LQ to flow from the supply port 12 toward the optical path space K1 for the exposure light beam EL, is formed by the first guide portion 17A, and a flow passage 18B, which allows the liquid LQ to flow from the optical path space K1 for the exposure light beam EL toward the discharge port 16, is formed by the second guide portion 17B.

The flow passage 18A, which is formed by the first guide portion 17A, intersects the flow passage 18B which is formed by the second guide portion 17B. The flow passage 18A, which is formed by the first guide portion 17A, allows the liquid LQ to flow substantially in the Y axis direction. The flow passage 18B, which is formed by the second guide portion 17B, allows the liquid LQ to flow substantially in the X axis direction. The opening 74, which has the substantially cross-shaped form as viewed in a plan view, is formed by the first guide portion 17A and the second guide portion 17B. In this arrangement, the exposure light beam EL passes through an approximately central portion of the opening 74 formed to have the substantially cross-shaped form. That is, the optical path space K1 for the exposure light beam EL (projection area AR) is defined at the intersecting portion between the flow passage 18A formed by the first guide portion 17A and the flow passage 18B formed by the second guide portion 17B. In this embodiment, the flow passage 18A, which is formed by the first guide portion 17A, is substantially perpendicular to the flow passage 18B which is formed by the second guide portion 17B.

It is not necessarily indispensable that the opening 74 of the bottom plate portion 70B has the cross-shaped form. The opening 74 may have, for example, a rectangular shape adapted to the cross-sectional shape of the exposure light beam EL.

The first nozzle member 70 has, in its interior, a space (internal chamber) 24 which is open downwardly at the lower surface of the inclined portion 70B. The recovery port 22 corresponds to the opening of the space 24. The space 24 functions as a recovery flow passage. The space 24 is provided outside the supply flow passage 14 and the discharge flow passage 15 with respect to the optical path space K1. A part of the recovery flow passage (space) 24 and the other end of the recovery tube 23 are connected to one another at the protruding portion 70A of the first nozzle member 70.

The recovery port 22 is provided at the position opposite to the surface of the substrate P over or above the substrate P held by the substrate stage PST. The surface of the substrate P held by the substrate stage PST is separated by a predetermined distance from the recovery port 22 provided for the first nozzle member 70. The recovery port 22 is provided outside the supply port 12 with respect to the optical path space K1 on the image plane side of the projection optical system PL. The recovery port 22 is formed annularly to surround the optical path space K1 (projection area AR), the land surface 75, and the supply port 12. That is, the supply port 12 for supplying the liquid LQ is provided inside the recovery port 22 with respect to the optical path space K1. In this embodiment, the recovery port 22 is formed to have an annular shape as viewed in a plan view.

The first nozzle member 70 is provided with a porous member 25 which has a plurality of holes (pores). The porous member 25 is arranged to cover the recovery port 22. In this embodiment, the porous member 25 is a mesh member having a plurality of holes. Those usable as the porous member 25 also include, for example, a mesh member formed with a honeycomb pattern composed of a plurality of substantially hexagonal holes. The porous member 25 can be formed by performing the punching processing to a plate member to serve as a base material for the porous member composed of, for example, stainless steel (for example SUS 316). A plurality of thin plate-shaped porous members 25 may be arranged in an overlapped manner at the recovery port 22 as well.

In this embodiment, the porous member 25 is liquid-attractive (water-attractive or hydrophilic) with respect to the liquid LQ. The liquid-attracting treatment (surface treatment) for allowing the porous member 25 to be liquid-attractive includes a treatment in which chromium oxide is deposited or adhered to the porous member 25. Specifically, there are exemplified the "GOLDEP" treatment and the "GOLDEP WHITE" treatment as described above. When the surface treatment is performed as described above, the elution of any impurity from the porous member 25 to the liquid LQ is suppressed. In this embodiment, the porous member 25 is formed to have a thin plate-shaped form, which has a thickness of, for example, about 100 μm. The porous member 25 can be also composed of, for example, a porous member made of ceramics.

The porous member 25 has the lower surface 25B opposite to the substrate P held by the substrate stage PST. The lower surface 25B of the porous member 25, which is opposite to the substrate P, is substantially flat. The porous member 25 is provided at the recovery port 22 so that the lower surface 25B is substantially parallel to the surface of the substrate P (i.e., the XY plane) held by the substrate stage PST. The liquid LQ is recovered via the porous member 25 arranged at the recovery port 22. The recovery port 22 is formed annularly to surround the optical path space K1. Therefore, the porous member 25, which is arranged at the recovery port 22, is formed annularly to surround the optical path space K1.

The porous member 25 is provided at the recovery port 22 so that the lower surface 25B and the land surface 75 are at approximately the same position (height) in the Z axis direction, and the lower surface 25B and the land surface 75 are continued to one another. That is, the land surface 75 is formed continuously to the lower surface 25B of the porous member 25.

Next, the gas supply mechanism 3 will be explained. The second nozzle member 30 of the gas supply mechanism 3 is a member distinct from the first nozzle member 70. The second nozzle member 30 is provided in the vicinity of the first nozzle member 70. The second nozzle member 30 is provided outside the first nozzle member 70 with respect to the optical path space K1. The second nozzle member 30 is an annular member. The second nozzle member 30 is arranged to surround the optical path space K1 and the first nozzle member 70 over or above the substrate P (substrate stage PST). The second nozzle member 30 has a hole 30H in which the first nozzle member 70 can be arranged. The second nozzle member 30 is constructed by combining a plurality of members. The second nozzle member 30 is formed to have a substantially circular shape as viewed in a plan view as a whole. The second nozzle member 30 may be constructed by one member. The second nozzle member 30 can be formed of, for example, aluminum, titanium, stainless steel, duralumin, or any alloy containing such metals.

The inner side surface 30T of the hole 30H of the second nozzle member 30 is opposite to the side surface 70S of the inclined portion 70B of the first nozzle member 70. The inner side surface 30T is formed to have a mortar-shaped form to extend along the side surface 70S of the inclined portion 70B. Specifically, each of the side surface 70S of the first nozzle member 70 and the inner side surface 30T of the second nozzle member 30 is inclined so that the distance from the substrate P is gradually decreased in relation to the direction directed from the outside to the inside of the optical path space K1. In this embodiment, the side surface 70S of the first nozzle member 70 and the inner side surface 30T of the second nozzle member 30 are provided substantially in parallel to the inner side surface 70T of the inclined portion 70B of the first nozzle member 70T respectively. That is, the side surface 70S of the first nozzle member 70 and the inner side surface 30T of the second nozzle member 30 are inclined by about 45° with respect to the surface of the substrate P (XY plane) held by the substrate stage PST respectively. A space having a predetermined gas G3 is provided between the side surface 70S of the first nozzle member 70 and the inner side surface 30T of the second nozzle member 30.

In this embodiment, the protruding portion 70A of the first nozzle member 70 is arranged over or above the second nozzle member 30. The lower surface of the protruding portion 70A is opposite to a part of the upper surface of the second nozzle member 30. In this embodiment, the lower surface of the protruding portion 70A and the upper surface of the second nozzle member 30 are provided substantially in parallel to the XY plane. A predetermined gap G4 is provided between the lower surface of the protruding portion 70A and the upper surface of the second nozzle member 30.

Owing to the provision of the gap G3 and the gap G4, the vibration, which is generated on one of the first nozzle member 70 and the second nozzle member 30, is prevented from being directly transmitted to the other. Further, the second nozzle member 30 can be moved by the driving device 95 without causing any collision with the first nozzle member 70.

The second nozzle member 30 is provided with the blow port 32 which blows the gas therefrom. The second nozzle member 30 has the lower surface 35 which is opposite to the surface of the substrate P over or above the substrate P held by the substrate stage PST. The blow port 32 is provided on the lower surface 35. Therefore, the blow port 32 is provided at the position opposite to the surface of the substrate P over or above the substrate P held by the substrate stage PST. The surface of the substrate P held by the substrate stage PST is separated by a predetermined distance from the blow port 32 provided on the lower surface 35 of the second nozzle member 30.

The blow port 32 is provided outside the recovery port 22 provided for the first nozzle member 70 with respect to the optical path space K1 disposed on the image plane side of the projection optical system PL. The blow port 32 is formed annularly to surround the optical path space K1 (projection area AR) and the recovery port 22 of the first nozzle member 70. In this embodiment, the blow port 32 is formed annularly as viewed in a plan view. The blow port 32 is formed to have a slit-shaped form having a predetermined slit width D1.

The first area 35A of the lower surface 35 of the second nozzle member 30, which is inside the blow port 32 with respect to the optical path space K1, is a flat surface which is provided substantially in parallel to the XY plane, i.e., substantially in parallel to the surface of the substrate P held by the substrate stage PST. A predetermined gap G5 is provided between the first area 35A of the lower surface 35 of the second nozzle member 30 and the substrate P held by the substrate stage PST.

In this embodiment, the second area 35B of the lower surface 35 of the second nozzle member 30, which is outside the blow port 32 with respect to the optical path space K1, is also a flat surface which is provided substantially in parallel to the XY plane, i.e., substantially in parallel to the surface of the substrate P held by the substrate stage PST. A predetermined gap G6 is provided between the second area 35B of the lower surface 35 of the second nozzle member 30 and the substrate P held by the substrate stage PST. In this embodiment, the gap G6 is smaller than the gap G5. A difference in height is provided between the first area 35A and the second area 35B.

As described above, the lower surface 35 of the second nozzle member 30 is separated from the surface of the substrate P held by the substrate stage PST. In this embodiment, the lower surface 35 (first area 35A) of the second nozzle member 30 is provided at the position which is at approximately the same height as or slightly higher than those of the land surface 75 of the first nozzle member 70 and the lower surface 25B of the porous member 25 provided for the recovery port 22.

The distance (i.e., the gap G3) between the side surface 70S of the first nozzle member 70 and the inner side surface 30T of the second nozzle member 30 is provided to be larger than the distance (i.e., the gap G5) between the substrate P and the first area 35A of the lower surface 35 of the second nozzle member 30.

The portion of the second nozzle member 30, which is outside the optical path space K1, is slightly thin-walled in relation to the Z axis direction. A difference in height 36 is provided between the second area 35B of the lower surface 35 of the second nozzle member 30 and the area disposed outside the second area 35B with respect to the optical path space K1.

The lower surface 35 of the second nozzle member 30 is liquid-repellent (water-repellent) with respect to the liquid LQ. The liquid-repelling treatment, which is performed to make the lower surface 35 of the second nozzle member 30 liquid-repellent, includes, for example, treatments for the coating with any liquid-repellent material including, for example, a fluorine-based resin material such as polytetrafluoroethylene (Teflon, trade name), an acrylic resin material, and a silicon-based resin material. In this embodiment, the entire lower surface 35 of the second nozzle member 30 is coated with the liquid-repellent material. The entire lower surface 35 is liquid-repellent. Only a part of the lower surface 35, for example, only the first area 35A of the lower surface 35 may be coated with the liquid-repellent material so that only the part of the lower surface 35 may be liquid-repellent.

The liquid repellence may be added by coating at least one of the inner side surface 30T of the second nozzle member 30 and the side surface 70S of the first nozzle member 70 with the liquid-repellent material. The entire surface of the second nozzle member 30 may be coated with the liquid-repellent material.

The second nozzle member 30 has a supply flow passage 34 for supplying the gas to the blow port 32. The supply flow passage 34 is provided in the second nozzle member 30. The lower end of the supply flow passage 34 is connected to the blow port 32. The other end of the second supply tube 33 is connected to a part of the supply flow passage 34.

As appreciated from FIG. 2, the supply flow passage 34 has a first flow passage portion 34A which is connected to the blow port 32, and a second flow passage portion 34B which includes a buffer space 37 larger than the first flow passage portion 34A. The second flow passage portion 34B is provided outside the first flow passage portion 34A with respect to the optical path space K1. The second flow passage portion 34B is connected to the second supply tube 33. The first flow passage portion 34A has an inclined area, and a horizontal area which is provided outside the inclined area with respect to the optical path space K1. The inclined area of the first flow passage portion 34A is inclined so that the distance from the substrate P is gradually decreased in relation to the direction directed from the outside to the inside of the optical path space K1, i.e., in relation to the direction to make approach to the optical path space K1 from the outside of the optical path space K1. The lower end of the first flow passage portion 34A is the blow port 32. In this embodiment, the inclined area of the first flow passage portion 34A is provided substantially in parallel to the inner side surface 30T of the second nozzle member 30. That is, the inclined area of the first flow passage portion 34A is inclined by approximately 45° with respect to the surface of the substrate P (XY plane) held by the substrate stage PST. The horizontal area of the first flow passage portion 34A is provided substantially in parallel to the XY plane. The horizontal area connects the upper end of the first flow passage portion 34A and the buffer space 37 of the second flow passage portion 34B.

The inclined area of the first flow passage portion 34A is formed annularly as viewed in a sectional view taken along the XY plane to correspond to the blow port 32 which is formed to have the annular slit-shaped form. The inclined area is the slit-shaped flow passage which uniformly has approximately the same width D1 as the slit width D1 of the blow port 32. The horizontal area of the first flow passage portion 34A is provided continuously to the upper end of the inclined area. The horizontal area is the slit-shaped flow passage which uniformly has approximately the same width D1 as the slit width D1 of the blow port 32. The buffer space 37 is provided outside the horizontal area of the first flow passage portion 34A with respect to the optical path space K1. The buffer space 37 is the space which is formed annularly to surround the horizontal area of the first flow passage portion 34A. The buffer space 37 has a width D2 which is sufficiently larger than the width D1 of the first flow passage portion 34A.

That is, the supply flow passage 34 has the second flow passage portion 34B which includes the buffer space 37 having the width D2 in the Z axis direction, and the first flow passage portion 34A which is provided on the downstream side of the flow passage from the second flow passage portion 34B and which has the width D1 smaller than the width D2. The first flow passage portion 34A is narrower than the buffer space 37 provided on the upstream side of the flow passage.

The other end of the second supply tube 33 is connected to the second flow passage portion 34B including the buffer space 37. In this embodiment, a plurality of connecting positions are defined for the second supply tube 33 and the second flow passage portion 34B of the supply flow passage 34 at approximately equal intervals in the circumferential direction (θZ direction) on the side surface 30S of the second nozzle member 30. The other ends of the second supply tube 33 are connected to the plurality of connecting positions respectively. In the drawing, the four connecting positions are depicted for the second supply tube 33 of the supply flow passage 34. However, any number of plurality of positions, for example, eight positions may be defined. The blow port 32 and the gas supply device 31 are connected to one another via the supply flow passage 34 and the second supply tube 33.

The gas, which is fed from the gas supply device 31, flows into the second flow passage portion 34B including the buffer space 37 of the supply flow passage 34 via the second supply tube 34. After that, the gas is supplied to the blow port 32 via the second flow passage portion 34B and the first flow passage portion 34A. The gas, which is supplied to the blow port 32 from the supply flow passage 34 including the second flow passage portion 34B and the first flow passage portion 34A, blows from the blow port 32 to the outside of the second nozzle member 30. As described above, the inclined area of the first flow passage portion 34A is inclined by approximately 45° so that the distance from the substrate P is gradually decreased at positions nearer to the optical path space K1. The blow port 32, which is provided at the lower end of the inclined area of the first flow passage portion 34A, blows the gas onto the substrate P in the inclined direction toward the optical path space K1.

The buffer space 37 disperses and uniformizes the energy (pressure and/or flow velocity) of the gas supplied from the gas supply device 31 via the second supply tube 33 so that the amount (flow velocity) per unit time of the gas in which the gas flows into the first flow passage portion 34A from the buffer space 37 is uniformized at the respective positions of the first flow passage portion 34A as the slit-shaped flow passage. Owing to the provision of the buffer space 37, the gas supply mechanism 3 can substantially uniformly discharges, from the slit-shaped blow port 32, the gas supplied to the blow port 32 via the first flow passage portion 34A and the second flow passage portion 34B including the buffer space 37. If the buffer space 37 is not provided, the amount of the gas per unit time in which the gas flows through the first flow passage portion 34A is greater in the vicinity of the position at which the other end of the second supply tube 33 is connected than the other positions. Therefore, there is such a possibility that the blow amount (flow velocity) per unit time of the gas in which the gas blows at the respective positions of the slit-shaped blow port 32 formed to have the predetermined length may be nonuniform. However, when the buffer space 37 is provided to disperse and uniformize the energy of the gas supplied from the second supply tube 33, it is possible to uniformize the flow rate (flow velocity) of the gas supplied to the respective positions of the slit-shaped blow port 32 via the first flow passage portion 34A. The gas is discharged in an approximately uniform blow amount at the respective positions of the annular and slit-shaped blow port 32.

In this embodiment, the focus/leveling-detecting system, which detects the surface position information about the surface of the substrate P held by the substrate stage PST, detects the surface position information about the substrate P at the outside of the blow port 32 with respect to the optical path space K1. Specifically, the focus/leveling-detecting system irradiates the detecting light beam for detecting the surface position information about the substrate P onto the surface of the substrate P at the position outside the blow port 32 with respect to the optical path space K1 without passing through the liquid LQ of the optical path space K1. FIG. 4 shows the position of irradiation of the detecting light beam La brought about by the focus/leveling-detecting system. The detecting light beam La is irradiated onto the surface of the substrate P on the both sides of the optical path space K1 in relation to the scanning direction (X axis direction) respectively.

It is a matter of course that the focus/leveling-detecting system may be provided at a position sufficiently separated from the projection optical system PL to detect the surface position information about the substrate P without passing through the liquid LQ as disclosed in Japanese Patent Application Laid-open No. 2000-323404.

Next, an explanation will be made about a method for exposing the substrate P with the pattern image of the mask M by using the exposure apparatus EX constructed as described above.

In order to fill the optical path space K1 for the exposure light beam EL with the liquid LQ, the controller CONT drives the liquid supply device 11 and the liquid recovery device 21 respectively. The liquid LQ, which is fed from the liquid supply device 11 under the control of the controller CONT, flows through the first supply tube 13, and then the liquid LQ is supplied from the supply ports 12 via the supply flow passages 14 of the first nozzle member 70 to the internal space G2 between the bottom plate portion 70D and the first optical element LS1 of the projection optical system PL. When the liquid LQ is supplied to the internal space G2, the gas portion, which has been present in the internal space G2, is discharged to the outside via the discharge ports 16 and/or the opening 74. Therefore, it is possible to avoid the inconvenience which would be otherwise caused such that the gas remains or stays in the internal space G2 upon the start of the supply of the liquid LQ to the internal space G2. It is possible to avoid the inconvenience which would be otherwise caused such that any gas portion (bubble) is formed in the liquid LQ in the optical path space K1.

The liquid LQ, which is supplied to the internal space G2, flows into the space between the land surface 75 and the substrate P (substrate stage PST) via the opening 74 to fill the optical path space K1 therewith. In this situation, the liquid recovery device 21, which is driven under the control of the controller CONT, recovers a predetermined amount of the liquid LQ per unit time. The liquid LQ, which is in the space between the land surface 75 and the substrate P, flows into the recovery flow passage 24 via the recovery port 22 of the first nozzle member 70. The liquid LQ flows through the recovery tube 23, and then the liquid LQ is recovered by the liquid recovery device 21.

In this arrangement, the liquid LQ, which is supplied from the supply port 12 to the internal space G2, flows toward the optical path space K1 (projection area AR) for the exposure light beam EL while being guided by the first guide portion 17A, and then the liquid LQ flows toward the outside of the optical path space K1 for the exposure light beam EL while being guided by the second guide portion 17B. Therefore, even if any gas portion (bubble) is generated in the liquid LQ, the bubble can be discharged to the outside of the optical path space K1 for the exposure light beam EL by means of the flow of the liquid LQ. In this embodiment, the bottom plate portion 70D allows the liquid LQ to flow toward the discharge port 16. Therefore, the gas portion (bubble), which is present in the liquid LQ, is smoothly discharged to the external space K3 via the discharge port 16.

The liquid immersion mechanism 1 allows the liquid LQ to flow while being guided by the first and second guide portions 17A, 17B of the bottom plate portion 70D. Accordingly, the formation of any vortex flow is suppressed in the optical path space K1 for the exposure light beam EL. Accordingly, even when any gas portion (bubble) is present in the optical path space K1 for the exposure light beam EL, then the gas portion (bubble) can be discharged to the outside of the optical path space K1 for the exposure light beam EL by means of the flow of the liquid LQ, and it is possible to prevent the gas portion (bubble) from staying in the optical path space K1 for the exposure light beam EL.

As described above, the controller CONT uses the liquid immersion mechanism 1 so that the predetermined amount of the liquid LQ is supplied to the optical path space K1, and the predetermined amount of the liquid LQ disposed on the substrate P is recovered. Accordingly, the optical path space K1, which is between the projection optical system PL and the substrate P, is filled with the liquid LQ to locally form the liquid immersion area LR of the liquid LQ on the substrate P. The controller CONT projects the pattern image of the mask M onto the substrate P via the projection optical system PL and the liquid LQ of the optical path space K1 while relatively moving the projection optical system PL and the substrate P in the state in which the optical path space K1 is filled with the liquid LQ.

The controller CONT drives the gas supply device 31 of the gas supply mechanism 3 when the liquid LQ is supplied from the supply port 12. The controller CONT continues the gas blow operation of the blow port 32 during the exposure for the substrate P. That is, the controller CONT continues the driving of the gas supply device 31 of the gas supply mechanism 3 during the period in which the supply operation and the recovery operation for the liquid LQ are performed with respect to the optical path space K1 by using the liquid immersion mechanism 1 or during the period in which the liquid immersion area LR is formed even when the supply operation and the recovery operation are stopped. In this embodiment, the controller CONT uses the adjusting device 38 to adjust the gas blow amount per unit time in which the gas blows from the blow port 32 provided for the second nozzle member 30. The blow amount of the gas may be substantially constant, or the blow amount of the gas may be appropriately changed.

Figure 6:
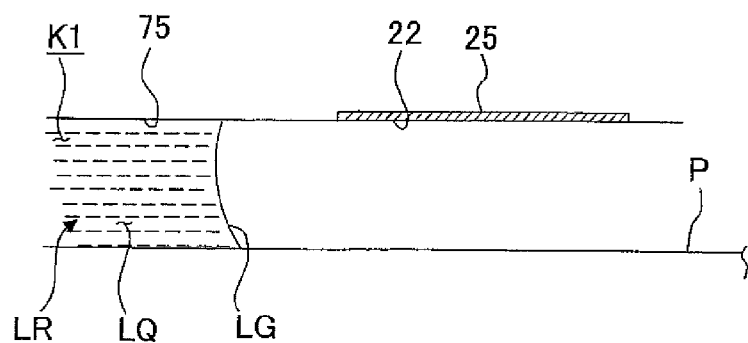
FIGS. 6A and 6B schematically illustrate the behavior of the liquid in accordance with the movement of the substrate.
Figure 6:
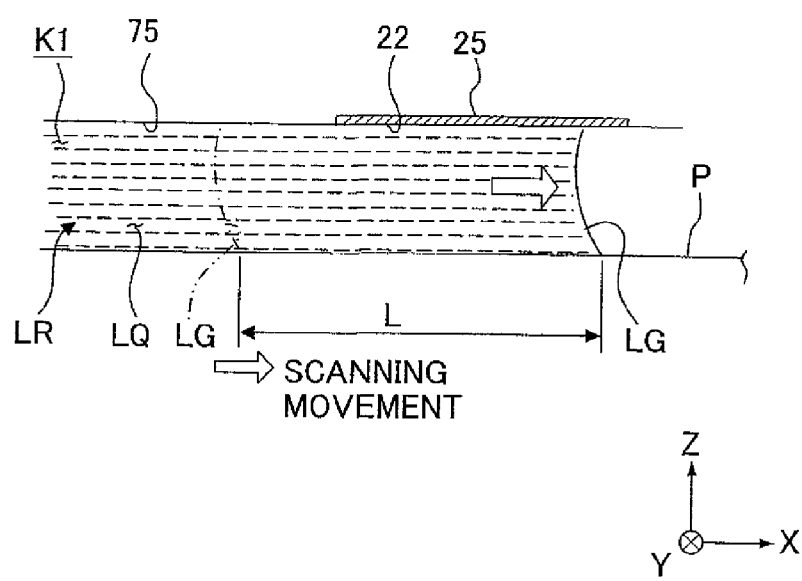

As described above, the exposure apparatus EX of this embodiment is the scanning type exposure apparatus which performs the exposure while relatively moving the projection optical system PL and the substrate P. Specifically, the exposure apparatus EX projects the image of the pattern of the mask M onto the substrate P while moving the mask M and the substrate P in the X axis direction (scanning direction) with respect to the projection optical system PL. Such a scanning type exposure apparatus involves the following possibility. That is, for example, when the scanning velocity (scanning speed) is increased to be high, then the liquid LQ cannot be recovered sufficiently by means of the recovery port 22, and the liquid LQ may leak to the outside of the recovery port 22 with respect to the optical path space K1. For example, it is assumed that the substrate P is subjected to the scanning movement in the +X direction by a predetermined distance at a predetermined velocity with respect to the liquid immersion area LR from the initial state schematically shown in FIG. 6A, and the interface LG, which is between the liquid LQ of the liquid immersion area LR and the space at the outside thereof, is moved by a predetermined distance L as shown in FIG. 6B. When the scanning velocity is increased to be high, the following possibility may arise. That is, the interface LG, which is between the liquid LQ of the liquid immersion area LR and the space at the outside thereof, may have a large movement velocity, and/or the shape of the interface LG may be greatly changed. As a result, the liquid LQ may leak to the outside of the recovery port 22.

In this embodiment, the controller CONT performs the blow operation of the gas via the blow port 32 to thereby generate the predetermined flow of the gas in the vicinity of the recovery port 22 (in the vicinity of the interface LG of the liquid LQ with which the optical path space K1 is filled). The generated flow of the gas is used to avoid any leakage of the liquid LQ and any enormous expansion of the liquid immersion area LR.

Figure 7:
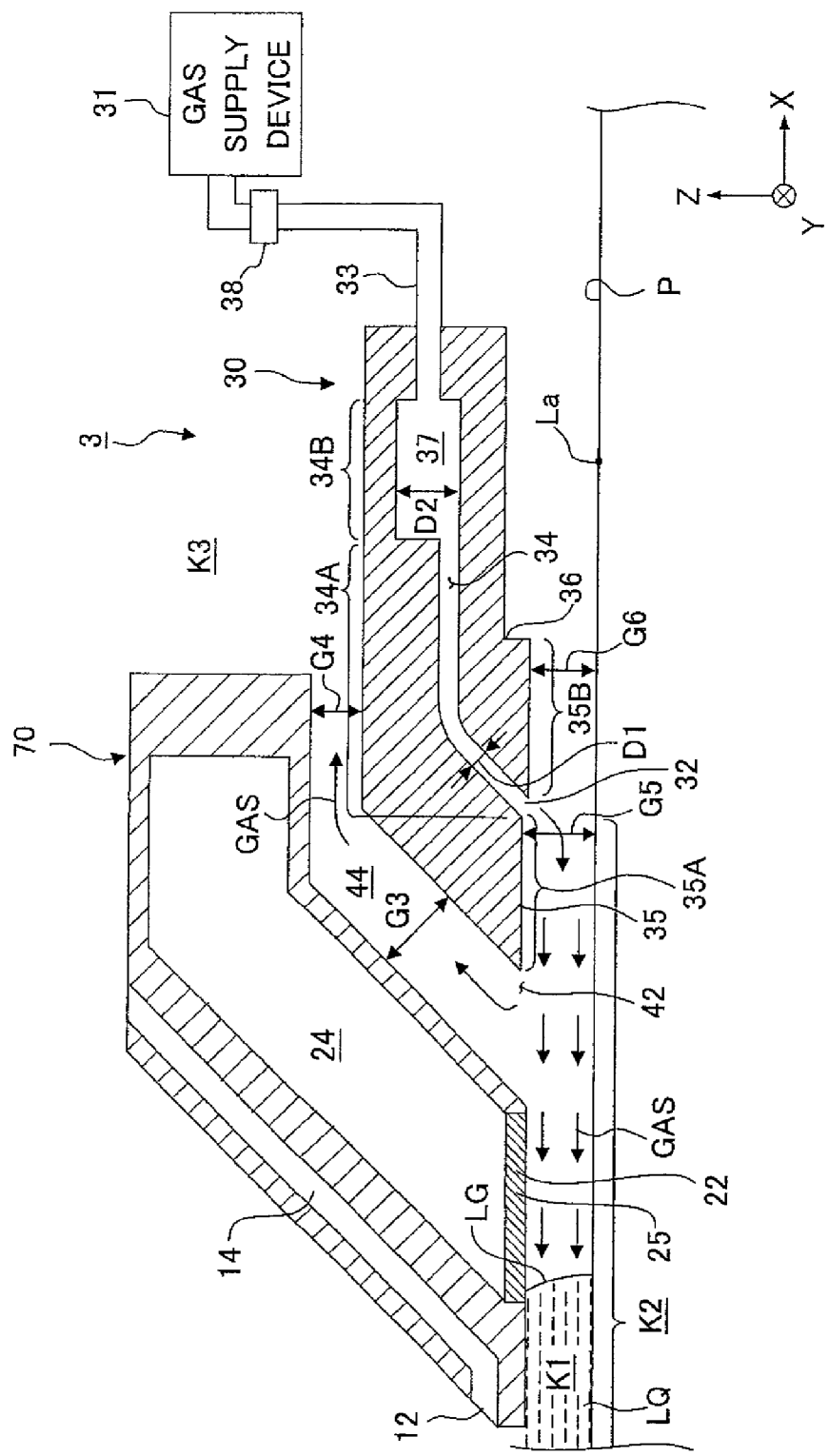
FIG. 7 schematically shows magnified main components to illustrate the operation of the exposure apparatus according to the first embodiment.

FIG. 7 schematically shows magnified main components to illustrate the operation of the gas supply mechanism 3. As shown in FIG. 7, the controller CONT drives the gas supply device 31 to blow the gas therefrom via the blow port 32 provided outside the recovery port 22 with respect to the optical path space K1. Accordingly, the flow of the gas, which is directed to the optical path space K1, is generated. That is, the gas flow, which is directed from the blow port 32 to the optical path space K1, is generated so that the liquid LQ (liquid immersion area LR) is confined to the inside of the gas discharge port 42 formed to surround the optical path space K1.

Specifically, the controller CONT drives the gas supply device 31 to feed the gas in a predetermined amount per unit time. The gas, which is fed from the gas supply device 31, flows through the second supply tube 33 into the second flow passage portion 34B of the supply flow passage 34 of the second nozzle member 30. The gas, which flows into the second flow passage portion 34B, flows into the first flow passage portion 34A via the buffer space 37 of the second flow passage portion 34B. The gas is supplied to the blow port 32 provided at the lower end of the first flow passage portion 34A. As described above, the buffer space 37 is provided at the intermediate position of the supply flow passage 34. Accordingly, the gas, which is supplied to the slit-shaped blow port 32 via the supply flow passage 34 including the buffer space 37, blows substantially uniformly from the respective positions of the blow port 32.

The blow port 32 is designed so that the gas blows onto the substrate P in the inclined direction toward the optical path space K1. The gas, which is discharged from the blow port 32, blows onto the substrate P. After that, the gas forms the flow of the gas directed to the optical path space K1 in the vicinity of the circumferential edge of the recovery port 22. Owing to the formation of the flow of the gas directed to the optical path space K1, the gas is supplied from the outside to the interface LG of the liquid LQ with which the optical path space K1 is filled. Accordingly, even when the liquid LQ (interface LG of the liquid LQ), with which the optical path space K1 is filled, intends to move to the outside of the optical path space K1, it is possible to avoid the leakage of the liquid LQ to the outside of the predetermined space K2 including the optical path space K1 by means of the force of the gas. The predetermined space K2 herein refers to the space on the image plane side of the projection optical system PL, which includes the space inside the gas discharge port 42 with respect to the optical path space K1.

The second nozzle member 30 has the first area 35A of the lower surface 35 opposite to the substrate P held by the substrate stage PST, the first area 35A being disposed inside the blow port 32 with respect to the optical path space K1. The gas, which blows from the blow port 32 provided at the position opposite to the substrate P, flows toward the optical path space K1 while being guided by the surface of the substrate P and the first area 35A of the lower surface 35 of the second nozzle member 30 through the space of the gap G5 formed between the surface of the substrate P and the first area 35A of the lower surface 35 of the second nozzle member 30. As described above, the first area 35A of the lower surface 35 of the second nozzle member 30 functions as the guide surface for guiding the gas to blow from the blow port 32 between the substrate P and the first area 35A.

At least a part of the gas, which is blows from the blow port 32, flows from the gas discharge port 42 into the space of the gap G3 between the side surface 70S of the first nozzle member 70 and the inner side surface 30T of the second nozzle member 30. The gas, which flows into the space of the gap G3, is discharged to the external space (atmospheric space) K3 of the predetermined space K2 via the space of the gap G4 between the lower surface of the protruding portion 70A of the first nozzle member 70 and the upper surface of the second nozzle member 30. That is, the space of the gap G3 and the space of the gap G4 function as the gas discharge flow passages to efficiently discharge the gas flowed from the gas discharge port 42 between the recovery port 22 and the blow port 32.

In the following description, the space of the gap G3 and the space of the gap G4, which are between the first nozzle member 70 and the second nozzle member 30, are appropriately referred to as "gas discharge space 44" in combination. The space of the gap G3 of the gas discharge space 44 is inclined by approximately 45° so that the distance from the substrate P is gradually decreased in relation to the direction from the outside to the inside of the optical path space K1. The lower end of the gas discharge space 44 is the gas discharge port 42 for discharging at least a part of the gas blown from the blow port 32. The gas discharge port 42 is provided between the lower end of the first nozzle member 70 and the lower end of the second nozzle member 30, i.e., between the recovery port 22 and the blow port 32.

The gas discharge space 44, which includes the space of the gap G3 and the space of the gap G4, is connected to the external space (atmospheric space) K3. Therefore, the predetermined space K2, which includes the optical path space K1, is open to the atmospheric air via the gas discharge port 42 and the gas discharge space 44.

A part of the gas blown from the blow port 32 is discharged from the gas discharge port 42. Accordingly, it is possible to satisfactorily generate the flow of the gas which involves little turbulence in the direction to the optical path space K1 in the vicinity of the recovery port 22. Further, the gas discharge pressure of the gas from the gas discharge port 42 is adjusted. Accordingly, it is also possible to appropriately adjust the pressure of the gas exerted on the liquid LQ so that the pressure of the gas exerted on the liquid LQ is not excessive.

The distance (gap) G3 between the side surface 70S of the first nozzle member 70 and the inner side surface 30T of the second nozzle member 30 is provided to be larger than the distance (gap) G5 between the substrate P and the first area 35A of the lower surface 35 of the second nozzle member 30. Therefore, the gas, which blows from the blow port 32, successfully flows to the gas discharge space 44 smoothly. If the gap G3 is smaller than the gap G5, a part of the gas blown from the blow port 32 cannot be released to the external space K3 sufficiently via the gas discharge port 42 and the gas discharge space 44. There is such a possibility that any turbulence of the gas flow may arise in the vicinity of the recovery port 22. However, the gap G3 is larger than the gap G5. Therefore, it is possible to more reliably avoid any stagnation of the gas blown from the blow port 32, for example, in the vicinity of the recovery port 22.

As explained above, the gas blows from the blow port 32 provided outside the recovery port 22 with respect to the optical path space K1, and at least a part of the gas blown from the blow port 32 is discharged from the gas discharge port 42. Accordingly, it is possible to generate the flow of the gas in the vicinity of the recovery port 22 so that the liquid LQ is prevented from any leakage to the outside of the predetermined space K2 including the optical path space K1. Therefore, even when the projection optical system PL and the substrate P are relatively moved in the state in which the optical path space K1 is filled with the liquid LQ, it is possible to avoid any leakage of the liquid LQ. Further, the size and the shape of the liquid immersion area LR can be maintained in the desired state by generating the flow of the gas directed to the optical path space K1. It is possible to realize a compact size of the entire exposure apparatus EX as well.

When the focus/leveling-detecting system detects the surface position information about the substrate P without passing through the liquid LQ of the optical path space K1 at the outside of the blow port 32 with respect to the optical path space K1 as described above, it is possible to maintain the detection accuracy of the focus/leveling-detecting system by avoiding any leakage of the liquid LQ to the outside of the blow port 32 by means of the gas which blows from the blow port 32.

The blow port 32 is provided at the position opposite to the substrate P. Therefore, the desired flow of the gas directed to the optical path space K1 can be smoothly generated by allowing the gas discharged from the blow port 32 to blow onto the substrate P. The blow port 32 blows the gas onto the substrate P in the inclined direction toward the optical path space K1. Therefore, it is possible to efficiently generate the desired flow of the gas directed to the optical path space K1. The second nozzle member 30 has the first area 35A of the lower surface 35 which functions as the guide surface for guiding the gas blown from the blow port 32 between the first area 35A and the substrate P. Therefore, it is possible to efficiently generate the flow of the gas directed to the optical path space K1.

The blow port 32 is formed annularly to surround the optical path space K1. Therefore, it is possible to generate the flow of the gas directed to the optical path space K1 from the outside in all of the directions to surround the optical path space K1. It is possible to avoid the leakage of the liquid LQ more reliably. The supply flow passage 34 for supplying the gas to the blow port 32 has the buffer space 37. Therefore, the gas successfully blows uniformly from the slit-shaped blow port 32.

The second nozzle member 30 is provided to surround the first nozzle member 70 at the outside of the first nozzle member 70. Therefore, even if the liquid LQ of the optical path space K1 intends to leak (or scatter) to the outside of the recovery port 22 (first nozzle member 70), the leakage (scattering) can be suppressed by the gas which blows from the blow port 32 of the second nozzle member 30. The lower surface 35 of the second nozzle member 30 is liquid-repellent with respect to the liquid LQ. Therefore, it is possible to avoid or suppress the leakage of the liquid LQ of the optical path space K1 to the outside via the space of the gap G5.

In this embodiment, the difference in height is provided between the first area 35A and the second area 35B so that the gap G6 is smaller than the gap G5 on the lower surface 35 of the second nozzle member 30. However, the gap G5 and the gap G6 may be identical with each other, and the difference in height between the first area 35A and the second area 35B may be omitted.

In this embodiment, the blow port 32 blows the gas onto the substrate P in the inclined direction toward the optical path space K1. However, the gas supply mechanism 3 may blow the gas to the position just under the blow port 32. Also in this case, the gas, which blows against the substrate P, flows toward the optical path space K1 while being guided by the first area 35A of the lower surface 35 and the surface of the substrate P. Therefore, it is possible to avoid the leakage of the liquid LQ. When the focus/leveling-detecting system is provided, it is preferable that the position, at which the focus/leveling-detecting system irradiates the detecting light beam La onto the surface of the substrate P in order to detect the surface position information about the substrate P, is outside the position at which the blow port 32 blows the gas onto the surface of the substrate P, with respect to the optical path space K1.

The first area 35A of the lower surface 35 of the second nozzle member 30, which functions as the guide surface for guiding the flow of the gas which blows from the blow port 32 between the substrate P and the first area 35A, is the flat surface. However, a fin-shaped member and/or a projection-shaped member can be also provided for the first area 35A as the guide member for guiding the flow of the gas. Alternatively, a groove (slit), which serves as the guide portion for guiding the flow of the gas, may be provided for the first area 35A as well.

Second Embodiment

Figure 8:
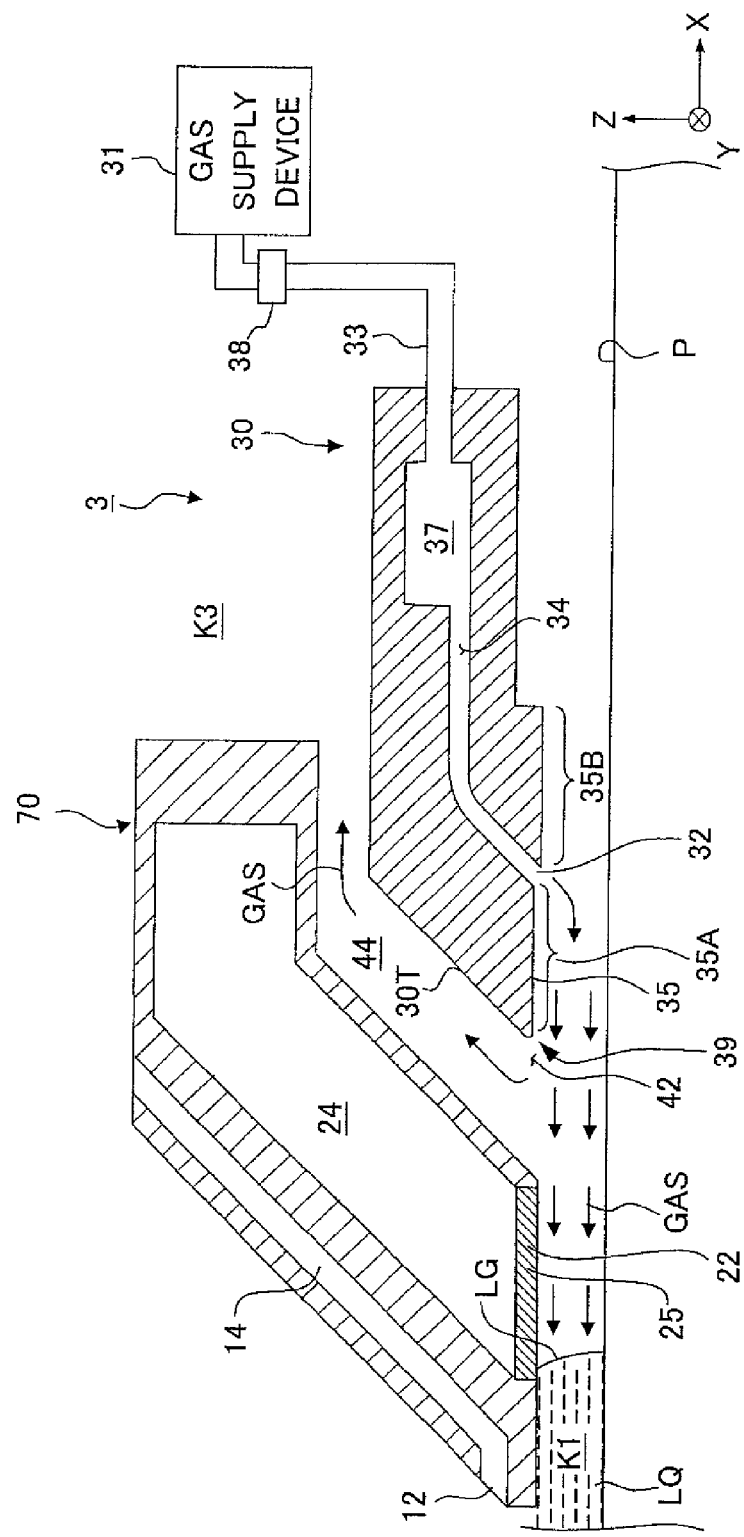
FIG. 8 shows a side sectional view illustrating magnified main components of an exposure apparatus according to a second embodiment.

Next, a second embodiment will be explained with reference to FIG. 8. In FIG. 8, a connecting portion 39 between the inner side surface 30T and the lower surface 35 of the second nozzle member 30 is formed to have a substantially circular arc-shaped form as viewed in a cross section. When the connecting portion 39 between the inner side surface 30T and the lower surface 35 of the second nozzle member 30 is formed to have the substantially circular arc-shaped form as viewed in a cross section as described above, a part of the gas, which blows from the blow port 32 and which flows along the first area 35A of the lower surface 35, successfully flows smoothly to the gas discharge space 44 via the gas discharge port 42. Therefore, it is possible to smoothly generate the desired flow of the gas to the optical path space K1 in the vicinity of the recovery port 22.

Third Embodiment

Next, a third embodiment will be explained. The feature of this embodiment resides in that the adjusting device 38 adjusts the blow amount of the gas per unit time in which the gas blows from the blow port 32 depending on the affinity between the liquid LQ and the film member for forming the liquid contact surface of the substrate P. In the following description, the constitutive components, which are the same as or equivalent to those of the embodiment described above, are designated by the same reference numerals, any explanation of which will be simplified or omitted.

Figure 9:
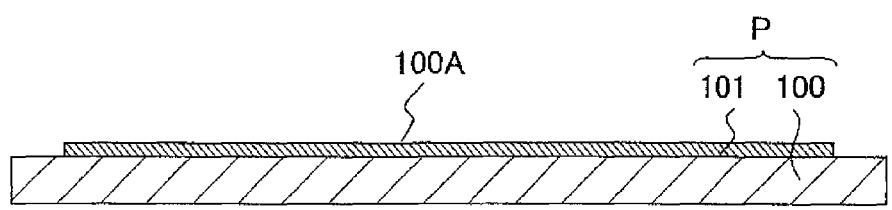
FIGS. 9A and 9B show side sectional views illustrating substrates.
Figure 9:
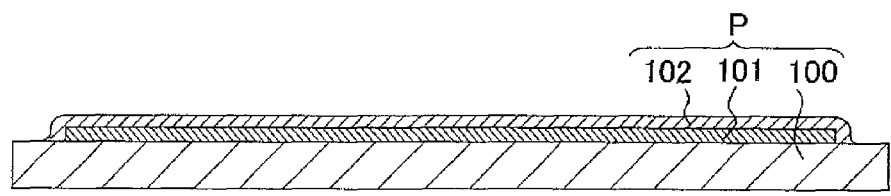

FIG. 9A shows an example of a sectional view illustrating the substrate P. With reference to FIG. 9A, the substrate P has a base member 100, and a film member 101 which is provided on an upper surface 100A of the base member 100. The base member 100 includes a semiconductor wafer. The film member 101 is formed of a photosensitive material (photoresist). An area, which occupies almost all of the central portion of the upper surface 100A of the base member 100, is coated with the film member 101 to provide a predetermined thickness. In FIG. 9A, the photosensitive material (film member) 101, which is at the circumferential edge portion of the upper surface 100A of the base member 100, is removed. In FIG. 9A, the film member (photosensitive material) 101 is provided at the uppermost layer of the substrate P. The film member 101 serves as the liquid contact surface (substrate outermost surface) to make contact with the liquid LQ during the liquid immersion exposure.

FIG. 9B shows another example of the substrate P. With reference to FIG. 9B, the substrate P has a second film member 102 which covers the surface of the film member 101. The second film member 102 is a protective film called "top coat film". In FIG. 9B, the second film member (protective film) 102 is provided at the uppermost layer of the substrate P. The second film member 102 serves as the liquid contact surface to make contact with the liquid LQ during the liquid immersion exposure.

The exposure apparatus EX of this embodiment successively exposes a plurality of types of substrates P which are different from each other in relation to the type (physical property) of the film member for forming the liquid contact surface. The storage device MRY stores the information in relation to the exposure conditions to perform the liquid immersion exposure for a plurality of types of substrates P. Specifically, the storage device MRY stores, as map data, a plurality of those concerning the affinity between the liquid LQ and the film member for forming the liquid contact surface of the substrate P to make contact with the liquid LQ during the liquid immersion exposure (affinity between the substrate P and the liquid LQ) and the relationship with respect to the exposure condition corresponding to the affinity. In this case, the information, which relates to the affinity between the film member and the liquid LQ, includes the information which relates to the contact angle between the film member and the liquid LQ (contact angle with respect to the substrate P) (including the dynamic contact angle).

When the liquid immersion exposure process is performed, the information, which relates to the film member of the substrate P to be subjected to the exposure process, is inputted into the controller CONT via the input device INP. The information to be inputted, which relates to the film member, includes the information in relation to the contact angle between the film member and the liquid LQ. The controller CONT selects and determines the exposure condition optimum for the substrate P to be subjected to the exposure process with reference to the relationship (map data) between the affinity (contact angle) between the film member and the liquid LQ and the exposure condition corresponding to the affinity (contact angle) previously stored in the storage device MRY, depending on the inputted information about the film member (information about the contact angle).

The exposure condition herein includes the condition of the supply of the gas to be supplied by the gas supply mechanism 3. More specifically, the exposure condition includes the condition in relation to the gas blow amount per unit time in which the gas blows from the blow port 32.

The controller CONT adjusts the gas blow amount per unit time in which the gas blows from the blow port 32 by using the adjusting device 38, depending on the contact angle (affinity) between the film member and the liquid LQ. Specifically, when the contact angle between the film member and the liquid LQ is small, the film member has the liquid-attractive property (hydrophilicity) with respect to the liquid LQ. Therefore, when the liquid LQ is supplied onto the substrate P (film member) by using the liquid immersion mechanism 1, the liquid LQ tends to spread on the substrate P. Therefore, there is such a high possibility that the liquid LQ may leak to the outside of the optical path space K1 (recovery port 22). Therefore, when the liquid immersion area LR is formed on the film member, the adjusting device 38 increases the gas blow amount per unit time in which the gas blows from the blow port 32. Accordingly, it is possible to increase the amount of the gas to be supplied to the interface LG of the liquid LQ with which the optical path space K1 is filled, and/or it is possible to enhance the flow velocity of the gas. Therefore, it is possible to avoid the leakage of the liquid LQ by means of the force of the supplied gas.

On the other hand, when the contact angle between the film member and the liquid LQ is large, the film member has the liquid repellence (water repellence) with respect to the liquid LQ. Therefore, when the liquid LQ is supplied onto the substrate P (film member) by using the liquid immersion mechanism 1, the liquid LQ does not spread excessively on the substrate P. Therefore, when the liquid LQ is supplied to the film member, the adjusting device 38 decreases the gas blow amount per unit time in which the gas blows from the blow port 32. Accordingly, it is possible to avoid the inconvenience which would be otherwise caused, for example, such that the vibration is generated and/or the substrate P is deformed and/or displaced due to the force of the gas which blows thereagainst. The amount of the gas supplied to the liquid LQ with which the optical path space K1 is filled is also decreased. Therefore, it is also possible to suppress the inconvenience which would be otherwise caused such that any gas portion such as bubbles is formed in the liquid LQ.

As explained above, in this embodiment, the gas supply condition (gas blow amount), which is optimum corresponding to the contact angle (affinity) between the liquid LQ and the film member for forming the liquid contact surface of the substrate P, is previously determined. The information about the optimum gas supply condition is stored in the storage device MRY. The controller CONT selects and determines the optimum gas supply condition from a plurality of stored gas supply conditions on the basis of the information about the film member of the substrate P to be subjected to the exposure process inputted via the input device INP (information about the contact angle between the film member and the liquid LQ). The liquid immersion exposure is performed for the substrate P on the basis of the determined gas supply condition. Accordingly, the substrate P can be exposed satisfactorily while avoiding the leakage of the liquid LQ.

In this embodiment, the explanation has been made about the case in which the type of the film member of the substrate P is changed. However, the type (physical property) of the liquid LQ is changed in some cases. Also in such a situation, the controller CONT can adjust the blow amount in which the gas blows from the blow port 32 depending on the affinity between the liquid LQ and the film member of the substrate P by using the adjusting device 38.

The liquid immersion area LR is also formed on any object such as the upper surface of the substrate stage PST different from the substrate P in some cases. Therefore, the blow amount from the blow port 32 may be adjusted by using the adjusting device 38 depending on the condition (for example, the contact angle) of not only the substrate P but also the object surface on which the liquid immersion area LR is to be formed.

Fourth Embodiment

Next, a fourth embodiment will be explained. The feature of this embodiment resides in that the adjusting device 38 adjusts the gas blow amount per unit time in which the gas blows from the blow port 32 depending on the movement condition of the substrate P (including at least one of the movement velocity, the acceleration, and the deceleration). For example, the adjusting device 38 adjusts the gas blow amount per unit time in which the gas blows from the blow port 32 depending on the scanning velocity (movement velocity) of the substrate P when the exposure light beam EL is irradiated onto the substrate P to expose the substrate P while moving the substrate P in the X axis direction.

In this embodiment, the controller CONT determines the gas supply condition of the gas supply mechanism 3 depending on the velocity and/or the acceleration of the substrate P in relation to the X axis direction (scanning direction). For example, when the scanning velocity (and/or the acceleration) of the substrate P is large, then the relative velocity (or the relative acceleration) is increased between the substrate P and the liquid LQ with which the optical path space K1 is filled, and there is such a high possibility that the liquid LQ may leak. Therefore, when the scanning velocity of the substrate P is large, the adjusting device 38 increases the gas blow amount per unit time in which the gas blows from the blow port 32. Accordingly, it is possible to increase the amount of the gas supplied to the interface LG of the liquid LQ with which the optical path space K1 is filled, and/or it is possible to enhance the flow velocity of the gas. Therefore, it is possible to avoid the leakage of the liquid LQ by means of the force of the supplied gas.

On the other hand, when the scanning velocity (or the acceleration) of the substrate P is small, the possibility of the leakage of the liquid LQ is low. Therefore, when the scanning velocity of the substrate P is small, the adjusting device 38 decreases the gas blow amount per unit time in which the gas blows from the blow port 32. Accordingly, it is possible to avoid the inconvenience which would be otherwise caused, for example, such that the vibration is generated and/or the substrate P is deformed and/or displaced due to the force of the gas which blows thereagainst. The amount of the gas supplied to the liquid LQ with which the optical path space K1 is filled is also decreased. Therefore, it is also possible to suppress the inconvenience which would be otherwise caused such that any gas portion such as the bubble is formed in the liquid LQ.

As explained above, the substrate P can be exposed satisfactorily while avoiding the leakage of the liquid LQ by adjusting the gas blow amount per unit time in which the gas blows from the blow port 32 depending on the movement condition of the substrate P.

In this embodiment, the controller CONT adjusts the gas blow amount per unit time in which the gas blows from the blow port 32 by using the adjusting device 38 when the substrate P is moved in the scanning direction (X axis direction). However, for example, even when the substrate P is moved in the stepping movement direction (Y axis direction), it is possible to adjust the gas blow amount per unit time in which the gas blows from the blow port 32 depending on the stepping movement velocity (and/or the acceleration) of the substrate P.

The liquid immersion area LR is also formed on any object such as the upper surface of the substrate stage PST different from the substrate P in some cases. Therefore, the blow amount from the blow port 32 may be also adjusted by using the adjusting device 38 depending on the movement condition of the object on which the liquid immersion area LR is to be formed.

Fifth Embodiment

Next, a fifth embodiment will be explained with reference to FIG. 10. The feature of this embodiment resides in that the driving device 95 adjusts the position of the second nozzle member 30 (blow port 32) depending on the affinity between the liquid LQ and the film member for forming the liquid contact surface of the substrate P.

The exposure apparatus EX of this embodiment successively exposes a plurality of types of substrates P which are different from each other in relation to the type (physical property) of the film member for forming the liquid contact surface. The storage device MRY stores the information in relation to the exposure conditions to perform the liquid immersion exposure for the substrates P. Specifically, the storage device MRY stores, as map data, those concerning the affinity between the liquid LQ and the film member for forming the liquid contact surface of the substrate P to make contact with the liquid LQ during the liquid immersion exposure and the relationship with respect to the exposure condition corresponding to the affinity. In this case, the information, which relates to the affinity between the film member and the liquid LQ, includes the information which relates to the contact angle between the film member and the liquid LQ (including the dynamic contact angle).

When the liquid immersion exposure process is performed, the information, which relates to the film member of the substrate P to be subjected to the exposure process, is inputted into the controller CONT via the input device INP. The information to be inputted, which relates to the film member, includes the information in relation to the contact angle between the film member and the liquid LQ. The controller CONT selects and determines the exposure condition optimum for the substrate P to be subjected to the exposure process with reference to the relationship (map data) between the affinity (contact angle) between the film member and the liquid LQ and the exposure condition corresponding to the affinity (contact angle) previously stored in the storage device MRY, depending on the inputted information about the film member (information about the contact angle).

In this embodiment, the exposure condition includes the condition of the supply of the gas to be supplied by the gas supply mechanism 3. More specifically, the exposure condition includes the condition in relation to the position of the second nozzle member 30 of the gas supply mechanism 3.

The controller CONT adjusts the position of the second nozzle member 30 by using the driving device 95, depending on the contact angle (affinity) between the film member and the liquid LQ. Specifically, when the contact angle between the film member and the liquid LQ is small, the film member has the liquid-attractive property (water-attractive property or hydrophilicity) with respect to the liquid LQ. Therefore, when the liquid LQ is supplied onto the substrate P (film member) by using the liquid immersion mechanism 1, the liquid LQ tends to spread on the substrate P. Therefore, there is such a high possibility that the liquid LQ may leak to the outside of the optical path space K1. Therefore, when the liquid is supplied to the film member, the driving device 95 decreases the distance in relation to the Z axis direction between the lower surface 35 of the second nozzle member 30 and the surface of the substrate P to allow the blow port 32 to approach the substrate P. Accordingly, it is possible to decrease the gap G5 between the surface of the substrate P and the first area 35A of the lower surface 35 of the second nozzle member 30, and it is possible to enhance the flow velocity of the gas at which the gas blows from the blow port 32. The gas, for which the flow velocity is enhanced, is supplied to the interface LG of the liquid LQ with which the optical path space K1 is filled. Accordingly, it is possible to prevent the liquid LQ from leaking to the outside of the recovery port 22 with respect to the optical path space K1 by means of the force of the supplied gas.

On the other hand, when the contact angle between the film member and the liquid LQ is large, the film member has the liquid repellence (water repellence) with respect to the liquid LQ. Therefore, when the liquid LQ is supplied onto the substrate P (film member) by using the liquid immersion mechanism 1, the liquid LQ does not spread excessively on the substrate P. Therefore, when the liquid LQ is supplied to the film member, the driving device 95 increases the distance in relation to the Z axis direction between the lower surface of the second nozzle member 30 and the surface of the substrate P so that the blow port 32 is apart from the substrate P. The film member is liquid-repellent, and the liquid LQ does not spread excessively. Therefore, even when the gas blows from the blow port 32 in the state in which the distance between the lower surface 35 of the second nozzle member 30 and the surface of the substrate P is increased, it is possible to prevent the liquid LQ from leaking. When the distance between the lower surface of the second nozzle member 30 and the surface of the substrate P is increased, it is possible to avoid the inconvenience such as the collision between the substrate P and the second nozzle member 30.

Figure 10:
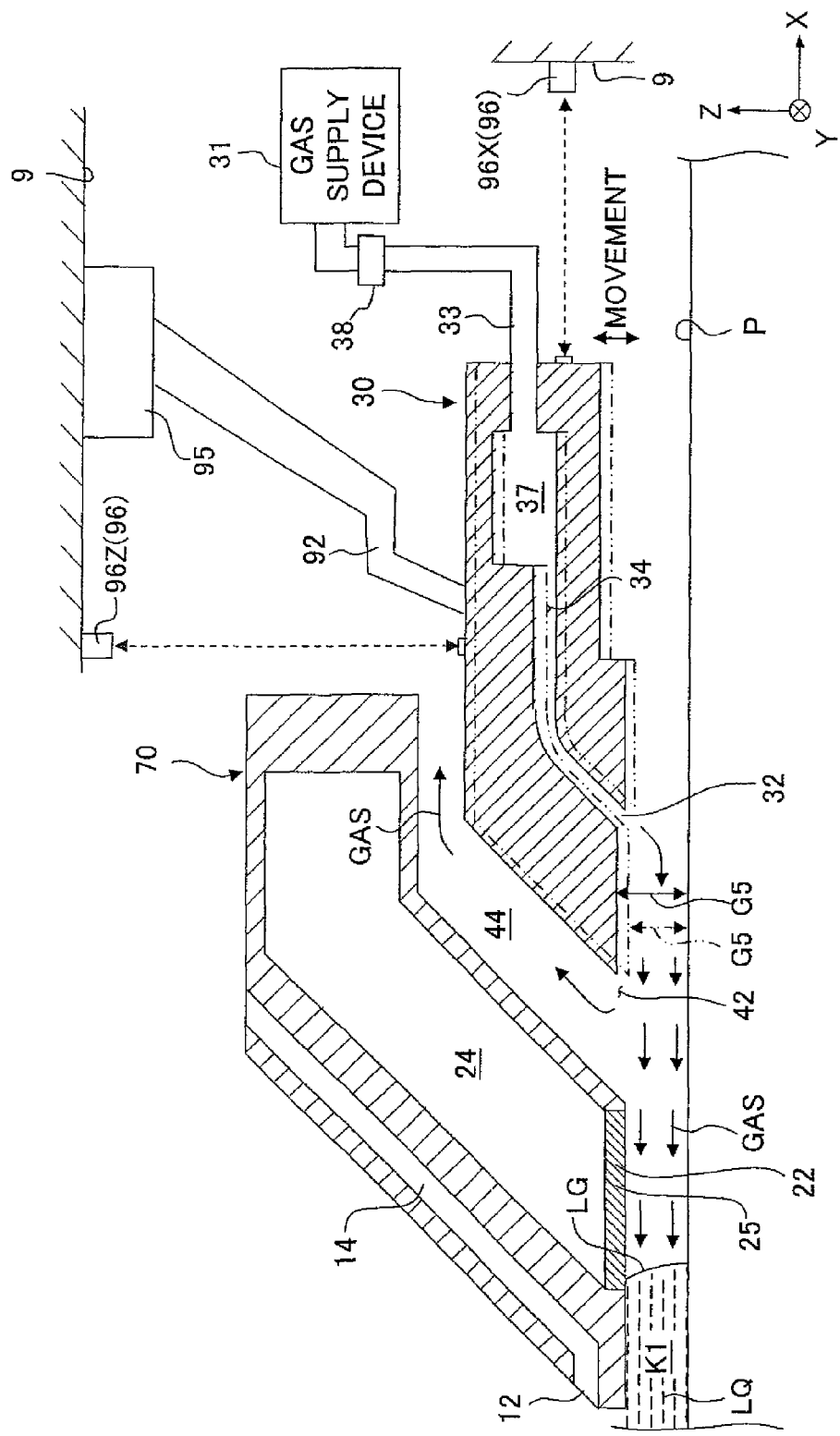
FIG. 10 shows a side sectional view illustrating magnified main components of an exposure apparatus according to a fifth embodiment.

As shown in FIG. 10, the exposure apparatus EX is provided with a nozzle position-detecting device 96 which detects the positional relationship between the main column 9 and the second nozzle member 30. In this embodiment, the nozzle position-detecting device 96 includes a laser interferometer. The nozzle position-detecting device 96 is provided with an X interferometer 96X which detects the distance (relative position) in the X axis direction between the main column 9 and the second nozzle member 30, a Y interferometer 96Y which detects the distance (relative position) in the Y axis direction between the main column 9 and the second nozzle member 30, and a Z interferometer 96Z which detects the distance (relative position) in the Z axis direction between the main column 9 and the second nozzle member 30. The Y interferometer 96Y is not shown in FIG. 10. Each of the interferometers 96X, 96Y, 96Z is fixed at predetermined position on the main column 9. Each of the interferometers 96X, 96Y, 96Z is connected to the controller CONT. Detection results of the respective interferometers 96X, 96Y, 96Z are outputted to the controller CONT.

In this embodiment, a plurality of (for example, two) X interferometers 96X are provided and aligned in the Y axis direction. Reflecting surfaces, which correspond to the X interferometers 96X, are provided on the side surface of the second nozzle member 30 on the X side. The controller CONT can determine the position in relation to the X axis direction of the second nozzle member 30 with respect to the main column 9 on the basis of the detection results of the X interferometers 96X. Further, the controller CONT can determine the position in relation to the θZ direction of the second nozzle member 30 with respect to the main column 9 on the basis of the respective detection results of the plurality of X interferometers 96X. In this embodiment, one Y interferometer 96Y is provided. A reflecting surface, which corresponds to the Y interferometer 96Y, is provided on the side surface of the second nozzle member 30 on the Y side. The controller CONT can determine the position in relation to the Y axis direction of the second nozzle member 30 with respect to the main column 9 on the basis of the detection result of the Y interferometer 96Y. In this embodiment, a plurality of (for example, three) Z interferometers 96Z are provided. Reflecting surfaces, which correspond to the Z interferometers 96Z, are provided on the upper surface of the second nozzle member 30. At least two of the Z interferometers 96Z of the plurality of Z interferometers 96Z are provided and aligned in the X axis direction over or above the second nozzle member 30. At least two of the other Z interferometers 96Z are provided and aligned in the Y axis direction over or above the second nozzle member 30.

The controller CONT can determine the position in relation to the Z axis direction of the second nozzle member 30 with respect to the main column 9 on the basis of the detection results of the Z interferometers 96Z. Further, the controller CONT can determine the position in relation to the θX and θZ directions of the second nozzle member 30 with respect to the main column 9 on the basis of the respective detection results of the plurality of Z interferometers 96Z.

As described above, the controller CONT can determine the position of the second nozzle member 30 with respect to the main column 9 in relation to the directions of six degrees of freedom (X axis, Y axis, Z axis, θX, θY, and θZ directions) on the basis of the detection results of the nozzle position-detecting device 96 having the plurality of interferometers. The numbers and the arrangement of the X interferometer 96X, the Y interferometer 96Y, and the Z interferometer 96Z can be arbitrarily defined. In principle, it is enough to provide such an arrangement that the position of the second nozzle member 30 in the directions of six degrees of freedom can be detected by using the plurality of interferometers 96X, 96Y, 96Z. The nozzle position-detecting device 96 is not limited to the interferometer. For example, it is also possible to use a capacitance sensor or an encoder.

The controller CONT can monitor the position of the second nozzle member 30 with respect to the main column 9 on the basis of the detection result of the nozzle position-detecting device 96. The second nozzle member 30 can be positioned at the desired position with respect to the main column 9 by driving the driving device 95 on the basis of the detection result of the nozzle position-detecting device 96. When the surface position information about the surface of the substrate P is detected by the focus/leveling-detecting system, the controller CONT can determine the position information about the surface of the substrate P with respect to the main column 9 on the basis of the detection result of the focus/leveling-detecting system. Therefore, the controller CONT can control the positional relationship between the second nozzle member 30 and the surface of the substrate P on the basis of the main column 9, as well as the positional relationship between the blow port 32 (lower surface 35) and the surface of the substrate P. The reference, which is used when the positional relationship between the second nozzle member 30 and the substrate P is determined, is not limited to the main column 9. It is possible to use any arbitrary member (reference).

As explained above, in this embodiment, the optimum gas supply condition (position of the second nozzle member 30), which corresponds to the contact angle (affinity) between the liquid LQ and the film member for forming the liquid contact surface of the substrate P, is previously determined. The information about the optimum gas supply condition is stored in the storage device MRY. The controller CONT selects and determines the optimum gas supply condition from a plurality of stored gas supply conditions on the basis of the information about the film member of the substrate P to be subjected to the exposure process inputted via the input device INP (information about the contact angle between the film member and the liquid LQ). The liquid immersion exposure is performed for the substrate P on the basis of the determined gas supply condition. Accordingly, the substrate P can be exposed satisfactorily while preventing the liquid LQ from leaking.

The driving device 95 can adjust the gap G5 between the surface of the substrate P and the first area 35A of the lower surface 35 of the second nozzle member 30 by adjusting the position of the second nozzle member 30. When the gap G5 is adjusted, then it is possible to adjust the flow velocity of the gas at which the gas blows from the blow port 32 and directed toward the optical path space K1, and it is possible to supply the gas having the desired flow velocity to the optical path space K1.

The second nozzle member 30 is the member distinct from the first nozzle member 70. Therefore, the controller CONT can individually adjust the position of the second nozzle member 30 distinctly from the first nozzle member 70 by using the driving device 95. Therefore, the controller CONT can arbitrarily adjust the positional relationship between the blow port 32 and the recovery port 22, the positional relationship between the blow port 32 and the optical path space K1 (liquid LQ with which the optical path space K1 is filled), and/or the positional relationship between the blow port 32 and the substrate P by driving the driving device 95.

In this embodiment, the explanation has been made about the case in which the type of the film member of the substrate P is changed. However, the type (physical property) of the liquid LQ is changed in some cases. Also in such a situation, the controller CONT can adjust the position of the second nozzle member 30 depending on the affinity between the liquid LQ and the film member of the substrate P by using the driving device 95.

In this embodiment, the controller CONT drives the second nozzle member 30 in relation to the direction to make approach or separation with respect to the substrate P (i.e., in the Z axis direction) by using the driving device 95. However, it is of course possible to drive the second nozzle member 30 in the X axis, Y axis, θX, θY, and θZ directions depending on the film member condition of the substrate P. The blow angle of the gas at which the gas blows from the blow port 32 (blow direction of the gas with respect to the lower surface 35) may be variable to adjust the blow angle depending on the condition in relation to the film member of the substrate P.

The liquid immersion area LR is also formed on any object such as the upper surface of the substrate stage PST different from the substrate P in some cases. Therefore, the position of the second nozzle member 30 may be also adjusted by using the driving device 95 depending on the condition (for example, the contact angle) of the object surface on which the liquid immersion area LR is to be formed, without being limited to only the substrate P.

Sixth Embodiment

Next, a sixth embodiment will be explained. The feature of this embodiment resides in that the driving device 95 adjusts the position of the second nozzle member 30 depending on the movement condition (movement velocity, acceleration, and deceleration) of the substrate P. For example, the feature resides in that the position of the second nozzle member 30 is adjusted depending on the scanning velocity (movement velocity) of the substrate P when the exposure light beam EL is irradiated onto the substrate P to perform the liquid immersion exposure for the substrate P while moving the substrate P in the X axis direction.

In this embodiment, the controller CONT determines the gas supply condition of the gas supply mechanism 3 depending on the velocity and/or the acceleration of the substrate P in relation to the X axis direction (scanning direction). For example, when the scanning velocity (and/or the acceleration) of the substrate P is large, then the relative velocity (or the relative acceleration) is increased between the substrate P and the liquid LQ with which the optical path space K1 is filled, and there is such a high possibility that the liquid LQ may leak. Therefore, when the scanning velocity of the substrate P is large, the driving device 95 decreases the distance in relation to the Z axis direction between the lower surface 35 of the second nozzle member 30 and the surface of the substrate P to allow the blow port 32 to approach the substrate P. Accordingly, it is possible to decrease the gap G5 between the surface of the substrate P and the first area 35A of the lower surface 35 of the second nozzle member 30, and it is possible to enhance the flow velocity of the gas at which the gas blows from the blow port 32 toward the optical path space K1. Therefore, the gas, which has the enhanced flow velocity, can be supplied to the interface LG of the liquid LQ with which the optical path space K1 is filled. Therefore, it is possible to prevent the liquid LQ from leaking by means of the force of the supplied gas. When the gap G5 is narrowed, the liquid LQ hardly leaks through the gap G5 owing to the surface tension.

On the other hand, when the scanning velocity (or the acceleration) of the substrate P is small, the possibility of the leakage of the liquid LQ is low. Therefore, when the scanning velocity of the substrate P is small, the driving device 95 increases the distance in relation to the Z axis direction between the lower surface 35 of the second nozzle member 30 and the surface of the substrate P so that the blow port 32 is apart from the substrate P. When the scanning velocity of the substrate P is small, the liquid LQ does not spread excessively on the substrate P. Therefore, even when the gas blows from the blow port 32 in the state in which the distance between the lower surface 35 of the second nozzle member 30 and the surface of the substrate P is increased, it is possible to prevent the liquid LQ from leaking. When the distance between the lower surface 35 of the second nozzle member 30 and the surface of the substrate P is increased, it is possible to avoid the inconvenience including, for example, the collision between the substrate P and the second nozzle member 30.

Also in this embodiment, the controller CONT can position the second nozzle member 30 at the desired position by driving the driving device 95 on the basis of the detection result of the nozzle position-detecting device 96.

As explained above, the substrate P can be exposed satisfactorily while preventing the liquid LQ from leaking by adjusting the position of the second nozzle member 30 depending on the movement condition of the substrate P. The controller CONT can adjust the gap G5 between the surface of the substrate P and the first area 35A of the lower surface 35 of the second nozzle member 30 by adjusting the position of the second nozzle member 30 by using the driving device 95. It is possible to adjust the flow velocity of the gas at which the gas blows from the blow port 32, and it is possible to supply the gas having the desired flow velocity to the optical path space K1.

In this embodiment, the controller CONT adjusts the position of the second nozzle member 30 having the blow port 32 by using the driving device 95 when the substrate P is moved in the scanning direction (X axis direction). However, for example, even when the substrate P is moved in the stepping movement direction (Y axis direction), it is possible to adjust the position of the second nozzle member 30 depending on the stepping movement velocity (and/or the acceleration) of the substrate P.

In this embodiment, the controller CONT drives the second nozzle member 30 in relation to the direction to make approach or separation with respect to the substrate P (i.e., in the Z axis direction) by using the driving device 95. However, it is of course possible to drive the second nozzle member 30 in the X axis, Y axis, θx, θY, and θZ directions depending on the movement condition of the substrate P (including the movement velocity and the movement direction). The blow angle of the gas at which the gas blows from the blow port 32 (blow direction of the gas with respect to the lower surface 35) may be variable to adjust the blow angle depending on the movement condition of the substrate P.

The liquid immersion area LR is also formed on any object such as the upper surface of the substrate stage PST different from the substrate P in some cases. Therefore, the position of the second nozzle member 30 may be adjusted by using the driving device 95 depending on the movement condition of the object on which the liquid immersion area LR is to be formed, without being limited to only the substrate P.

In the third to sixth embodiments described above, the controller CONT may adjust both of the gas blow amount in which the gas blows from the blow port 32 and the position of the second nozzle member 30 depending on the affinity between the liquid LQ and the film member of the substrate P. Similarly, the controller CONT may adjust both of the gas blow amount in which the gas blows from the blow port 32 and the position of the second nozzle member 30 depending on the movement velocity of the substrate P. Further, the controller CONT may adjust at least one of the gas blow amount in which the gas blows from the blow port 32 and the position of the second nozzle member 30 in consideration of the affinity between the liquid LQ and the film member of the substrate P and the movement velocity of the substrate P respectively.

In the third to sixth embodiments described above, the controller CONT may adjust the liquid supply condition and the liquid recovery condition brought about by the liquid immersion mechanism 1 depending on at least one of the affinity between the liquid LQ and the film member of the substrate P and the movement velocity of the substrate P. For example, when the liquid LQ tends to spread on the substrate P, then the controller CONT can decrease the liquid supply amount per unit time brought about by the liquid immersion mechanism 1, and/or the controller CONT can increase the liquid recovery amount. On the other hand, when the liquid LQ hardly spreads on the substrate P, then the controller CONT can increase the liquid supply amount per unit time brought about by the liquid immersion mechanism 1, and/or the controller CONT can decrease the liquid recovery amount.

Seventh Embodiment

Next, a seventh embodiment will be explained with reference to FIG. 11. The feature of this embodiment, which is different from the first to sixth embodiments, resides in that a suction device 60 is provided, which evacuates the gas discharge space 44 connected to the gas discharge port 42.

Figure 11:
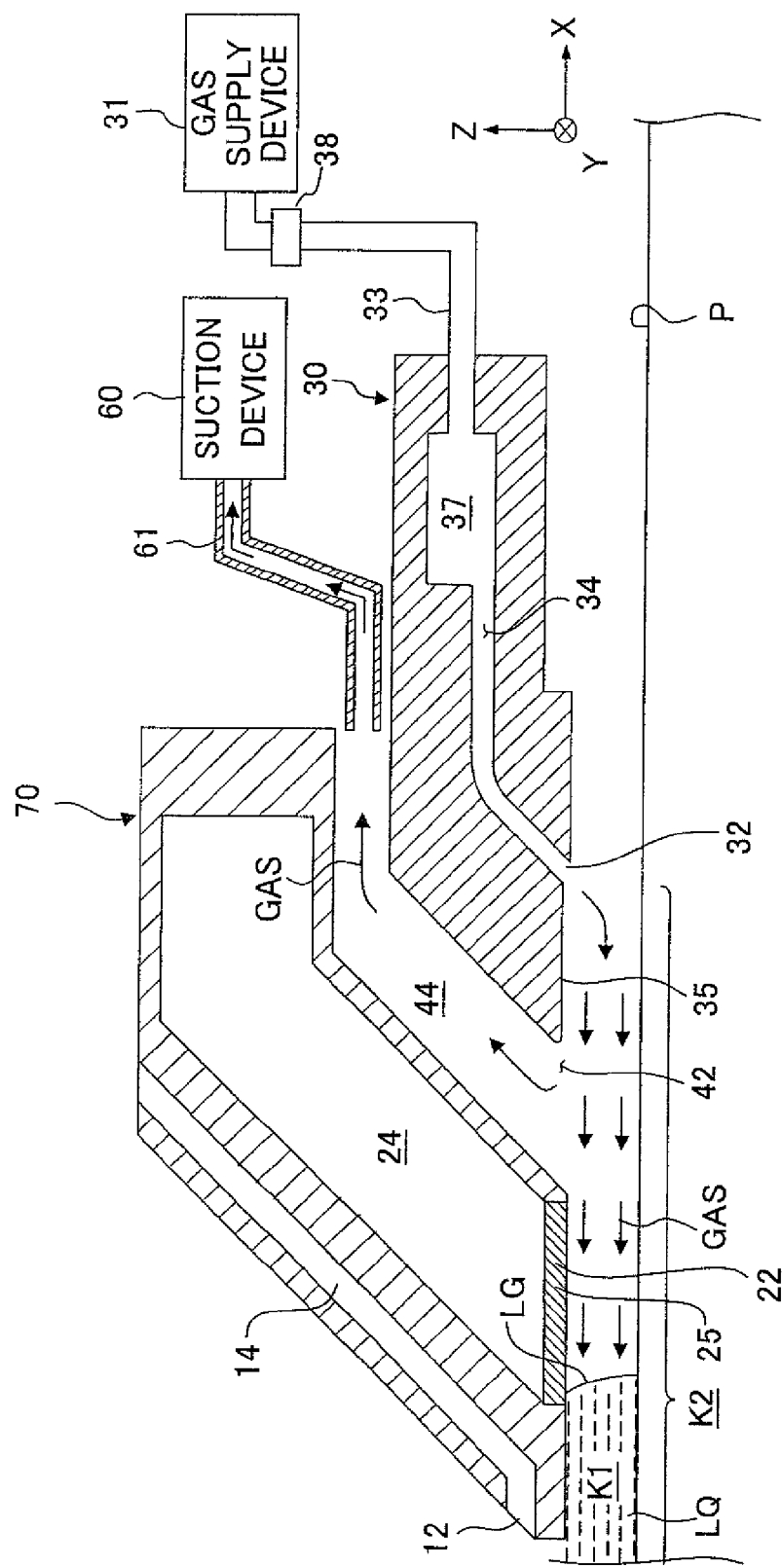
FIG. 11 shows a side sectional view illustrating magnified main components of an exposure apparatus according to a seventh embodiment.

With reference to FIG. 11, the exposure apparatus EX is provided with the suction device 60 for sucking or evacuating the gas discharge space 44. One end of a suction tube 61 is connected to the suction device 60. The other end of the suction tube 61 is connected to the gas discharge space 44. The suction device 60 includes a vacuum system. The suction device 60 is capable of sucking the gas contained in the gas discharge space 44. The controller CONT executes the suction operation by the suction device 60 concurrently with the gas blow operation from the blow port 32. The controller CONT can actively discharge the gas contained in the predetermined space K2 including those disposed in the vicinity of the recovery port 22 by the aid of the gas discharge port 42 by sucking the gas contained in the gas discharge space 44 by using the suction device 60. Even when the gas is actively discharged by using the suction device 60 as described above, it is possible to smoothly generate the flow of the gas having the desired flow velocity directed to the optical path space K1 in the vicinity of the recovery port 22.

Also in the second to seventh embodiments described above, the first area 35A of the lower surface 35 of the second nozzle member 30 may be substantially flush with the second area 35B as described in the first embodiment.

Eighth Embodiment

Next, an eighth embodiment will be explained with reference to FIG. 12. The feature of this embodiment resides in that the second nozzle member 30 has a projection 65, and the blow port 32 is provided approximately at an end portion of the projection 65.

Figure 12:
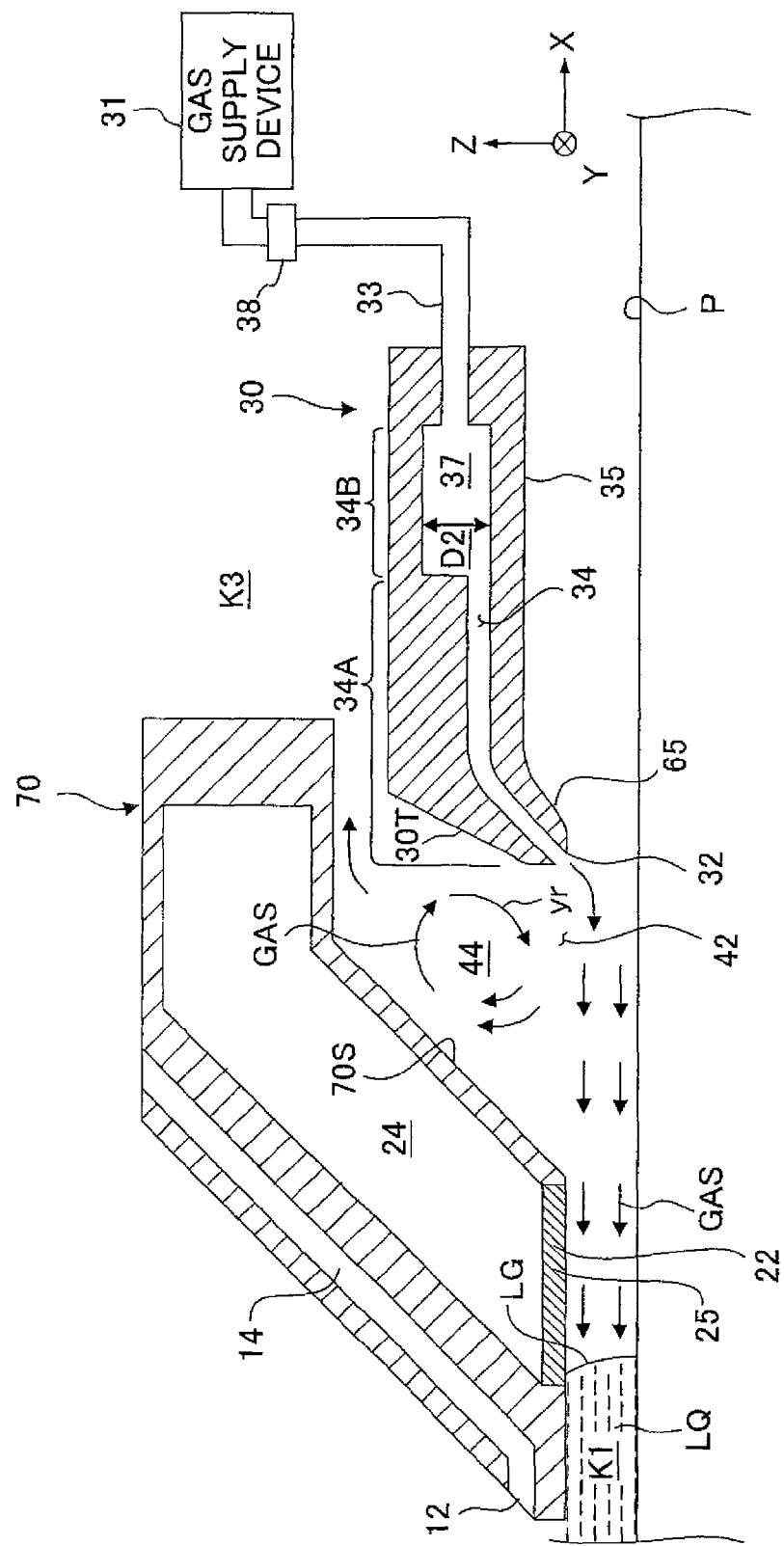
FIG. 12 shows a side sectional view illustrating magnified main components of an exposure apparatus according to an eighth embodiment.

With reference to FIG. 12, the projection 65, which protrudes in an inclined direction toward the optical path space K1, is provided at the portion of the lower surface 35 of the second nozzle member 30 closest to the optical path space K1. The projection 65 is formed substantially continuously to the inner side surface 30T of the second nozzle member 30 opposite to the side surface 70S of the first nozzle member 70. The blow port 32 is provided approximately at the end portion of the projection 65. The first flow passage portion 34A of the supply flow passage 34 is inclined with respect to the XY plane in the same manner as in the first to seventh embodiments.

A part of the gas, which blows from the blow port 32, is directed toward the optical path space K1 along the surface of the substrate P, and the remaining part flows into the gas discharge space 44 via the gas discharge port 42. A part of the gas, which flows into the gas discharge space 44 via the gas discharge port 42, is discharged to the external space K3 via the gas discharge space 44. However, the remaining part forms a vortex flow in the gas discharge space 44, which flows downwardly along the inner side surface 30T (see the arrow yr shown in FIG. 12). The gas, which flows downwardly along the inner side surface 30T, is merged into the gas which blows from the blow port 32. The gas flows toward the optical path space K1.

As described above, the vortex flow is formed in the gas discharge space 44 by the gas which blows from the blow port 32 provided approximately at the end portion of the projection 65 to merge the gas component which flows downwardly along the inner side surface 30T and the gas component which blows from the blow port 32. Accordingly, it is possible to enhance the flow velocity of the gas directed toward the optical path space K1. It is possible to prevent the liquid LQ from leaking more reliably.

The first area 35A (guide surface) of the lower surface 35 of the second nozzle member 30 is not formed unlike the first to seventh embodiments. Therefore, the blow port 32 can be arranged in the vicinity of the recovery port 22 of the first nozzle member 70. It is possible to generate the gas flow having the greater flow velocity in the vicinity of the recovery port 22.

It goes without saying that the adjustment of the gas blow amount and/or the position of the second nozzle member 30 can be executed as explained in the second to seventh embodiments, in the eighth embodiment as well.

In the first to eighth embodiments described above, the blow port 32 is formed to have the annular shape as viewed in a plan view. However, it is also allowable to provide a plurality of slit-shaped blow ports 32 having a predetermined length in predetermined directions. For example, a plurality of blow ports 32, which are substantially circular arc-shaped as viewed in a plan view, which has a predetermined length, and which are formed to have slit-shaped forms, may be arranged at predetermined intervals to surround the optical path space K1. Also in this case, when the buffer space 37 is provided at the intermediate position of the supply flow passage 34 connected to the blow port 32, it is possible to allow the gas to blow substantially uniformly from each of the slit-shaped blow ports 32 having the predetermined length. Alternatively, a plurality of blow ports, which are circular as viewed in a plan view, may be arranged at predetermined intervals to surround the optical path space K1.

In the first to eighth embodiments described above, the blow angle of the gas at which the gas blows from the blow port 32 (angle of the inclined portion of the first flow passage portion 34A) is defined to be about 45° with respect to the XY plane. However, the blow angle may be defined to be another angle (for example, about 30°). As described above, the gas blow angle may be made adjustable.

In the first to eighth embodiments described above, the blow port 32 is located at the high position (position separated in the +Z direction) with respect to the lower surface 25B of the porous member 25 at the recovery port 22. However, there is no limitation thereto. The blow port 32 may be provided at any position (position separated in the −Z direction) lower than that of the lower surface 25B of the porous member 25. Of course, as described above, the blow position of the gas (position in the Z direction) may be adjustable.

When a plurality of blow ports 32 are provided to surround the optical path space K1, for example, the gas blow amount per unit time of the gas in which the gas blows from each of the blow ports 32 may be adjusted depending on the movement direction of the substrate P. For example, when the liquid immersion exposure is performed while performing the scanning movement toward the +X side for the substrate P with respect to the optical path space K1, the gas blow amount from the blow port 32 provided on the +X side of the optical path space K1 may be made greater than the gas blow amount from another blow port 32. That is, the gas blow amounts of the respective blow ports can be independently controlled depending on the movement direction of the liquid with respect to the flow of the gas which blows from the blow ports.

In the first to eighth embodiments described above, for example, a fin-shaped member may be provided for at least one of the side surface 70S of the first nozzle member 70 and the inner side surface 30T of the second nozzle member 30 to guide the flow of the gas which blows from the blow port 32 and which flows through the gas discharge flow passage. Any member including, for example, a projection-shaped member may be used provided that the member is a guide member capable of guiding the flow of the gas, other than the fin-shaped member. A groove (slit) may be formed for at least one of the side surface 70S of the first nozzle member 70 and the inner side surface 30T of the second nozzle member 30 as the guide portion for guiding the flow of the gas.

In the respective embodiments described above, the lower surface 25B of the porous member 25 provided for the recovery port 22 is substantially parallel to the surface of the substrate P (XY plane). However, the lower surface 25B of the porous member 25 provided for the recovery port 22 may be inclined with respect to the surface of the substrate P supported by the substrate stage PST so that the distance with respect to the surface of the substrate P is gradually increased in relation to the direction to make separation from the optical path space K1.

In the respective embodiments described above, the first nozzle member 70 and the second nozzle member 30 are the mutually independent members. However, one nozzle member may be provided with the recovery port 22, the blow port 32, and the gas discharge port 42.

In the first to eighth embodiments described above, the lower surface 35 of the second nozzle member 30 is treated to be liquid-repellent so that any adhesion of the liquid LQ or the like is avoided. However, it is also allowable that the lower surface 35 of the second nozzle member 30 is not liquid-repellent.

In the first to eighth embodiments described above, the exposure apparatus EX carries the driving device 95 for adjusting the position of the second nozzle member 30. However, the driving device 95 may be omitted, and the second nozzle member 30 may be fixed to and supported by the main column 9.

In the first to eighth embodiments described above, a buffer space, in which the liquid LQ disposed between the first nozzle member 70 and the substrate P can freely enter and exit, may be formed for the first nozzle member 70. An opening, which is formed annularly to surround the optical path for the exposure light beam EL in the vicinity of the inner side of the recovery port 22, is formed at the lower end of the buffer space. The upper end thereof is connected to the external space (atmospheric space). When the buffer space is provided in the vicinity of the inner side of the recovery port 22 as described above, then a part of the liquid LQ, which flows toward the outside of the optical path space K1, flows into the buffer space, and it is possible to decrease the amount of the liquid LQ which arrives at the recovery port 22. Therefore, it is possible to suppress the liquid LQ from leaking more reliably in combination with the gas blow operation from the second nozzle member 30 (blow port 32). The opening at the lower end of the buffer space may be arranged in the vicinity of the outer side of the recovery port 22. In this arrangement, the liquid LQ, which is included in the liquid LQ which flows toward the outside of the optical path space K1 and which is not recovered by the recovery port 22, flows into the buffer space. Therefore, it is possible to suppress the liquid LQ from leaking in combination with the gas blow operation from the second nozzle member 30 (blow port 32). Of course, annular openings may be formed at both of the vicinity of the inner side and the vanity of the outer side of the recovery port 22 to form buffer spaces in which the liquid LQ can freely enter and exit.

In the first to eighth embodiments described above, the land surface 75 and the lower surface 25A of the porous member 25 are formed to be substantially flush with each other. However, it is also allowable that any difference in height is present. For example, the lower surface 25B of the porous member 25 may be provided at a position (position in the +Z direction) slightly higher than that of the land surface 75.

As described above, in the first to eighth embodiments, the second nozzle member 30 functions as the seal mechanism for enclosing the liquid LQ at the inside of the suction port 32 (gas discharge port 42), and it is possible to avoid or suppress the liquid LQ from leaking to the outside of the recovery port 22. Therefore, it is possible to avoid the inconvenience which would be otherwise caused, for example, such that any liquid droplet remains on the substrate P.

Figure 13:
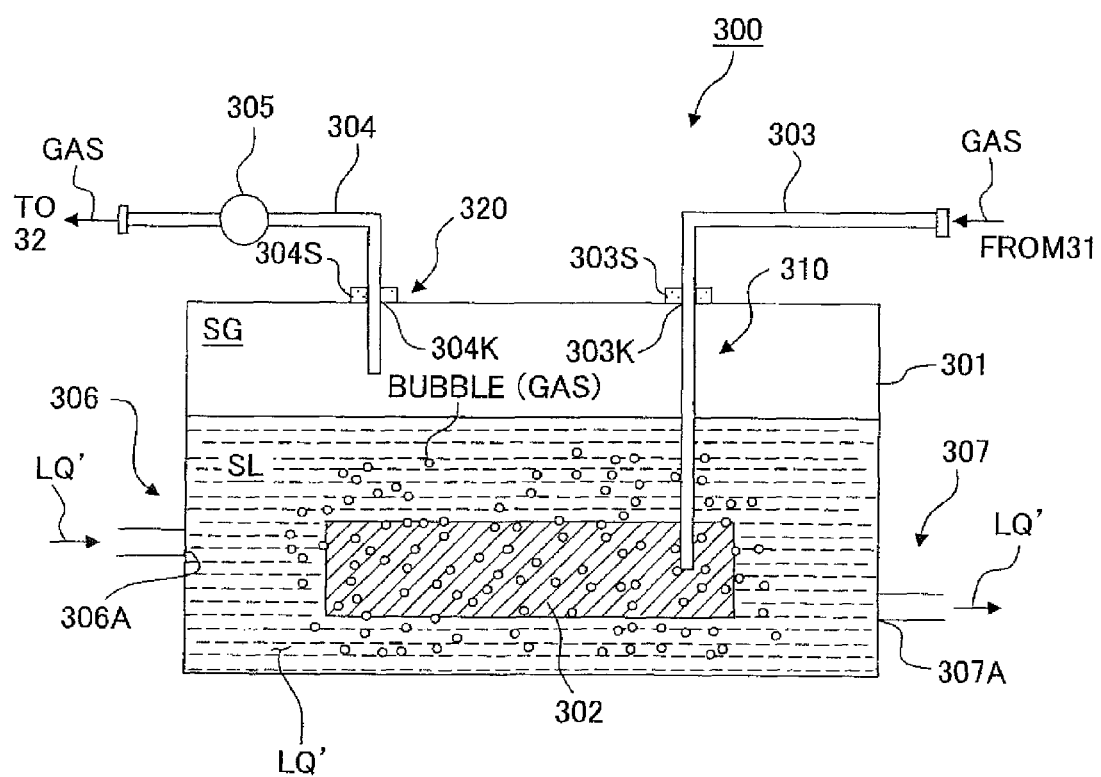
FIG. 13 illustrates a cleaning device for cleaning the gas.

In the first to eighth embodiments described above, it is possible to provide a cleaning device which cleans the gas to be supplied to the blow port 32. FIG. 13 conceptually shows an example of the cleaning device for cleaning the gas. With reference to FIG. 13, the cleaning device 300 cleans the gas to be supplied to the blow port 32. The cleaning device 300 is provided with a container 301 which accommodates a cleaning liquid LQ' for cleaning the gas, a supply mechanism 310' which supplies the gas in a form of bubble or foam into the liquid LQ', and a collecting mechanism 320 which collects the gas which passes through the liquid LQ'. The cleaning device 300 cleans the gas by allowing the gas as the cleaning objective to pass through the cleaning liquid LQ'. The cleaning device 300 constitutes a part of the gas supply mechanism 3. For example, the cleaning device 300 is provided at an intermediate portion (for example, at a predetermined position of the second supply tube 33) of the flow passage for the gas between the gas supply device 31 and the blow port 32.

The supply mechanism 310 is provided with a porous member 302 which is arranged in the liquid LQ' accommodated in the container 301, and a supply tube 303 which supplies the gas as the cleaning objective into the porous member 302. The collecting mechanism 320 collects the gas (bubbles) whish is released from the porous member 303 and which passes through the liquid LQ'. The collecting mechanism 320 is provided with a collecting tube 304, and a suction device (pump) 305 which is provided at an intermediate portion of the collecting tube 304.

The cleaning device 300 includes a liquid supply system 306 which supplies the cleaning liquid LQ' to the container 301, and a liquid recovery system 307 which recovers the liquid LQ from the container 301. The liquid supply system 306 has a supply port 306A which is provided at a predetermined position of the container 301. The cleaning liquid LQ' can be supplied into the container 301 via the supply port 306A. In this embodiment, pure water is used as the cleaning liquid LQ'. The liquid recovery system 307 has a recovery port 307A which is provided at a predetermined position of the container 301. The liquid LQ contained in the container 301 can be recovered (discharged) via the recovery port 307A. The controller CONT concurrently performs the operation for supplying the liquid LQ' by the liquid supply system 306 and the operation for recovering the liquid LQ by the liquid recovery system 307 at least during the period in which the gas is supplied to the cleaning liquid LQ' by means of the supply mechanism 310. That is, the controller CONT always allows the clean liquid LQ' to continuously flow to the container 301 so that the cleanness of the liquid LQ' contained in the container 301 is maintained at least during the period in which the gas is supplied to the cleaning liquid LQ' by means of the supply mechanism 310.

The controller CONT adjusts at least one of the liquid supply amount per unit time by the liquid supply system 306 and the liquid recovery amount per unit time by the liquid recovery system 370. Accordingly, as shown in FIG. 13, the liquid space SL and the gas space SG are formed in the container 301 respectively.

The porous member 302 of the cleaning device 300 is formed of a fluorine-based resin material including, for example, PTFE (polytetrafluoroethylene). The porous member 302 is arranged in the liquid LQ' (liquid space SL) in the container 301. One end of the supply tube 303 of the cleaning device 300 is connected to the gas supply device 31, and the other end is connected into the porous member 302 arranged in the liquid LQ'. One end of the collecting tube 304 is connected to the gas space SG of the container 301, and the other end is connected, for example, to the supply port 32 via the second supply tube 33.

A hole 303K, in which the supply tube 303 can be accommodated, is provided at a predetermined position of the container 301. The hole 303K, which accommodates the supply tube 303, is sealed by a seal member 303S. Similarly, a hole 304K, in which the collecting tube 304 can be accommodated, is provided at a predetermined position of the container 301. The hole 304K, which accommodates the collecting tube 304, is sealed by a seal member 304S. The interior of the container 301 is substantially tightly closed.

Next, an explanation will be made about a method for cleaning the gas by using the cleaning device 300. The controller CONT feeds the gas as the cleaning objective from the gas supply device 31. The gas, which is fed from the gas supply device 31, passes through the supply tube 303, and then the gas is supplied into the porous member 302. The porous member 302 is arranged in the cleaning liquid LQ'. The gas, which is supplied into the porous member 302, is released into the liquid LQ' in the form of foamed gas (bubbles) from the porous member 302. The gas (bubbles) released from the porous member 302 is moved upwardly in the liquid LQ' in accordance with the difference in specific gravity with respect to the liquid LQ'.

When any foreign matter is contained in the gas (bubbles), the foreign matter contained in the bubbles is removed by the liquid LQ' in accordance with the movement through the liquid LQ'. The principle will be explained. The foreign matter contained in the bubbles performs the Brownian motion in accordance with the collision with gas molecules in the bubbles. The foreign matter is moved to the position in the vicinity of the interface of the bubble in accordance with the Brownian motion. In this situation, an extremely large van der Waals force (attraction) acts with respect to the foreign matter, because the dielectric constant of water is extremely large, i.e., about 80. The foreign matter is trapped by water of the interface by means of the attraction. Once the foreign matter is trapped, the foreign matter is not exfoliated again due to the extremely large surface tension of water. The foreign matter is diffused again into water in accordance with the Brownian motion. When the dielectric constant of the foreign matter is 1, the van der Waals force is extremely weakened. However, even in such a situation, when the foreign matter arrives at the interface in accordance with the Brownian motion, the foreign matter is captured by water by means of the surface tension of water. The foreign matter is charged in some cases. In such a situation, water, which is in the vicinity of the interface, is polarized by the electric charge of the foreign matter. The foreign matter is attracted to the interface by means of the Coulomb force, i.e., by the force stronger than the van der Waals force. The foreign matter is captured by water more efficiently.

When the supply mechanism 310 of the cleaning device 300 supplies the bubbles to the liquid LQ', then the operation for supplying the liquid LQ' is performed by the liquid supply system 306, and the operation for recovering the liquid LQ' is performed by the liquid recovery system 307. Therefore, the cleanness of the liquid LQ' is maintained in the container 301. Therefore, the movement of the foreign matter from the liquid LQ' to the bubbles is suppressed.

As described above, the cleaning device 300 can clean the gas by removing the foreign matter contained in the bubbles, from the bubbles by allowing the gas to pass through the cleaning liquid LQ'.

The bubbles (gas), which are released from the porous member 302 and which are moved through the liquid LQ', are moved to the gas space SG. The gas space SG is filled with the gas having been cleaned with the liquid LQ'. The controller CONT drives the supply unit 305 of the collecting mechanism 320 so that the gas after the cleaning, with which the gas space SG is filled, is sucked from one end of the collecting tube 304, and the gas is successfully supplied to the blow port 32.

As explained above, the clean gas, which is cleaned by the cleaning device 300, can be supplied to the blow port 32. Accordingly, the clean gas is supplied to those in the vicinity of the optical path space K1 and those in the vicinity of the substrate P. Therefore, it is possible to avoid the inconvenience which would be otherwise caused such that the liquid LQ, with which the optical path space K1 is filled, is polluted and/or the surface of the substrate P is polluted due to the gas which blows from the blow port 32. Therefore, the substrate P can be exposed satisfactorily.

The gas, which blows from the blow port 32, is the gas which passes through the liquid LQ'. Therefore, the gas has a relatively high humidity (moisture). Therefore, when the gas, which contains the moisture (water content), blows from the blow port 32, it is possible to suppress the temperature change caused by the vaporization of the liquid LQ (pure water) on the object including, for example, the substrate P and the substrate stage PST against which the gas blows. If necessary, a drier, which is capable of drying the gas to be supplied from the cleaning device 300 to the blow port 32, may be provided, for example, at a predetermined position of the second supply tube 33 between the cleaning device 300 and the blow port 32. The gas may be dried by using the drier, and then the dried gas may be supplied to the blow port 32.

It is desirable that the size of the bubble to be supplied into the cleaning liquid LQ' is as small as possible. Therefore, it is desirable that the pore size formed for the porous member 302 is as small as possible as well. When the pore size of the porous member 302 is decreased, any large foreign matter contained in the gas can be captured by the porous member 302. When the size of the bubble is decreased, it is possible to suppress the intrusion of the foreign matter into the bubble. When the size of the bubble is decreased, it is possible to enhance the probability of the contact between the liquid LQ' and the foreign matter contained in the gas, even when the foreign matter is present in the bubble. It is possible to satisfactorily capture the foreign matter contained in the bubble with the liquid LQ'. That is, when the size of the bubble released from the porous member 302 is large, the foreign matter, which has entered the interior of the bubble, is moved by a long distance to the interface of water in accordance with the Brownian motion. Therefore, there is such a possibility that the foreign matter may be consequently moved to the gas space SG without making any contact with the liquid LQ'. In this situation, there is such a possibility that the foreign matter contained in the bubble may not be captured by the liquid LQ', and the foreign matter may be consequently moved to the gas space SG. When the foreign matter is moved to the gas space SG, an inconvenience arises such that the gas containing the foreign matter is consequently supplied to the blow port 32. When the size of the bubble to be supplied into the cleaning liquid LQ' is decreased, it is possible to suppress the intrusion of the foreign matter into the gas with which the gas space SG is filled as well as the gas which is supplied to the blow port 32. Therefore, it is desirable that the porous member 302, which is arranged in the liquid LQ', has the small pores.

In this embodiment, pure water is used as the cleaning liquid LQ', which is the same as the liquid LQ for the exposure in order to fill the optical path space K1 therewith. Therefore, it is also allowable that the liquid LQ (LQ') is supplied from the liquid supply device 11 to the container 301 of the cleaning device 300. In this arrangement, it is preferable that the liquid LQ, with which the optical path space K1 is to be filled, is subjected to the degassing process in order to suppress the generation of any bubble on the optical path space K1. On the other hand, when the cleaning liquid LQ', which is supplied to the container 301, is subjected to the degassing process, there is such a possibility that the bubbles released from the porous member 302 may be extinguished. Therefore, it is desirable that the cleaning liquid LQ' is not subjected to the degassing process.

The method for cleaning the gas is not limited to the method performed by the cleaning device shown in FIG. 13. It is also available to use any other method. For example, fine particles (mist) of clean pure water may be formed by using, for example, a turbine and/or a spray nozzle, and the gas passes through the space filled with the fine particles of pure water to clean the gas.

When the gas cleaning device is used as described above, the gas having a high humidity is supplied from the blow port 32 in some cases. However, a gas humidity-regulating device may be provided for the gas supply system together with the gas cleaning device or in place of the gas cleaning device. For example, the gas having a desired temperature and a desired humidity can be supplied from the blow port 32 such that the temperature of the gas to be supplied from the blow port 32 is increased, the humidity of the gas is decreased by vaporizing water, and the cooling operation for the gas is controlled.

Figure 14:
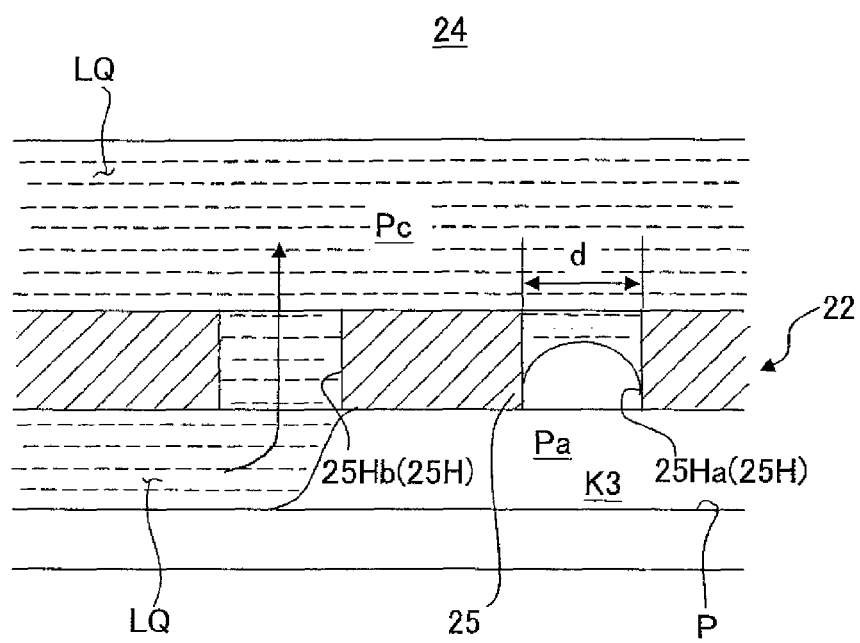
FIG. 14 explains the principle of the operation for recovering the liquid by a liquid immersion mechanism.
Figure 14:
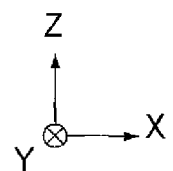

In the respective embodiments described above, the liquid immersion mechanism 1 is provided to recover only the liquid LQ by the aid of the recovery port 22. An explanation will be made below about the principle of the liquid recovery operation effected by the liquid immersion mechanism 1 with reference to FIG. 14. FIG. 14 shows, with magnification, a sectional view illustrating a part of the porous member 25, which schematically explains the liquid recovery operation performed by the aid of the porous member 25.

With reference to FIG. 14, the porous member 25 is provided for the recovery port 22. The substrate P is provided under or below the porous member 25. The gas space and the liquid space are formed between the porous member 25 and the substrate P. More specifically, the gas space is formed between a first hole 25Ha of the porous member 25 and the substrate P, and the liquid space is formed between a second hole 25Hb of the porous member 25 and the substrate P. The recovery flow passage (flow passage space) 24 is formed over or above the porous member 25.

The liquid immersion mechanism 1 of the embodiment of the present invention is designed so that the following condition is satisfied:

$$(4 \times \gamma \times \cos \theta)/d \geq (Pa - Pc) \quad (1)$$

wherein Pa represents the pressure in the space K3 between the substrate P and the first hole 25Ha of the porous member 25 (pressure on the lower surface of the porous member 25H), Pc represents the pressure in the flow passage space 24 over or above the porous member 25 (pressure on the upper surface of the porous member 25), d represents the pore size (diameter) of the holes 25Ha, 25Hb, θ represents the contact angle of the porous member 25 (inner side surface of the hole 25H) with respect to the liquid LQ, and γ represents the surface tension of the liquid LQ. In the expression (1) described above, the hydrostatic pressure of the liquid LQ disposed over or above the porous member 25 is not considered in order to simplify the explanation.

In this case, the contact angle θ between the liquid LQ and the porous member 25 (inner side surface of the pore 25H) satisfies the following condition.

$$\theta \leq 90° \quad (2)$$

If the foregoing condition holds, even when the gas space is formed on the lower side of the first hole 25Ha of the porous member 25 (on the side of the substrate P), then the gas contained in the space K3 on the lower side of the porous member 25 is prevented from any movement (inflow) into the flow passage space 24 on the upper side of the porous member 25 via the hole 25Ha. That is, when the pore size d of the porous member 25, the contact angle (affinity) θ of the porous member 25 with respect to the liquid LQ, the surface tension γ of the liquid LQ, and the pressures Pa, Pc are optimized so that the foregoing condition is satisfied, then the interface between the liquid LQ and the gas can be maintained at the inside of the first hole 25Ha of the porous member 25, and it is possible to suppress the inflow of the gas from the space K3 into the flow passage space 24 via the first hole 25Ha. On the other hand, the liquid space is formed on the lower side of the second hole 25Hb of the porous member 25 (on the side of the substrate P). Therefore, it is possible to recover only the liquid LQ by the aid of the second hole 25Hb.

In this embodiment, the pressure Pa of the space K3 on the lower side of the porous member 25, the pore size d, the contact angle θ of the porous member 25 (inner side surface of the hole 25H) with respect to the liquid LQ, and the surface tension γ of the liquid (pure water) LQ are substantially constant. The liquid immersion mechanism 1 adjusts the pressure Pc of the flow passage space 24 on the upper side of the porous member 25 so that the foregoing condition is satisfied by controlling the suction force of the liquid recovery device 21.

In the expression (1), the greater (Pa−Pc) is, i.e., the greater ((4×γ×cos θ)/d) is, the more easily the pressure Pc to satisfy the foregoing condition is controlled. Therefore, it is desirable that the pore size d is decreased to be as small as possible, and the contact angle θ of the porous member 25 with respect to the liquid LQ is decreased to be as small as possible. In the embodiment of the present invention, the porous member 25 is liquid-attractive with respect to the liquid LQ, which has the sufficiently small contact angle θ.

As described above, in the embodiment of the present invention, the difference in pressure between the space 24 over or above the porous member 25 and the space K3 under or below the porous member 25 (difference in pressure between the upper surface and the lower surface of the porous member 25) is controlled to satisfy the foregoing condition in the state in which the porous member 25 is wet. Accordingly, only the liquid LQ is recovered from the hole 25H of the porous member 25. Thus, it is possible to suppress the occurrence of the vibration which would be otherwise caused such that the liquid LQ and the gas are sucked together.

Ninth Embodiment

Figure 15:
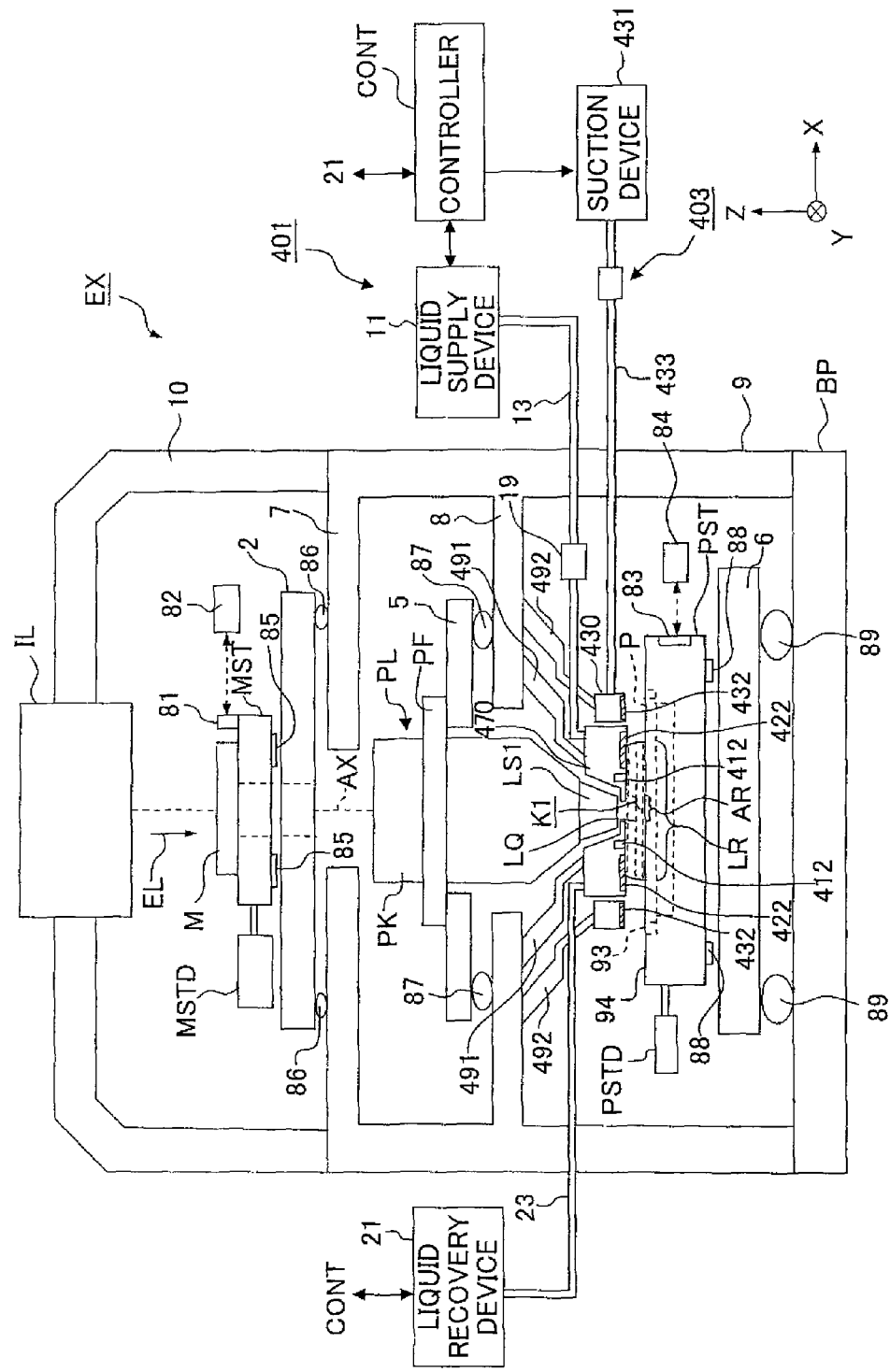
FIG. 15 shows a schematic arrangement illustrating an exposure apparatus according to a ninth embodiment.

Next, a ninth embodiment will be explained. In the following description, the constitutive components, which are the same as or equivalent to those of the embodiment described above, are designated by the same reference numerals, any explanation of which will be simplified or omitted. FIG. 15 shows a schematic arrangement illustrating an exposure apparatus according to the ninth embodiment. With reference to FIG. 15, the exposure apparatus EX is provided with a mask stage MST which is movable while retaining a mask M, a substrate stage PST which is movable while retaining a substrate P, an illumination optical system IL which illuminates, with an exposure light beam EL, the mask M retained by the mask stage MST, a projection optical system PL which projects an image of a pattern of the mask M illuminated with the exposure light beam EL onto the substrate P retained by the substrate stage PST, and a controller CONT which integrally controls the operation of the entire exposure apparatus EX.

The exposure apparatus EX of the embodiment of the present invention is the liquid immersion exposure apparatus in which the liquid immersion method is applied in order that the exposure wavelength is substantially shortened to improve the resolution and the depth of focus is substantially widened. The exposure apparatus EX is provided with a liquid immersion mechanism 401 which is provided to fill, with a liquid LQ, an optical path space K1 for the exposure light beam EL in the vicinity of the image plane of the projection optical system PL. The following description will be made about a case in which the optical path space K1 is filled with the liquid LQ in a state in which the projection optical system PL and the substrate P are opposite to one another. However, the same or equivalent arrangement is also adopted when the optical path space K1 is filled with the liquid LQ in a state in which any object (for example, the upper surface of the substrate stage PST) other than the substrate P is opposite to the projection optical system PL. The liquid immersion mechanism 401 includes a nozzle member 470 which is provided in the vicinity of the optical path space K1 and which has supply ports 412 for supplying the liquid LQ and a recovery port 422 for recovering the liquid LQ, a liquid supply device 11 which supplies the liquid LQ via a supply tube 413 and the supply ports 412 provided for the nozzle member 470, and a liquid recovery device 21 which recovers the liquid LQ via a recovery tube 23 and the recovery port 422 provided for the nozzle member 470. As described in detail later on, a flow passage (supply flow passage) 414, which connects the supply port 412 and the supply tube 13, is provided in the nozzle member 470. Further, a flow passage (recovery flow passage) 424, which connects the recovery port 422 and the recovery tube 23, is provided in the nozzle member 470. The nozzle member 470 is formed to have an annular shape to surround a first optical element LS1 which is closest to the image plane of the projection optical system PL among a plurality of optical elements for constructing the projection optical system PL.

The exposure apparatus EX of this embodiment adopts the local liquid immersion system in which a liquid immersion area LR of the liquid LQ is locally formed on a part of the substrate P including a projection area AR of the projection optical system PL, the liquid immersion area LR being greater than the projection area AR and smaller than the substrate P. The exposure apparatus EX transfers the pattern of the mask M to the substrate P by irradiating, onto the substrate P, the exposure light beam EL which passes through the mask M via the projection optical system PL and the liquid LQ with which the optical path space K1 is filled, while the optical path space K1 for the exposure light beam EL, which is between the first optical element LS1 closest to the image plane of the projection optical system PL and the substrate P arranged on the image plane side of the projection optical system PL, is filled with the liquid LQ at least during a period in which the pattern image of the mask M is projected onto the substrate P. The controller CONT forms the liquid immersion area LR of the liquid LQ locally on the substrate P by filling the optical path space K1 with the liquid LQ such that a predetermined amount of the liquid LQ is supplied by using the liquid supply device 11 of the liquid supply mechanism 401 and a predetermined amount of the liquid LQ is recovered by using the liquid recovery device 21.

The structures of the illumination optical system IL, the substrate stage PST, the mask stage MST, and the projection optical system PL are the same as or equivalent to those explained in the first embodiment, any explanation of which will be omitted. It is also allowable that a difference in height is present between the upper surface 94 of the substrate stage PST and the surface of the substrate P provided that the optical path space K1 can be continuously filled with the liquid LQ.

The exposure apparatus EX is provided with a suction mechanism 403 which is capable of sucking only the gas. The suction mechanism 403 includes a suction member 430 which is provided in the vicinity of the nozzle member 470 and which has a suction port 432 for sucking only the gas, and a suction device 431 which sucks the gas via a suction tube 433. As described in detail later on, a flow passage (suction flow passage) 434, which connects the suction port 432 and the suction tube 433, is provided in the suction member 430. The suction member 430 is formed to have an annular form to surround the optical path space K1 and the nozzle member 470.

The liquid supply device 11 of the liquid immersion mechanism 401 is provided with, for example, a tank for accommodating the liquid LQ, a pressurizing pump, a temperature regulation unit for regulating the temperature of the liquid LQ to be supplied, and a filter unit for removing any foreign matter contained in the liquid LQ. One end of the supply tube 13 is connected to the liquid supply device 11. The other end of the supply tube 13 is connected to the nozzle member 470. The liquid supply operation of the liquid supply device 11 is controlled by the controller CONT. It is unnecessary that the exposure apparatus EX is provided with, for example, all of the tank, the pressurizing pump, the temperature regulation mechanism, and the filter unit of the liquid supply device 11. It is also allowable to substitutively use any equipment of the factory or the like in which the exposure apparatus EX is installed.

A flow rate controller 19 called "mass flow controller", which controls the amount of the liquid per unit time to be fed from the liquid supply device 11 and supplied to the image plane side of the projection optical system PL, is provided at an intermediate position of the first supply tube 13. The control of the liquid supply amount based on the use of the flow rate controller 19 is performed under the instruction signal of the controller CONT.

The liquid recovery device 21 of the liquid immersion mechanism 401 is provided with, for example, a vacuum system such as a vacuum pump, a gas/liquid separator for separating the gas from the recovered liquid LQ, and a tank for accommodating the recovered liquid LQ. One end of the recovery tube 23 is connected to the liquid recovery device 21. The other end of the recovery tube 23 is connected to the nozzle member 470. The liquid recovery operation of the liquid recovery device 21 is controlled by the controller CONT. It is unnecessary that the exposure apparatus EX is provided with, for example, all of the vacuum system, the gas/liquid separator, and the tank of the liquid recovery device 21. It is also allowable to substitutively use any equipment of the factory or the like in which the exposure apparatus EX is installed.

The suction device 431 of the suction mechanism 403 includes a vacuum system such as a vacuum pump. One end of the suction tube 433 is connected to the suction device 431. The other end of the suction tube 433 is connected to the suction member 430. The suction operation of the suction device 431 is controlled by the controller CONT.

The nozzle member 470 is supported by a first support mechanism 491. The first support mechanism 491 is connected to the lower stepped portion 8 of the main column 9. The main column 9, which supports the nozzle member 470 by the aid of the first support mechanism 91, is separated in view of vibration by the vibration-preventive device 87 from the barrel surface plate 5 which supports the barrel PK of the projection optical system PL by the aid of the flange PF. Therefore, the vibration, which is generated on the nozzle member 470, is prevented from being transmitted to the projection optical system PL. The main column 9 is separated in view of vibration by the vibration-preventive device 89 from the substrate stage surface plate 6 which supports the substrate stage PST. Therefore, the vibration, which is generated on the nozzle member 470, is prevented from being transmitted to the substrate stage PST via the main column 9 and the base BP. Further, the main column 9 is separated in view of vibration by the vibration-preventive device 86 from the mask stage surface plate 2 which supports the mask stage MST. Therefore, the vibration, which is generated on the nozzle member 470, is prevented from being transmitted to the mask stage MST via the main column 9.

The suction member 430 is supported by the second support mechanism 492. The second support mechanism 492 is connected to the lower stepped portion 8 of the main column 9. The main column 9 is separated in view of vibration from the barrel surface plate 5 by the aid of the vibration-preventive device 87. Therefore, the vibration, which is generated on the suction member 430, is prevented from being transmitted to the projection optical system PL. Further, the main column 9 is separated in view of vibration from the substrate stage surface plate 6 by the aid of the vibration-preventive device 89. Therefore, the vibration, which is generated on the suction member 430, is prevented from being transmitted to the substrate stage PST. Further, the main column 9 is separated in view of vibration from the mask stage surface plate 2 by the aid of the vibration-preventive device 86. Therefore, the vibration, which is generated on the suction member 430, is prevented from being transmitted to the mask stage MST.

Figure 16:
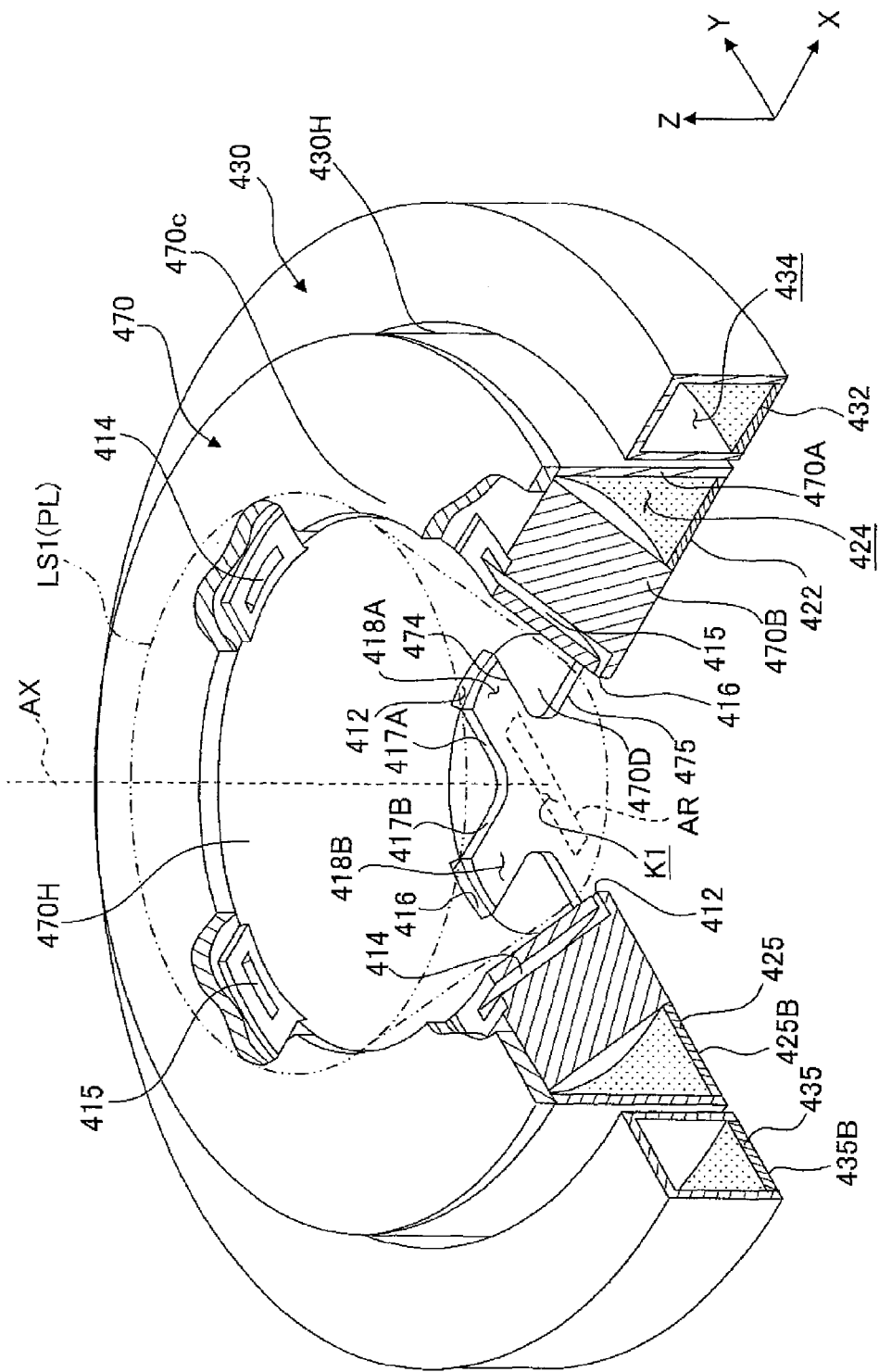
FIG. 16 shows, with partial cutout, a schematic perspective view illustrating magnified main components of the exposure apparatus according to the ninth embodiment.
Figure 17:
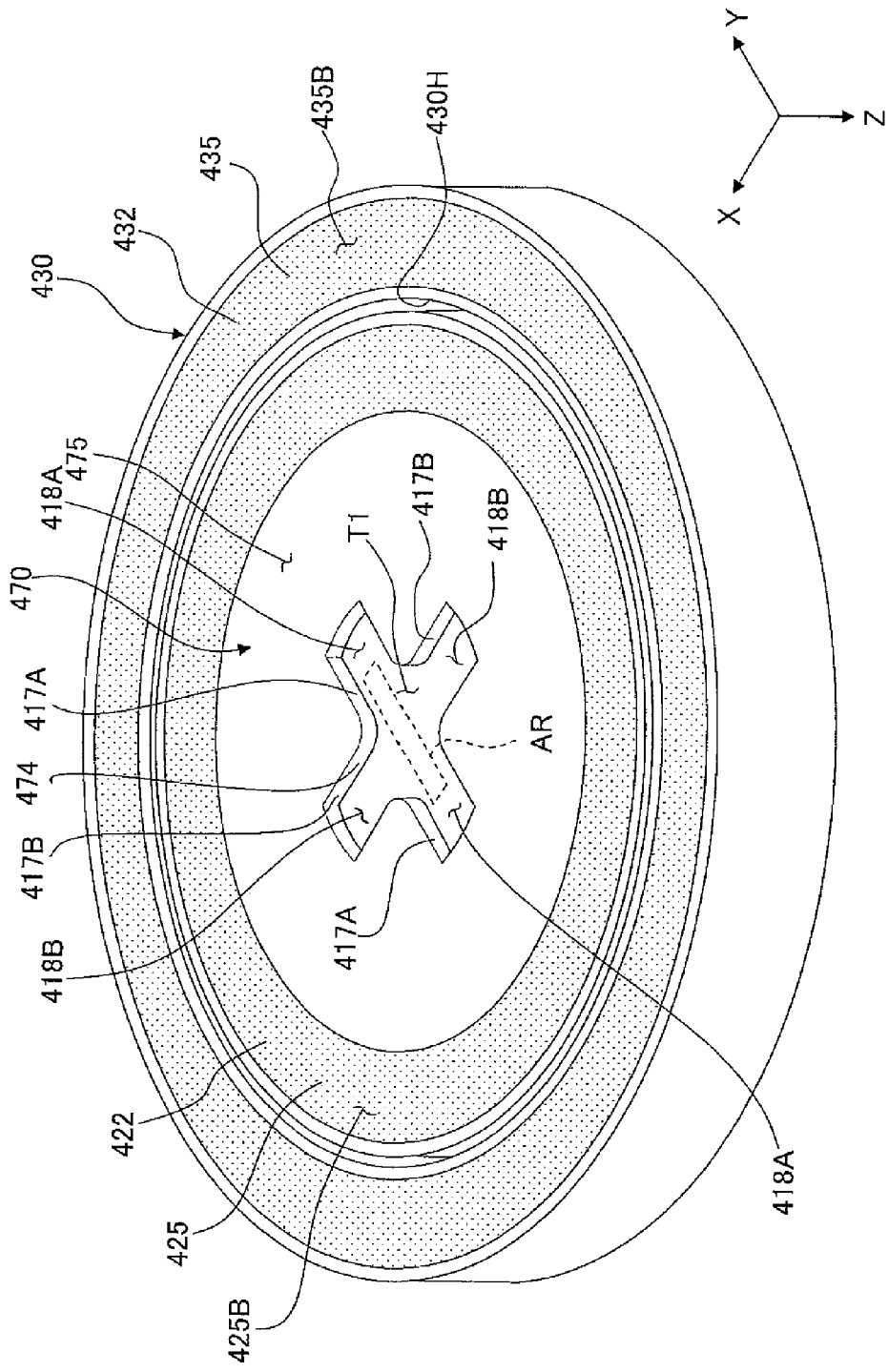
FIG. 17 shows a perspective view illustrating those shown in FIG. 16 as viewed from a lower position.
Figure 18:
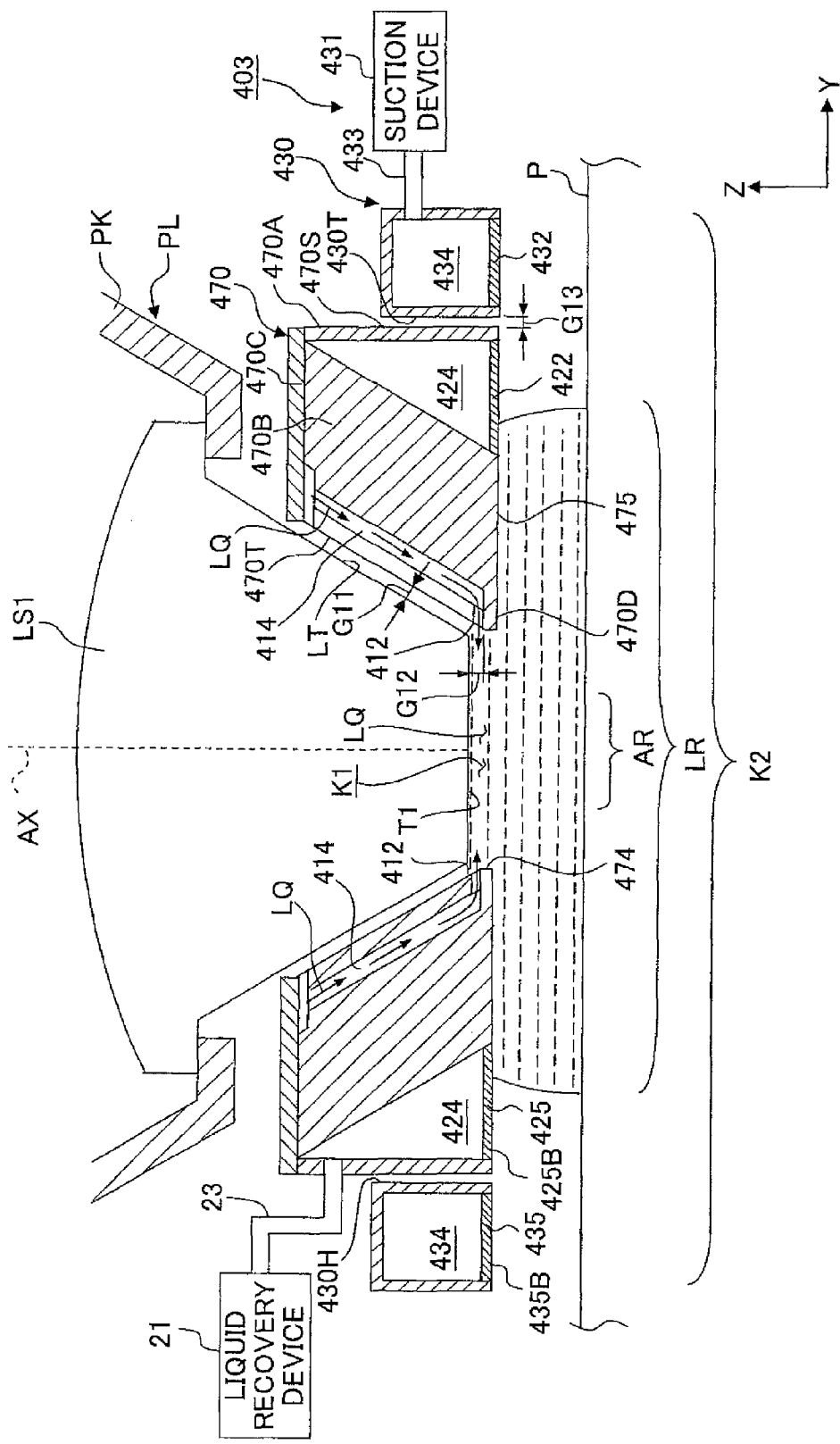
FIG. 18 shows a side sectional view taken in parallel to the YZ plane shown in FIG. 16.
Figure 19:
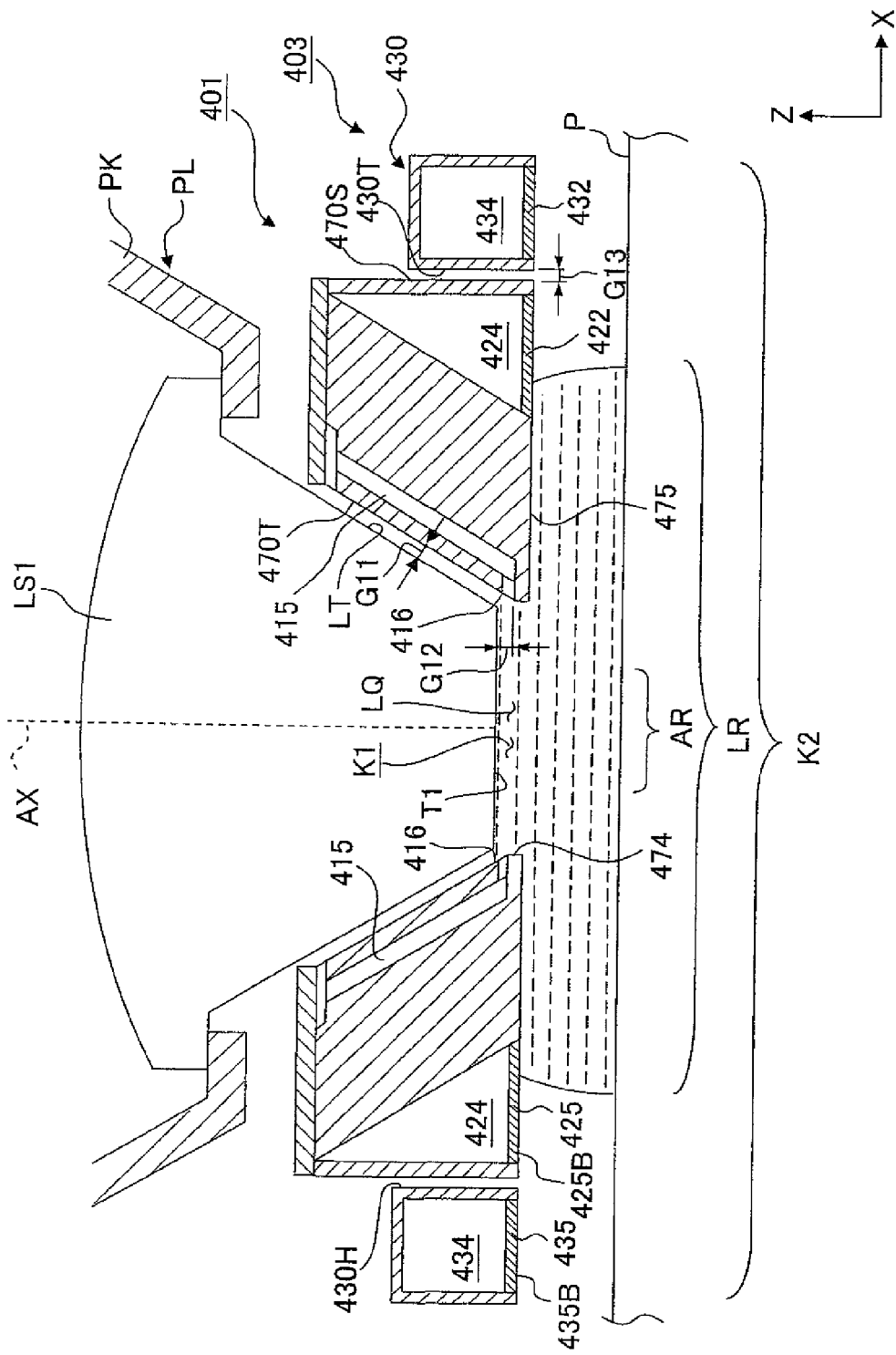
FIG. 19 shows a side sectional view taken in parallel to the XZ plane shown in FIG. 16.

Next, an explanation will be made about the nozzle member 470 and the suction member 430 with reference to FIGS. 16 to 19. FIG. 16 shows, with partial cutout, a schematic perspective view illustrating those in the vicinity of the nozzle member 470 and the suction member 430. FIG. 17 shows a perspective view illustrating the nozzle member 470 and the suction member 430 as viewed from the lower side. FIG. 18 shows a side sectional view taken in parallel to the YZ plane. FIG. 19 shows a side sectional view taken in parallel to the XZ plane.

The nozzle member 470 is provided in the vicinity of the first optical element LS1 which is closest to the image plane of the projection optical system PL. The nozzle member 470 is an annular member provided to surround the first optical element LS1 over or above the substrate P (substrate stage PST). The nozzle member 470 has a hole 470H at its central portion in which the projection optical system PL (first optical element LS1) can be arranged. The nozzle member 470 is constructed by combining a plurality of members. The nozzle member 470 is formed to have a substantially annular shape as viewed in a plan view as a whole. The nozzle member 470 may be formed of one material (for example, titanium). Alternatively, the nozzle member 470 may be formed of, for example, aluminum, titanium, stainless steel, duralumin, or any alloy containing such metals.

A surface treatment may be performed to at least a part of the nozzle member 470 in order to suppress the elution of any impurity to the liquid LQ. Such a surface treatment includes a treatment in which chromium oxide is deposited or adhered to the nozzle member 470. For example, there are exemplified the "GOLDEP" treatment and the "GOLDEP WHITE" treatment available from Kobelco Eco-Solutions Co., Ltd. In this embodiment, the "GOLDEP WHITE" treatment as described above is performed to at least a part of the liquid contact surface of the nozzle member 470 formed of stainless steel to make contact with the liquid LQ.

The nozzle member 470 has a side plate portion 470A, a thick-walled inclined plate portion 470B, a top plate portion 470C which is provided at the upper ends of the side plate portion 470A and the inclined plate portion 470B, and a bottom plate portion 470D which is provided at the lower end of the inclined plate portion 470B. The inclined plate portion 470B is formed to have a mortar-shaped form. The first optical element LS1 is arranged inside the hole 470H formed by the inclined plate portion 470B. The inner side surface 470T of the inclined plate portion 470B (i.e., the inner side surface of the hole 47011 of the nozzle member 470) is opposite to the side surface LT of the first optical element LS1 of the projection optical system PL. A predetermined gap G11 is provided between the inner side surface 470T of the inclined plate portion 470B and the side surface LT of the first optical element LS1. Owing to the provision of the gap G11, the vibration, which is generated on the nozzle member 470, is prevented from being directly transmitted to the projection optical system PL (first optical element LS1). The inner side surface 470T of the inclined plate portion 470B is liquid-repellent (water-repellent) with respect to the liquid LQ. The inflow of the liquid LQ into the gap G11 between the side surface LT of the first optical element LS1 of the projection optical system PL and the inner side surface 470T of the inclined plate portion 470B is suppressed. The liquid-repelling treatment, which is adopted to allow the inner side surface 470T of the inclined portion 470B to be liquid-repellent, includes, for example, treatments for the adhesion with any liquid-repellent material including, for example, a fluorine-based resin material such as polytetrafluoroethylene (Teflon, trade name), an acrylic resin material, and a silicon-based resin material.

A part of the bottom plate portion 470D is arranged between the substrate P (substrate stage PST) and the lower surface T1 of the first optical element LS1 of the projection optical system PL in relation to the Z axis direction. An opening 474, through which the exposure light beam EL passes, is formed at a central portion of the bottom plate portion 470D. The opening 474 is formed to be greater than the projection area AR onto which the exposure light beam EL is irradiated. Accordingly, the exposure light beam EL, which passes through the projection optical system PL, can arrive at the surface of the substrate P without being shielded by the bottom plate portion 470D. In this embodiment, the opening 474 is formed to have a substantially cross-shaped form as viewed in a plan view.

The lower surface 475 of the nozzle member 470, which is opposite to the surface of the substrate P held by the substrate stage PST, is a flat surface parallel to the XY plane. In this embodiment, the lower surface 475 of the nozzle member 470 includes the lower surface of the bottom plate portion 470D and the lower surface of the inclined portion 470B. The lower surface of the bottom plate portion 470D is formed continuously to the lower surface of the inclined portion 470B. In this arrangement, the surface of the substrate P supported by the substrate stage PST is substantially parallel to the XY plane. Therefore, the lower surface 475 of the nozzle member 470 is provided so that the lower surface 475 is opposite to the surface of the substrate P supported by the substrate stage PST, and the lower surface 475 is substantially parallel to the surface of the substrate P. In the following description, the lower surface 475 of the nozzle member 470 is appropriately referred to as "land surface 475".

The distance between the surface of the substrate P and the lower surface T1 of the first optical element LS1 is longer than the distance between the surface of the substrate P and the land surface 475. That is, the lower surface T1 of the first optical element LS1 is formed at the position higher than the land surface 475. The liquid LQ, with which the optical path space K1 is filled, makes contact with the land surface 475. The liquid LQ, with which the optical path space K1 is filled, also makes contact with the lower surface T1 of the first optical element LS1. That is, the land surface 475 of the nozzle member 470 and the lower surface T1 of the first optical element LS1 are the liquid contact surfaces to make contact with the liquid LQ.

The land surface 475 is provided at the position closest to the substrate P supported by the substrate stage PST, in relation to the nozzle member 470. The land surface 475 is provided to surround the projection area AR (optical path for the exposure light beam EL) between the substrate P and the lower surface T1 of the projection optical system PL. The bottom plate portion 470D is provided to make no contact with the lower surface T1 of the first optical element LS1 and the substrate P (substrate stage PST). A space having a predetermined gap G12 is provided between the lower surface T1 of the first optical element LS1 and the upper surface of the bottom plate portion 470D. In the following description, the space, which is inside the nozzle member 470 and which includes the space between the lower surface T1 of the first optical element LS1 and the upper surface of the bottom plate portion 470D, is appropriately referred to as "internal space G12".

The nozzle member 470 is provided with the supply port 412 for supplying the liquid LQ and the recovery port 422 for recovering the liquid LQ. The nozzle member 470 is provided with the supply flow passage 414 connected to the supply port 412 and the recovery flow passage 424 connected to the recovery port 422. Although the illustration is omitted or simplified in FIGS. 16 to 19, the supply flow passage 414 is connected to the other end of the supply tube 13, and the recovery flow passage 424 is connected to the other end of the recovery tube 23.

The supply flow passage 414 is formed by a slit-shaped through-hole which penetrates in the direction of inclination through the inclined plate portion 470B of the nozzle member 470. In this embodiment, the supply flow passages 414 are provided on the both sides in the Y axis direction with respect to the optical path space K1 (projection area AR) respectively. The upper end of the supply flow passage (through-hole) 414 is connected to the other end of the supply tube 13 (not shown in FIGS. 16 to 19). Accordingly, the supply flow passage 414 is connected to the liquid supply device 11 via the supply tube 13. On the other hand, the lower end of the supply flow passage 414 is connected to the internal space G12 between the first optical element LS1 and the bottom plate portion 470D. The lower end of the supply flow passage 414 is the supply port 412. The supply ports 412 are provided at the respective predetermined positions on the both sides in the Y axis direction with the optical path space K1 intervening therebetween at the outside of the optical path space K1 for the exposure light beam EL. The supply port 412 is capable of supplying the liquid LQ to the internal space G12.

The nozzle member 470 is provided with a gas discharge port 416 which discharges the gas contained in the internal space G12 to the external space, and a gas discharge flow passage 415 which is connected to the gas discharge port 416. The gas discharge flow passage 415 is formed by a slit-shaped through-hole which penetrates in the inclined direction through the inclined plate portion 470B of the nozzle member 470. In this embodiment, the gas discharge flow passages 415 are provided on the both sides in the X axis direction with respect to the optical path space K1 (projection area AR) respectively. A gap is formed between the top plate portion 470C and a predetermined area at which the upper end of the gas discharge flow passage (through-hole) 415 is formed, of the upper surface of the inclined plate portion 470B. In this state, the upper end of the gas discharge flow passage 415 is open to the atmospheric air. On the other hand, the lower end of the gas discharge flow passage 415 is connected to the internal space G12 between the first optical element LS1 and the bottom plate portion 470D. The lower end of the gas discharge flow passage 415 is the gas discharge port 416. The gas discharge ports 415 are provided at the respective predetermined positions on the both sides in the X axis direction with the optical path space K1 intervening therebetween at the outside of the optical path space K1 for the exposure light beam EL. The gas discharge port 416 is connected to the gas contained in the internal space G12, i.e., the gas around the image plane of the projection optical system PL. Therefore, the gas in the internal space G12 can be discharged (evacuated) to the external space via the gas discharge port 416 from the upper end of the gas discharge flow passage 415. The upper end of the gas discharge flow passage 415 may be connected to a suction device such as a vacuum pump to forcibly discharge the gas contained in the internal space G12.

The bottom plate portion 470D functions as a guide member for guiding the flow of the liquid LQ supplied from the supply port 412. The bottom plate portion 470D guides the flow so that the liquid LQ, which is supplied from the supply port 412, flows toward the position at which the gas discharge port 416 is provided or the vicinity thereof. As shown in FIGS. 16 and 17, the bottom plate portion 470D has a first guide portion 417A which forms the flow directed from the position of provision of the supply port 412 to the optical path space K1 for the exposure light beam EL (projection area AR), and a second guide portion 417B which forms the flow directed from the optical path space K1 for the exposure light beam EL to the position of provision of the gas discharge port 416. That is, a flow passage 418A, through which the liquid LQ flows from the supply port 412 toward the optical path space K1 for the exposure light beam EL, is formed by the first guide portion 417A, and a flow passage 418B, through which the liquid LQ flows from the optical path space K1 for the exposure light beam EL toward the gas discharge port 416, is formed by the second guide portion 417B.

The flow passage 418A, which is formed by the first guide portion 417A, intersects the flow passage 418B which is formed by the second guide portion 417B. The flow passage 418A, which is formed by the first guide portion 417A, allows the liquid LQ to flow substantially in the Y axis direction. The flow passage 418B, which is formed by the second guide portion 417B, allows the liquid LQ to flow substantially in the X axis direction. The opening 474, which has the substantially cross-shaped form as viewed in a plan view, is formed by the first guide portion 417A and the second guide portion 417B. In this arrangement, the exposure light beam EL passes through an approximately central portion of the opening 474 formed to have the substantially cross-shaped form. That is, the optical path space K1 for the exposure light beam EL is defined at the intersecting portion between the flow passage 418A formed by the first guide portion 417A and the flow passage 418B formed by the second guide portion 417B. In this embodiment, the flow passage 418A, which is formed by the first guide portion 417A, is substantially perpendicular to the flow passage 418B which is formed by the second guide portion 417B.

The nozzle member 470 has, in its interior, a space 424 which is open downwardly between the side plate portion 470A and the inclined plate portion 470B. The recovery port 422 corresponds to the opening of the space 424. The space 424 functions as a recovery flow passage. The other end of the recovery tube 23 is connected to a part of the recovery flow passage (space) 424.

The recovery port 422 is provided at the position opposite to the surface of the substrate P over or above the substrate P held by the substrate stage PST. The surface of the substrate P is separated by a predetermined distance from the recovery port 422. The recovery port 422 is provided outside the supply port 412 with respect to the optical path space K1 in the vicinity of the image plane of the projection optical system PL. The recovery port 422 is formed annularly to surround the optical path space K1 (projection area AR), the land surface 475, and the supply port 412. That is, the supply port 412 for supplying the liquid LQ is provided inside the recovery port 422 with respect to the optical path space K1. In this embodiment, the recovery port 422 is formed to have an annular shape as viewed in a plan view.

The nozzle member 470 is provided with a porous member 425 which has a plurality of holes and which is arranged to cover the recovery port 422. The liquid LQ is recovered via a plurality of holes of the porous member 425. In this embodiment, the porous member 425 is a mesh member having a plurality of holes. Those usable as the porous member 425 also include, for example, a mesh member formed with a honeycomb pattern composed of a plurality of substantially hexagonal holes. The porous member 425 can be formed by performing the punching processing to a plate member to serve as a base material for the porous member composed of, for example, stainless steel (for example SUS 316) or titanium. A plurality of thin plate-shaped porous members 425 may be arranged in an overlapped manner at the recovery port 422.

In this embodiment, the porous member 425 is liquid-attractive (water-attractive or hydrophilic) with respect to the liquid LQ. The liquid-attracting treatment (surface treatment) for allowing the porous member 425 to be liquid-attractive includes a treatment in which chromium oxide is deposited or adhered to the porous member 425. Specifically, there are exemplified the "GOLDEP" treatment and the "GOLDEP WHITE" treatment as described above. When the surface treatment is performed as described above, the elution of any impurity from the porous member 425 to the liquid LQ is suppressed. In this embodiment, the porous member 425 is formed to have a thin plate-shaped form, which has a thickness of, for example, about 100 μm. The porous member 425 can be also composed of, for example, a porous member made of ceramics. Of course, the porous member 425 may be formed of a liquid-attractive material.

The porous member 425 has the lower surface 425B opposite to the substrate P supported by the substrate stage PST. The lower surface 425B of the porous member 425, which is opposite to the substrate P, is substantially flat. The porous member 425 is provided at the recovery port 422 so that the lower surface 425B is substantially parallel to the surface of the substrate P (i.e., the XY plane) supported by the substrate stage PST. The liquid LQ is recovered via the porous member 425 arranged at the recovery port 422. The recovery port 422 is formed annularly to surround the optical path space K1. Therefore, the porous member 425, which is arranged at the recovery port 422, is formed annularly to surround the optical path space K1.

The land surface 475 and the lower end of the side plate portion 470A are provided at approximately the same position (height) in the Z axis direction. The porous member 425 is provided at the recovery port 422 so that the lower surface 425B and the land surface 475 are at approximately the same height, and the lower surface 425B and the land surface 475 are continued to one another. That is, the land surface 475 is formed continuously to the lower surface 425B of the porous member 425.

Next, the suction mechanism 403 will be explained. The suction member 430 of the suction mechanism 403 is the member distinct from the nozzle member 470, which is provided in the vicinity of the nozzle member 470. The suction member 430 is the annular member which is provided to surround the optical path space K1 and the nozzle member 470 over or above the substrate P (substrate stage PST). The suction member 430 has a hole 430H which is disposed at a central portion thereof and in which the nozzle member 470 can be arranged. The suction member 430 can be formed of, for example, aluminum, titanium, stainless steel, duralumin, or any alloy containing such metals. The "GOLDEP" treatment or the "GOLDEP WHITE" treatment may be performed to the suction member 430.

The inner side surface 430T of the hole 430H of the suction member 430 is opposite to the side surface 470S of the side plate portion 470A of the nozzle member 470. A predetermined gap G13 is provided between the inner side surface 430T of the suction member 430 and the side surface 470S of the nozzle member 470. Owing to the provision of the gap G13, the vibration, which is generated on one of the nozzle member 470 and the suction member 430, is prevented from being directly transmitted to the other. At least one of the inner side surface 430T of the suction member 430 and the side surface 470S of the nozzle member 470 is liquid-repellent (water-repellent) with respect to the liquid LQ. The inflow of the liquid LQ into the gap G3 between the inner side surface 430T of the suction member 430 and the side surface 470S of the nozzle member 470 is suppressed. The liquid-repelling treatment, which is adopted to allow the inner side surface 430T of the suction member 430 and the side surface 470S of the nozzle member 470 to be liquid-repellent, includes, for example, treatments for the adhesion with any liquid-repellent material including, for example, a fluorine-based resin material such as polytetrafluoroethylene (Teflon, trade name), an acrylic resin material, and a silicon-based resin material.

The suction member 430 is provided with the suction port 432 which sucks only the gas, and the suction flow passage which is connected to the suction port 432. The suction member 430 has the space 434 which is open downwardly. The suction port 432 corresponds to the opening of the space 434. The space 434 functions as the suction flow passage. Although not shown or simply shown in FIGS. 16 to 19, the other end of the suction tube 433 is connected to a part of the suction flow passage (space) 434.

The suction port 432 is provided at the position opposite to the surface of the substrate P over or above the substrate P supported by the substrate stage PST. The suction port 432 is separated from the surface of the substrate P by a predetermined distance. The suction port 432 is provided outside the recovery port 422 provided for the nozzle member 470 with respect to the optical path space K1 in the vicinity of the image plane of the projection optical system PL. The suction port 432 is formed to have the annular shape to surround the optical path space K1 (projection area AR) and the recovery port 422 of the nozzle member 470. In this embodiment, the suction port 432 is formed to have the annular form as viewed in a plan view.

The suction member 430 is provided with a porous member 435 which is arranged to cover the suction port 432 and which has a plurality of holes. The gas is sucked (discharged) via the plurality of holes of the porous member 435. The porous member 435, which is arranged at the suction port 432, can be composed of, for example, a mesh member having a plurality of holes or a porous member made of ceramics, in the same manner as the porous member 425 arranged at the recovery port 422.

The porous member 435, which is arranged at the suction port 432, is liquid-repellent (water-repellent) with respect to the liquid LQ. The liquid-repelling treatment (surface treatment), which is adopted to allow the porous member 435 to be liquid-repellent, includes, for example, treatments for the adhesion with any liquid-repellent material including, for example, a fluorine-based resin material such as polytetrafluoroethylene (Teflon, trade name), an acrylic resin material, and a silicon-based resin material. The porous member 435 itself may be formed of the liquid-repellent material as described above. For example, the porous member 435 may be formed of polytetrafluoroethylene (Teflon, trade name).

The porous member 435 has the lower surface 43513 which is opposite to the substrate P supported by the substrate stage PST. The lower surface 435B of the porous member 435, which is opposite to the substrate P, is substantially flat. The porous member 435 is provided at the suction port 432 so that the lower surface 435B thereof is substantially parallel to the surface of the substrate P (i.e., the XY plane) supported by the substrate stage PST. The suction port 432 is formed annularly to surround the optical path space K1. Therefore, the porous member 435, which is arranged at the suction port 432, is formed annularly to surround the optical path space K1.

The recovery port 422 of the nozzle member 470 and the suction port 432 of the suction member 430 are provided at approximately the same height position with respect to the substrate P respectively. That is, the recovery port 422 and the suction port 432 are provided at approximately the same position (height) in the Z axis direction. The lower surface 425B of the porous member 425 arranged at the recovery port 422 and the lower surface 435B of the porous member 435 arranged at the suction port 432 are provided at approximately the same position with respect to the substrate P. More specifically, the land surface 475 of the nozzle member 470, the lower surface 425B of the porous member 425, the lower end surface of the side plate portion 470A, the lower end surface of the suction member 430, and the lower surface 435B of the porous member 435 are provided at approximately the same position (height) in the Z axis direction respectively, and they are substantially flush with each other.

Next, an explanation will be made about a method for exposing the substrate P with the pattern image of the mask M by using the exposure apparatus EX constructed as described above.

In order to fill the optical path space K1 for the exposure light beam EL with the liquid LQ, the controller CONT drives the liquid supply device 11 and the liquid recovery device 21 respectively. The liquid LQ, which is fed from the liquid supply device 11 under the control of the controller CONT, flows through the supply tube 13, and then the liquid LQ is supplied from the supply ports 412 via the supply flow passages 414 of the nozzle member 470 to the internal space G12 between the bottom plate portion 470D and the first optical element LS1 of the projection optical system PL. When the liquid LQ is supplied to the internal space G12, the gas portion, which has been present in the internal space G12, is discharged to the outside via the gas discharge ports 416 and/or the opening 474. Therefore, it is possible to avoid the inconvenience which would be otherwise caused such that the gas remains or stays in the internal space G12 upon the start of the supply of the liquid LQ to the internal space G12. It is possible to avoid the inconvenience which would be otherwise caused such that any gas portion (bubble) is formed in the liquid LQ in the optical path space K1.

The liquid LQ, which is supplied to the internal space G12, fills the internal space G12 therewith, and then the liquid LQ flows into the space between the land surface 475 and the substrate P (substrate stage PST) via the opening 474 to fill the optical path space K1 therewith. In this situation, the liquid recovery device 21, which is driven under the control of the controller CONT, recovers a predetermined amount of the liquid LQ per unit time. The liquid LQ, which is between the land surface 475 and the substrate P, flows into the recovery flow passage 424 via the recovery port 422 of the nozzle member 470. The liquid LQ flows through the recovery tube 23, and then the liquid LQ is recovered by the liquid recovery device 21.

In this arrangement, the liquid LQ, which is supplied from the supply port 412 to the internal space G12, flows toward the optical path space K1 (projection area AR) for the exposure light beam EL while being guided by the first guide portion 417A, and then the liquid LQ flows toward the outside of the optical path space K1 for the exposure light beam EL while being guided by the second guide portion 417B. Therefore, even if any gas portion (bubble) is generated in the liquid LQ, the bubble can be discharged to the outside of the optical path space K1 for the exposure light beam EL by means of the flow of the liquid LQ. In this embodiment, the bottom plate portion 470D allows the liquid LQ to flow toward the gas discharge port 416. Therefore, the gas portion (bubble), which is present in the liquid LQ, is smoothly discharged to the external space via the gas discharge port 416.

The liquid immersion mechanism 401 allows the liquid LQ to flow while being guided by the first and second guide portions 417A, 417B of the bottom plate portion 470D. Accordingly, the formation of any vortex flow is suppressed in the optical path space K1 for the exposure light beam EL. Accordingly, even when any gas portion (bubble) is present in the optical path space K1 for the exposure light beam EL, then the gas portion (bubble) can be discharged to the outside of the optical path space K1 for the exposure light beam EL by means of the flow of the liquid LQ, and it is possible to prevent the gas portion (bubble) from staying in the optical path space K1 for the exposure light beam EL.

As described above, the controller CONT uses the liquid immersion mechanism 401 so that the predetermined amount of the liquid LQ is supplied to the optical path space K1, and the predetermined amount of the liquid LQ on the substrate P is recovered. Accordingly, the optical path space K1, which is between the projection optical system PL and the substrate P, is filled with the liquid LQ to locally form the liquid immersion area LR of the liquid LQ on the substrate P. The controller CONT projects the pattern image of the mask M onto the substrate P via the projection optical system PL and the liquid LQ of the optical path space K1 while relatively moving the projection optical system PL and the substrate P in the state in which the optical path space K1 is filled with the liquid LQ.

When the liquid immersion area LR is formed on the image plane side of the projection optical system PL, the controller CONT drives the suction device 431 of the suction mechanism 403. The controller CONT also continues the suction (gas-aspirating) operation of the suction port 432 during the exposure for the substrate P. That is, the controller CONT continues the driving of the suction device 431 of the suction mechanism 403 during the period in which the supply operation and the recovery operation of the liquid LQ are performed for the optical path space K1 by using the liquid immersion mechanism 401 in order to perform the liquid immersion exposure for the substrate P. The suction amount of the gas to be sucked per unit time by the suction device 43 may be always constant. Alternatively, the suction amount may be changed depending on, for example, the operation (for example, the scanning velocity, the movement direction, and the movement distance in one direction) of the substrate P (substrate stage PST).

Figure 20:
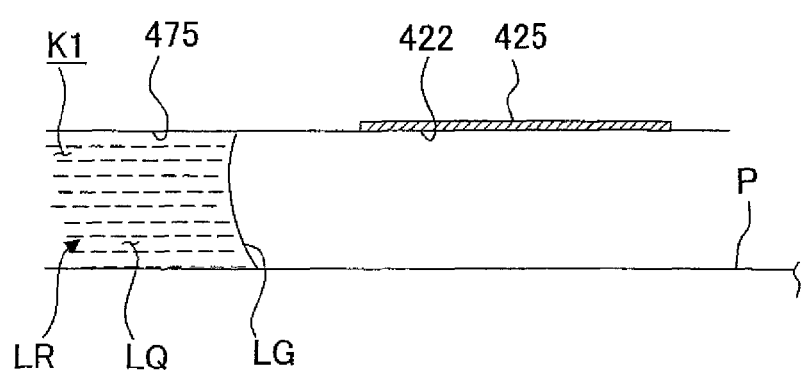
FIGS. 20A and 20B schematically illustrate the behavior of the liquid in accordance with the movement of the substrate.
Figure 20:
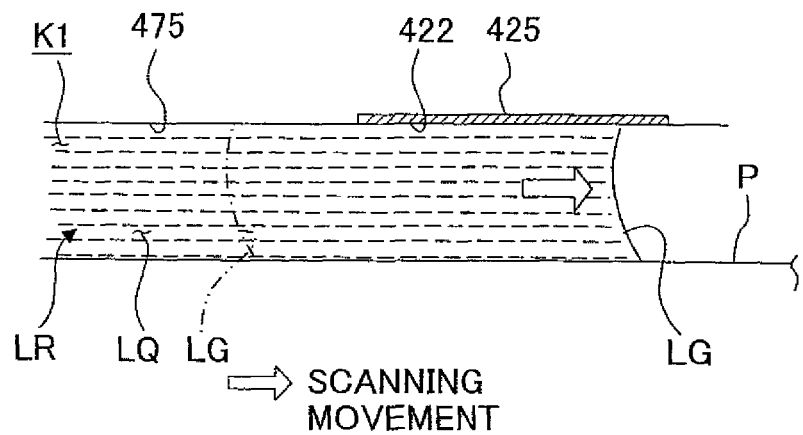
Figure 20:
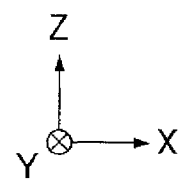

As described above, the exposure apparatus EX of this embodiment is the scanning type exposure apparatus which performs the exposure while relatively moving the projection optical system PL and the substrate P. Specifically, the exposure apparatus EX projects the image of the pattern of the mask M onto the substrate P while moving the mask M and the substrate P in the X axis direction (scanning direction) with respect to the projection optical system PL. Such a scanning type exposure apparatus involves the following possibility. That is, for example, when the scanning velocity (scanning speed) is increased to be high, then the liquid LQ cannot be recovered sufficiently by means of the recovery port 422, and the liquid LQ may leak to the outside of the recovery port 422 with respect to the optical path space K1. For example, it is assumed that the substrate P is subjected to the scanning movement in the +X direction by a predetermined distance at a predetermined velocity with respect to the liquid immersion area LR from the first state schematically shown in FIG. 20A, and the second state during the scanning movement is provided as shown in FIG. 20B. On this assumption, when the scanning velocity of the substrate P is increased to be high, the following possibility may arise. That is, the interface LG, which is between the liquid LQ of the liquid immersion area LR and the space at the outside thereof, may have a large movement velocity, and/or the shape of the interface LG may be greatly changed. As a result, the liquid LQ may leak to the outside of the recovery port 422.

In this embodiment, when the liquid immersion area LR is formed, the gas suction (gas-aspirating) operation is performed via the suction port 432 to thereby generate the flow of the gas in the predetermined direction in the vicinity of the outer side of the recovery port 422 (in the vicinity of the liquid LQ with which the optical path space K1 is filled). The generated flow of the gas is used to prevent the liquid LQ from leaking and any enormous expansion of the liquid immersion area LR.

Figure 21:
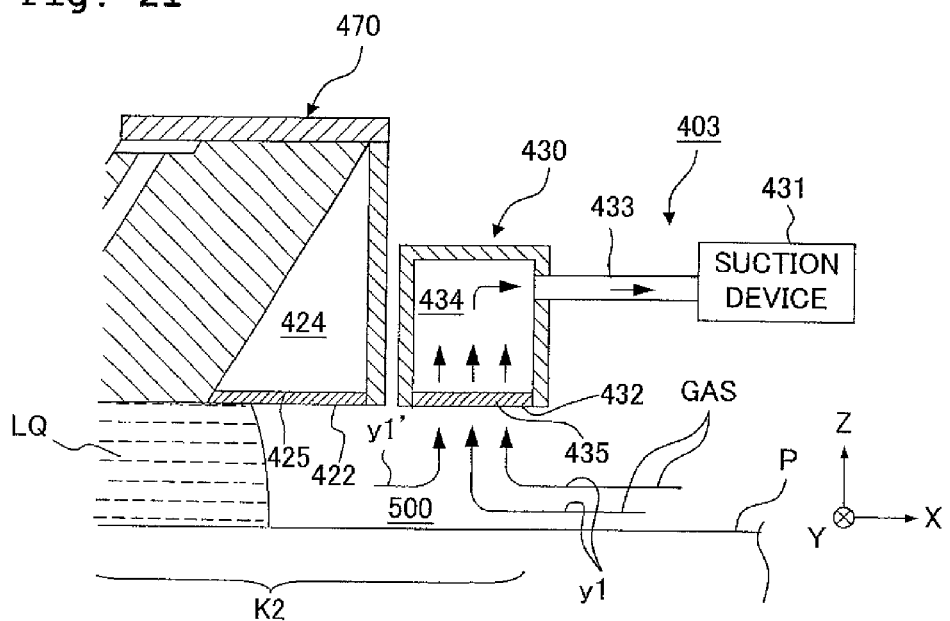
FIG. 21 schematically shows magnified main components to illustrate the operation of the exposure apparatus according to the ninth embodiment.

FIG. 21 schematically shows magnified main components to illustrate the operation of the suction mechanism 403. As shown in FIG. 21, the controller CONT drives the suction device 431 including the vacuum system to suck the gas via the suction port 432 provided at the outside of the recovery port 422 with respect to the optical path space K1. Accordingly, the flow of the gas, which is directed toward the optical path space K1, is generated outside the recovery port 422 (see the arrows y1 shown in FIG. 21).

Specifically, when the suction device 431 including the vacuum system is driven, the gas, which is contained in the space (suction flow passage) 434 provided for the suction member 430, is sucked by the suction device 431 via the suction tube 433, and the space 434 is allowed to have the negative pressure. That is, the controller CONT provides the negative pressure space of the space 434 on the upper side of the porous member 435 arranged at the suction port 432 by driving the suction device 431. When the predetermined negative pressure space is formed on the upper side of the porous member 435, the gas, which is included in the gas contained in the atmospheric space 500 on the lower side of the porous member 435 and which exits in the vicinity of the suction port 432 (just under the suction port 432), is sucked into the space (negative pressure space) 434 via the suction port 432 at which the porous member 435 is arranged. Accordingly, the flow y1 of the gas, which is directed from the outside of the suction port 432 to the suction port 432 with respect to the optical path space K1, is generated in the atmospheric space 500. In the state shown in FIG. 21, the flow of the gas, which is directed from the inside of the suction port 432 to the suction port 432 with respect to the optical path space K1, is also generated (see the arrow y1' shown in FIG. 21). However, the flow rate (flow velocity) of the flow y1' is smaller than that of the flow y1 of the gas directed from the outside of the suction port 432 to the optical path space K1 with respect to the optical path space K1. Therefore, the flow of the gas, which is directed toward the optical path space K1, can be generated in the vicinity of the outer side of the recovery port 422 by sucking the gas via the suction port 432.

When the flow of the gas, which is directed toward the optical path space K1, is generated, the gas is supplied to the interface LG of the liquid LQ with which the optical path space K1 is filled. Accordingly, even when the liquid LQ (interface LG of the liquid LQ), with which the optical path space K1 is filled, intends to move toward the outside of the optical path space K1, it is possible to prevent the liquid LQ from leaking to the outside of the predetermined space K2 by means of the force of the gas. The predetermined space K2 herein includes the space inside the suction port 432 with respect to the optical path space K1.

Figure 22:
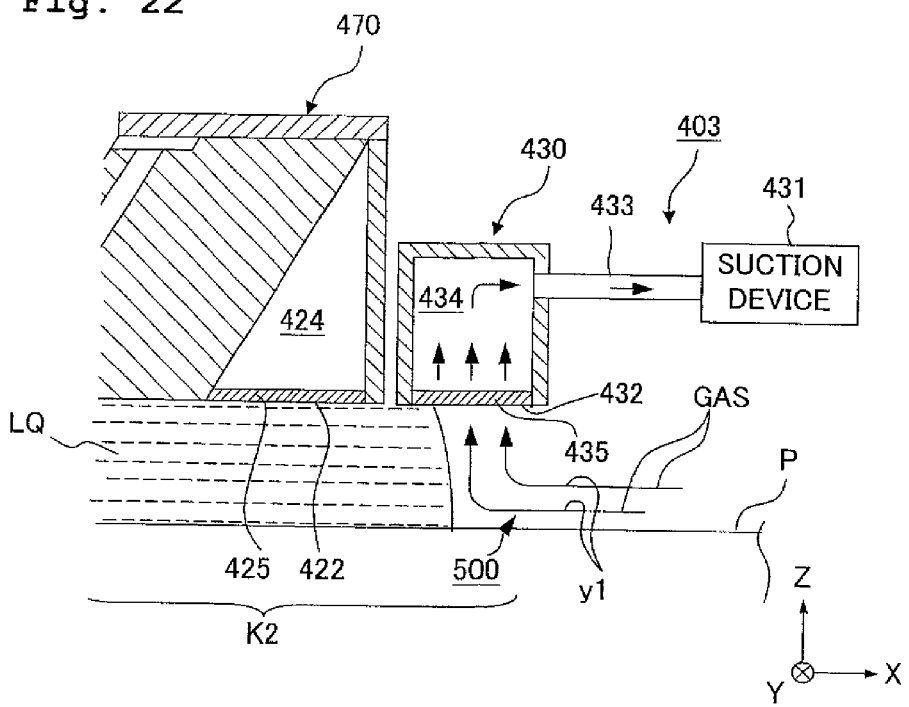
FIG. 22 schematically shows magnified main components to illustrate the operation of the exposure apparatus according to the ninth embodiment.

As shown in FIG. 22, there is such a possibility that the liquid LQ, with which the optical path space K1 is filled, may make contact with the porous member 435 provided for the suction port 432. However, in this embodiment, the suction mechanism 403 sucks only the gas without allowing the liquid LQ to inflow from the atmospheric space 500 on the lower side of the porous member 435 by forming the negative pressure space having the predetermined pressure on the upper side of the porous member 435. Therefore, the suction mechanism 403 can satisfactorily generate the flow of the gas directed toward the optical path space K1 in the atmospheric space 500 on the lower side of the porous member 435 while suppressing the vibration.

Figure 23:
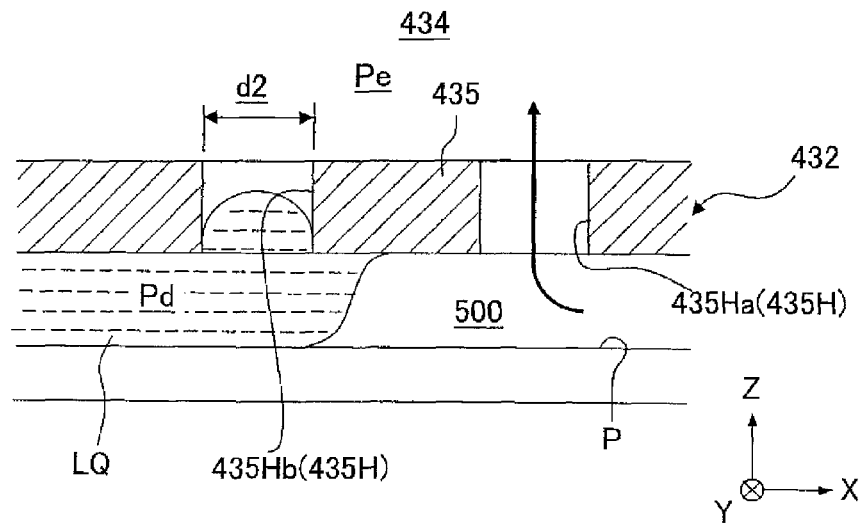
FIG. 23 illustrates the principle of the operation for sucking the gas by a suction mechanism.

An explanation will be made about the principle of the gas suction operation performed by the suction mechanism 403 in this embodiment with reference to FIG. 23. FIG. 23 shows a sectional view illustrating magnified parts of the porous member 435 to schematically illustrate the gas suction operation performed by the aid of the porous member 435.

With reference to FIG. 23, the porous member 435 is provided for the recovery port 432. The substrate P is provided under the porous member 435. The gas space and the liquid space are formed between the porous member 435 and the substrate P. More specifically, the gas space is formed between a first hole 435Ha of the porous member 435 and the substrate P, and the liquid space is formed between a second hole 435Hb of the porous member 435 and the substrate P. The recovery flow passage (flow passage space) 434 is formed over or above the porous member 435.

The pressure of the flow passage space (gas space) 434 is defined for the liquid immersion mechanism 403 of the embodiment of the present invention so that the following condition is satisfied:

$$(4 \times \gamma \times \cos \theta)/d2 < (Pe - Pd) \quad (3)$$

wherein Pd represents the pressure of the liquid space between the substrate P and the second hole 435Hb of the porous member 435 (pressure on the lower surface of the porous member 435), Pe represents the pressure in the flow passage space (gas space) 434 over or above the porous member 435 (pressure on the upper surface of the porous member 435), d2 represents the pore size (diameter) of the holes 435Ha, 435Hb, θ represents the contact angle of the porous member 435 (inner side surface of the hole 435H) with respect to the liquid LQ, and γ represents the surface tension of the liquid LQ.

In this case, it is necessary that the contact angle θ between the liquid LQ and the porous member 435 (inner side surface of the pore 435H) satisfies the following condition.

$$\theta > 90° \quad (4)$$

If the foregoing condition holds, even when the liquid space is formed on the lower side of the second hole 435Hb of the porous member 435 (on the side of the substrate P), then the liquid LQ contained in the liquid space on the lower side of the porous member 435 is prevented from any movement (inflow) into the flow passage space 434 on the upper side of the porous member 435 via the second hole 435Hb. That is, when the pore size d2 of the porous member 435, the contact angle (affinity) θ of the porous member 435 with respect to the liquid LQ, the surface tension γ of the liquid LQ, and the pressures Pd, Pe are optimized so that the foregoing condition is satisfied, then the interface between the liquid LQ and the gas can be maintained at the inside of the second hole 435Hb of the porous member 435, and it is possible to suppress the inflow of the liquid LQ from the liquid space into the flow passage space 434 via the second hole 435Hb. On the other hand, the gas space is formed on the lower side of the first hole 435Ha of the porous member 435 (on the side of the substrate P). Therefore, it is possible to suck only the gas by the aid of the first hole 435Hb.

In this embodiment, the pressure Pd of the liquid space on the lower side of the porous member 435, the pore size d2, the contact angle θ of the porous member 435 (inner side surface of the hole 435H) with respect to the liquid LQ, and the surface tension γ of the liquid (pure water) LQ are substantially constant. The suction mechanism 403 adjusts the pressure Pe of the flow passage space 434 on the upper side of the porous member 435 so that the foregoing condition is satisfied by controlling the suction force of the suction device 431.

In the expression (3), the greater the absolute value of (Pe−Pd) is, i.e., the greater the absolute value of ((4×γ×cos θ)/d2) is, the more easily the pressure Pe to satisfy the foregoing condition is controlled. Therefore, it is desirable that the pore size d2 is decreased to be as small as possible, and the contact angle θ of the porous member 435 with respect to the liquid LQ is increased to be as large as possible. In the embodiment of the present invention, the porous member 435 is liquid-repellent with respect to the liquid LQ, which has the sufficiently large contact angle θ.

As described above, in this embodiment, the difference in pressure between the space on the upper side of the porous member 435 and the liquid space on the lower side (difference in pressure between the upper surface and the lower surface of the porous member 435) is controlled to satisfy the foregoing condition. Accordingly, only the gas is sucked from the hole 435H of the porous member 435. Accordingly, it is possible to satisfactorily generate the flow of the gas directed toward the optical path space K1 in the space 500 (gas space) on the lower side of the porous member 435. Further, it is possible to suppress the occurrence of the vibration which would be otherwise caused such that the liquid LQ and the gas are sucked together.

In this embodiment, the liquid immersion mechanism 401 recovers only the liquid LQ from the recovery port 422. Therefore, the liquid immersion mechanism 401 can satisfactorily recover the liquid LQ without allowing the gas to flow into the space 24 via the recovery port 422.

Figure 24:
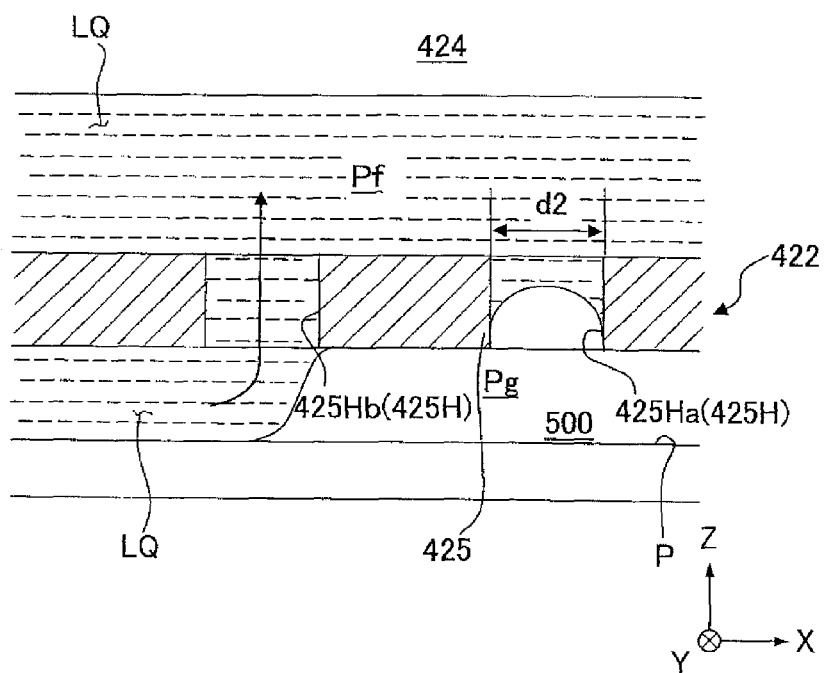
FIG. 24 explains the principle of the operation for recovering the liquid by a liquid immersion mechanism.

An explanation will be made below with reference to FIG. 24 about the principle of the liquid recovery operation effected by the liquid immersion mechanism 401 in this embodiment. FIG. 24 shows, with magnification, a sectional view illustrating a part of the porous member 425, which schematically explains the liquid recovery operation performed by the aid of the porous member 425.

With reference to FIG. 24, the porous member 425 is provided for the recovery port 422. The substrate P is provided under or below the porous member 425. The gas space and the liquid space are formed between the porous member 425 and the substrate P. More specifically, the gas space is formed between a first hole 425Ha of the porous member 425 and the substrate P, and the liquid space is formed between a second hole 425Hb of the porous member 425 and the substrate P. The recovery flow passage (flow passage space) 424 is formed over or above the porous member 425.

The liquid immersion mechanism 401 of the embodiment of the present invention is designed so that the following condition is satisfied:

$$(4 \times \gamma \times \cos \theta)/d2 \geq (Pg - Pf) \quad (5)$$

wherein Pg represents the pressure in the gas space between the substrate P and the first hole 425Ha of the porous member 425 (pressure on the lower surface of the porous member 425H), Pf represents the pressure in the flow passage space 424 over or above the porous member 425 (pressure on the upper surface of the porous member 425), d2 represents the pore size (diameter) of the holes 425Ha, 425Hb, θ represents the contact angle of the porous member 425 (inner side surface of the hole 425H) with respect to the liquid LQ, and γ represents the surface tension of the liquid LQ. In the expression (5) described above, the hydrostatic pressure of the liquid LQ over or above the porous member 425 is not considered in order to simplify the explanation.

In this case, the contact angle θ between the liquid LQ and the porous member 425 (inner side surface of the pore 425H) satisfies the following condition.

$\theta \leq 90°$                    (6)

If the foregoing condition holds, even when the gas space is formed on the lower side of the first hole 425Ha of the porous member 425 (on the side of the substrate P), then the gas contained in the gas space on the lower side of the porous member 425 is prevented from any movement (inflow) into the flow passage space 424 on the upper side of the porous member 425 via the hole 425Ha. That is, when the pore size d2 of the porous member 425, the contact angle (affinity) $\theta$ of the porous member 425 with respect to the liquid LQ, the surface tension $\gamma$ of the liquid LQ, and the pressures Pg, Pf are optimized so that the foregoing condition is satisfied, then the interface between the liquid LQ and the gas can be maintained at the inside of the first hole 425Ha of the porous member 425, and it is possible to suppress the inflow of the gas from the space 500 into the flow passage space 424 via the first hole 425Ha. On the other hand, the liquid space is formed on the lower side of the second hole 425Hb of the porous member 425 (on the side of the substrate P). Therefore, it is possible to recover only the liquid LQ by the aid of the second hole 425Hb.

In this embodiment, the pressure Pg of the gas space on the lower side of the porous member 425, the pore size d2, the contact angle $\theta$ of the porous member 425 (inner side surface of the hole 425H) with respect to the liquid LQ, and the surface tension $\gamma$ of the liquid (pure water) LQ are substantially constant. The liquid immersion mechanism 401 adjusts the pressure Pf of the flow passage space 424 on the upper side of the porous member 425 so that the foregoing condition is satisfied by controlling the suction force of the liquid recovery device 21.

In the expression (5), the greater (Pg−Pf) is, i.e., the greater $((4 \times \gamma \times \cos \theta)/d2)$ is, the more easily the pressure Pf to satisfy the foregoing condition is controlled. Therefore, it is desirable that the pore size d2 is decreased to be as small as possible, and the contact angle $\theta$ of the porous member 425 with respect to the liquid LQ is decreased to be as small as possible. In the embodiment of the present invention, the porous member 425 is liquid-attractive with respect to the liquid LQ, which has the sufficiently small contact angle $\theta$.

As described above, in the embodiment of the present invention, the difference in pressure between the space 424 over or above the porous member 425 and the gas space under or below the porous member 425 (difference in pressure between the upper surface and the lower surface of the porous member 425) is controlled to satisfy the foregoing condition in the state in which the porous member 425 is wet. Accordingly, only the liquid LQ is recovered from the hole 425H of the porous member 425. Thus, it is possible to suppress the occurrence of the vibration which would be otherwise caused such that the liquid LQ and the gas are sucked together.

As explained above, the suction port 432, which sucks only the gas, is provided outside the recovery port 422 with respect to the optical path space K1, and the gas is sucked from the suction port 432. Accordingly, it is possible to generate the flow of the gas so that the liquid LQ, with which the optical path space K1 is filled, is prevented from any leakage to the outside of the predetermined space K2 including the optical path space K1. That is, the suction mechanism functions as the seal mechanism to confine the liquid LQ. Even when the projection optical system PL and the substrate P are relatively moved in the state in which the optical path space K1 is filled with the liquid LQ, it is possible to prevent the liquid LQ from leaking with which the optical path space K1 is filled. When the flow of the gas, which is directed toward the optical path space K1, is generated, then the interface LG between the liquid LQ and the space disposed outside is prevented from being formed outside the recovery port 422 with respect to the optical path for the exposure light beam EL, and the size and the shape of the liquid immersion area LR can be maintained to be in the desired state. Therefore, the inconvenience is avoided, which would be otherwise caused, for example, such that the liquid LQ leaks, the liquid LQ cannot be recovered sufficiently via the recovery port 422, and any bubble is formed in the liquid LQ. Further, it is possible to suppress the enormous expansion of the liquid immersion area LR. Therefore, it is possible to realize the compact size of the entire exposure apparatus EX as well.

The suction mechanism 403 sucks only the gas under the condition which satisfies the foregoing expression (3). Therefore, even when the liquid LQ of the liquid immersion area LR makes contact with the porous member 435 of the suction port 432, then it is possible to satisfactorily generate the flow of the gas directed toward the optical path space K1, and it is possible to prevent the liquid LQ from leaking. Further, the generation of vibration, which is caused by the suction of the liquid LQ and the gas together, can be suppressed, because the suction mechanism 403 sucks only the gas.

The suction port 432 is formed annularly to surround the optical path space K1. Therefore, it is possible to generate the flow of the gas directed to the optical path space K1 in all of the directions from the outside to surround the optical path space K1. It is possible to prevent the liquid LQ from leaking more reliably.

The suction port 432 is provided at the position opposite to the substrate P. The predetermined space is formed between the substrate P and the lower surface 435B of the porous member 435 arranged at the suction port 432. Therefore, it is possible to satisfactorily generate the flow of the gas directed to the optical path space K1.

The recovery port 422 (lower surface 425B of the porous member 425) and the suction port 432 (lower surface 435B of the porous member 435) are provided at approximately the same height with respect to the substrate P respectively. Therefore, when the suction operation of the suction port 432 is performed, it is possible to generate the desired flow of the gas in the vicinity of the recovery port 422.

The suction port 432 is provided for the suction member 430 which is distinct from the nozzle member 470 having the recovery port 422. Therefore, for example, the position of the suction member 430 can be adjusted individually from the nozzle member 470. Therefore, it is possible to arbitrarily adjust the positional relationship between the suction port 432 and the recovery port 422, the positional relationship between the suction port 432 and the optical path space K1 (liquid LQ with which the optical path space K1 is filled), and the positional relationship between the suction port 432 and the substrate P.

Figure 25:
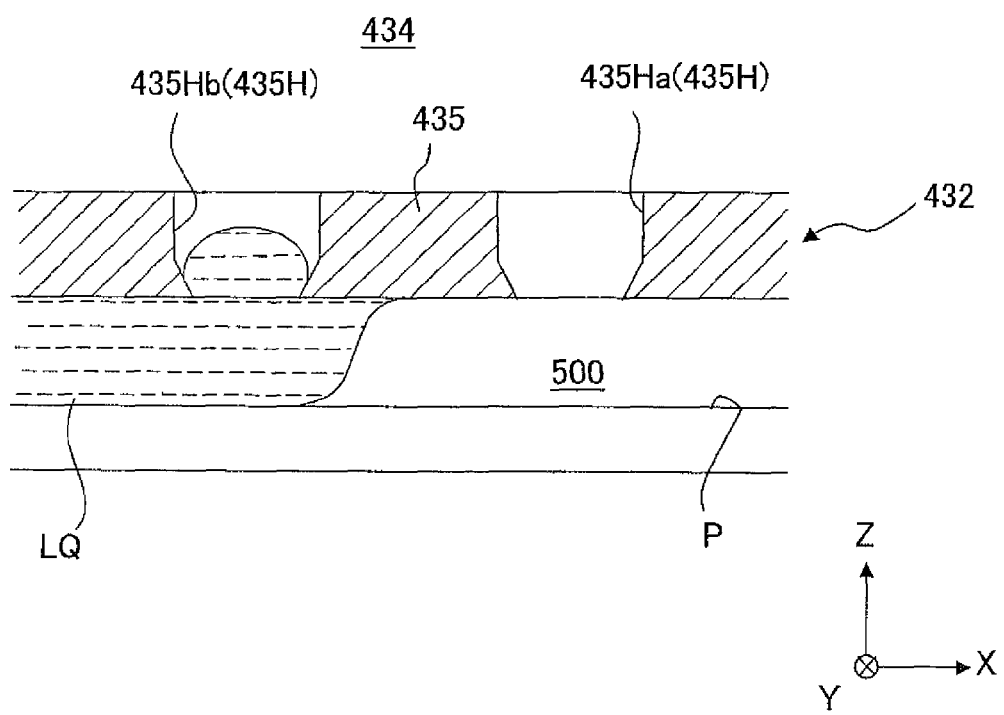
FIG. 25 shows another embodiment of the suction mechanism.

FIG. 25 shows another example of the porous member 435 arranged at the suction port 432. As shown in FIG. 25, the hole 435H of the porous member 435 may be formed to have a tapered shape which is gradually spread or widened in the direction (+Z direction) to make separation from the substrate P. For example, when the contact angle $\theta$ of the inner side surface of the hole 435H shown in FIG. 25 with respect to the liquid LQ is the same as the contact angle $\theta$ of the inner side surface of the hole 435H shown in FIG. 23 with respect to the liquid LQ, the interface of the liquid LQ to make contact with the tapered portion of the inner side surface of the second hole 435Hb is formed to have an upward circular arc-shaped form having a sufficiently small radius of curvature, by forming the hole 435H of the porous member 435 to have the tapered shape which is gradually spread or widened in the direction to make separation from the substrate P. In this arrangement, it is possible to more reliably avoid the inflow of the liquid LQ into the flow passage space 434 on the upper side of the porous member 435 via the second hole 435Hb. The tapered portion may have such a form that the portion is formed in a partial area (lower area) of the inner side surface of the hole 43511 near to the substrate P as shown in FIG. 25. Alternatively, the tapered portion may have such a form that the portion is formed to have a tapered shape as a whole from the lower end to the upper end of the hole 435H.

Tenth Embodiment

Next, a tenth embodiment will be explained. The feature of this embodiment resides in that the blow port from which the gas blows is provided further outside the optical path space K1. In the following description, the constitutive components, which are the same as or equivalent to those of the embodiment described above, are designated by the same reference numerals, any explanation of which will be simplified or omitted.

Figure 26:
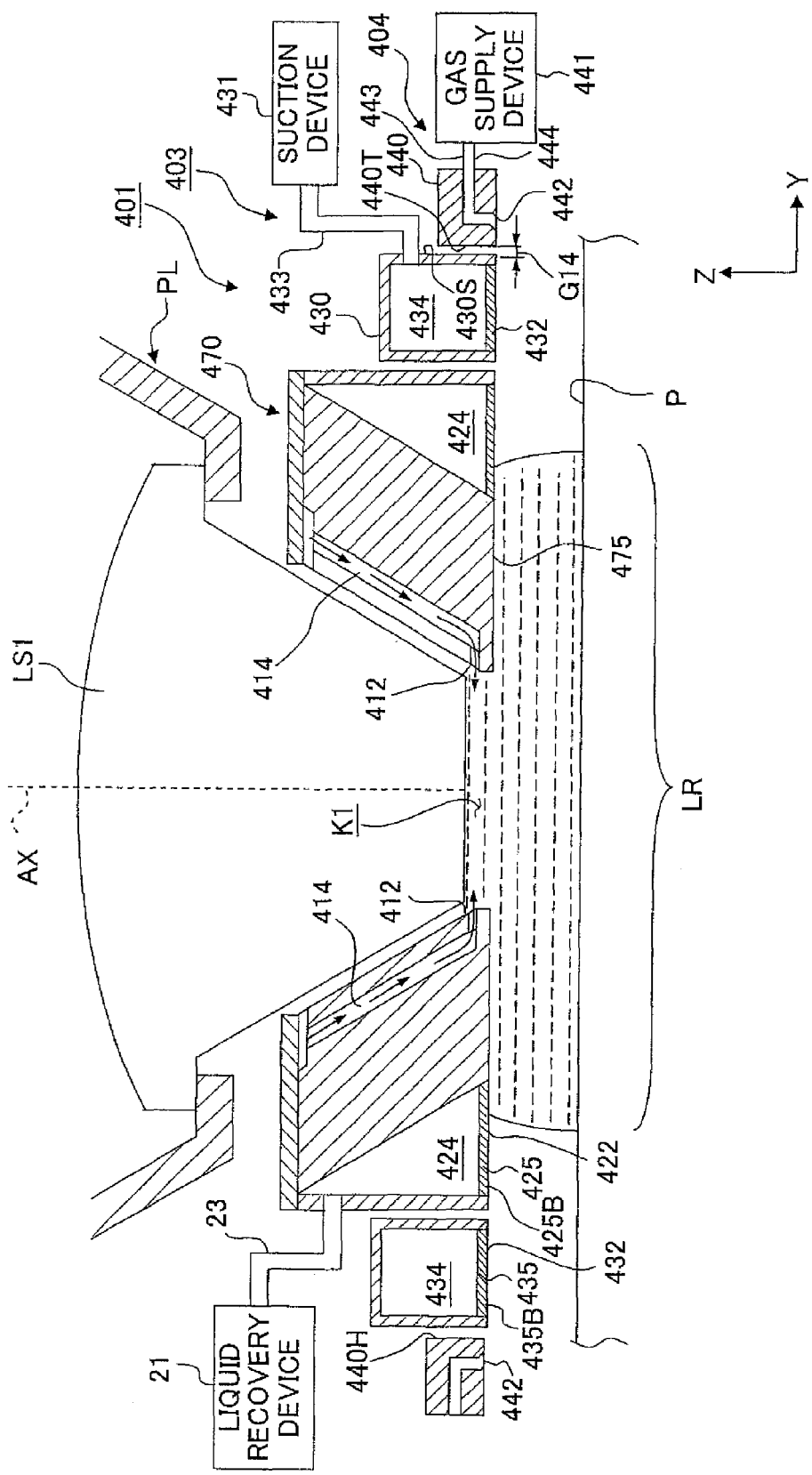
FIG. 26 shows a side sectional view illustrating magnified main components of an exposure apparatus according to a tenth embodiment.
Figure 27:
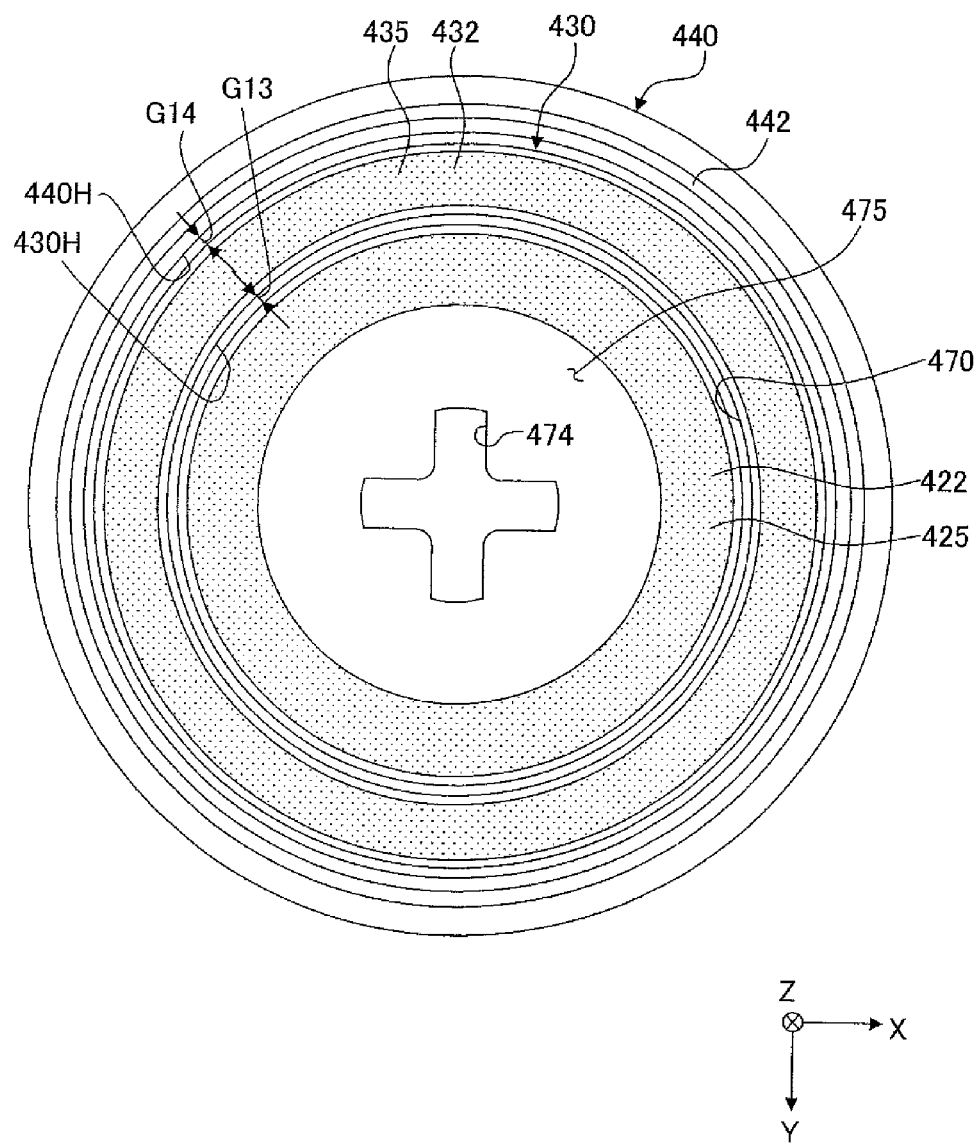
FIG. 27 shows a view illustrating those shown in FIG. 26 as viewed from a lower position.

FIG. 26 shows a side sectional view illustrating magnified main components of an exposure apparatus EX according to the tenth embodiment. FIG. 27 shows a plan view illustrating those in the vicinity of a nozzle member 470 shown in FIG. 26 as viewed from a lower position.

With reference to FIGS. 26 and 27, the exposure apparatus EX is provided with a gas supply mechanism 404 from which the gas blows. The gas supply mechanism 404 is provided with a gas nozzle member 440 which is provided in the vicinity of the suction member 430 and which has a blow port 442 from which the gas blows, a gas supply tube 443, and a gas supply device 441 which supplies the gas via the blow port 442 provided for the gas nozzle member 440. A flow passage (supply flow passage) 444 is provided in the gas nozzle member 440 to connect the blow port 442 and the gas supply tube 443. The gas nozzle member 440 is formed to have an annular form to surround the optical path space K1, the nozzle member 470, and the suction member 430.

The gas nozzle member 440 of the gas supply mechanism 404 is the member distinct from the nozzle member 470 and the suction member 430, which is arranged in the vicinity of the suction member 430. The gas nozzle member 440 is the annular member which is provided to surround the optical path space K1, the nozzle member 470, and the suction member 430 over or above the substrate P (substrate stage PST). The gas nozzle member 440 has a hole 440H which is at a central portion thereof and in which the suction member 430 can be arranged. The gas nozzle member 440 can be formed of, for example, aluminum, titanium, stainless steel, duralumin, or any alloy containing such metals. The "GOLDEP" treatment or the "GOLDEP WHITE" treatment described above can be performed to the gas nozzle member 440.

The inner side surface 440T of the hole 440H of the gas nozzle member 440 is opposite to the side surface 430S of the suction member 430. A predetermined gap G14 is provided between the inner side surface 440T of the gas nozzle member 440 and the side surface 430S of the suction member 430. Owing to the provision of the gap G14, the vibration, which is generated on one of the suction member 430 and the gas nozzle member 440, is prevented from being directly transmitted to the other. The gas nozzle member 440 is supported by a support mechanism which is distinct from the first and second support mechanisms 491, 429 explained with reference to FIG. 15. The support mechanism, which supports the gas nozzle member 440, is connected to the lower stepped portion 8 of the main column 9.

The lower surface of the gas nozzle member 440 is provided to be opposite to the surface of the substrate P supported by the substrate stage PST. The blow port 442 is provided on the lower surface of the gas nozzle member 440. That is, the blow port 442 is provided at the position opposite to the surface of the substrate P over or above the substrate P supported by the substrate stage PST. The blow port 442 and the surface of the substrate P are separated from each other by a predetermined distance. The blow port 442 is provided further outside the suction port 432 provided for the suction member 430 with respect to the optical path space K1 in the vicinity of the image plane of the projection optical system PL. The blow port 442 is formed to have the annular shape to surround the optical path space K1 (projection area AR), the recovery port 422 of the nozzle member 470, and the suction port 432 of the suction member 430. In this embodiment, the blow port 442 is formed to have the annular form as viewed in a plan view.

The blow port 442 is formed to be directed toward the optical path space K1 on the lower surface of the gas nozzle member 440. The blow port 442 blows the gas toward the optical path space K1. More specifically, the blow port 442 is provided to blow the gas onto those in the vicinity of the area of the surface of the substrate P opposite to the suction port 432.

The gas supply device 441 is provided with a filter device including, for example, a chemical filter and a particle-removing filter. It is possible to supply the clean gas passed through the filter unit. Therefore, the clean gas blows from the blow port 442. For example, the air (dry air), which is approximately the same as the gas contained in the chamber in which the exposure apparatus EX is accommodated, is used as the gas which blows via the blow port 442 by the gas supply mechanism 404. The usable gas, which blows, may be, for example, nitrogen gas (dry nitrogen).

In this embodiment, the land surface 475 of the nozzle member 470, the lower surface 425B of the porous member 425, the lower end surface of the side plate portion 470A, the lower end surface of the suction member 430, the lower surface 435B of the porous member 435, and the lower surface of the gas nozzle member 440 are provided at approximately the same position (height) in the Z axis direction respectively, and they are flush with each other.

Figure 28:
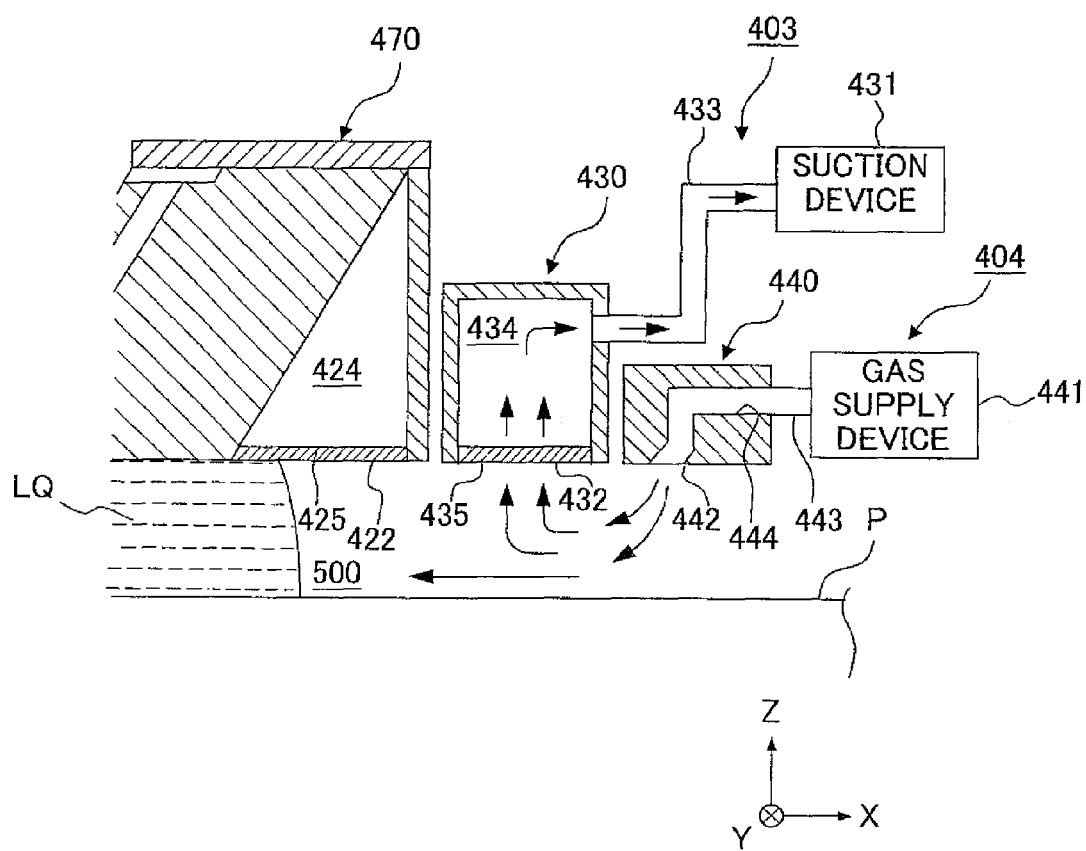
FIG. 28 schematically shows magnified main components to illustrate the operation of the exposure apparatus according to the tenth embodiment.

FIG. 28 schematically shows magnified main components to illustrate the operation of the gas supply mechanism 404. In the same manner as in the embodiment described above, when the substrate P is subjected to the liquid immersion exposure, the controller CONT fills the optical path space K1 with the liquid LQ by using the liquid immersion mechanism 401 to generate the flow of the gas directed to the optical path space K1 by using the suction mechanism 403. In this embodiment, the controller CONT performs the gas blow operation via the blow port 442 by using the gas supply mechanism 404 during the liquid immersion exposure for the substrate P. The controller CONT continues the gas blow operation via the blow port 442 during the exposure for the substrate P. In this embodiment, the gas supply amount per unit time, which is brought about by the gas supply device 441, may be always constant. Alternatively, for example, the gas supply amount may be changed depending on the scanning operation (for example, the scanning velocity) of the substrate P. Further alternatively, the gas supply amount may be adjusted depending on the gas suction amount per unit time brought about by the suction device 431 of the suction mechanism 403.

As shown in FIG. 28, the controller CONT drives the suction device 431 including the vacuum system to suck the gas via the suction port 432 provided outside the recovery port 422 with respect to the optical path space K1. Accordingly, the flow of the gas, which is directed toward the optical path space K1, is generated. Further, the controller CONT drives the gas supply device 441 to blow the gas toward the optical path space K1 via the blow port 442. The flow of the gas, which has the greater velocity toward the optical path space K1, is generated by the suction operation by the suction mechanism 403 and the gas supply operation by the gas supply mechanism 404. Therefore, even if the liquid LQ (interface LG of the liquid LQ), with which the optical path space K1 is filled, intends to move to the outside of the optical path space K1, it is possible to more reliably prevent the liquid LQ from leaking to the outside of the predetermined space K2 including the optical path space K1 by means of the force of the gas.

That is, in this embodiment, the suction mechanism 403 and the gas supply mechanism 404 function as the seal mechanism for enclosing the liquid LQ at the inside of the suction port 342, and it is possible to prevent the liquid LQ from leaking to the outside of the predetermined space K2. Therefore, it is possible to avoid the inconvenience which would be otherwise caused, for example, such that any liquid droplet remains on the substrate P.

In this embodiment, as shown in FIG. 27, the blow port 442 is formed to have the annular shape. However, for example, a plurality of blow ports, which are slit-shaped and substantially circular arc-shaped as viewed in a plan view, may be arranged at predetermined intervals to surround the optical path space K1. Alternatively, a plurality of blow ports, which are circular as viewed in a plan view, may be arranged at predetermined intervals to surround the optical path space K1.

In this embodiment, the blow port 442 blows the gas obliquely toward the vicinity of the area of the surface of the substrate P opposite to the suction port 432. However, it is also allowable that the gas blows onto the vicinity of the area of the surface of the substrate P opposite to the blow port 442. That is, the gas supply mechanism 404 may blow the gas onto the portion just under the blow port 442. Also in this arrangement, the gas, which blows onto the substrate P, flows toward the optical path space K1. Therefore, it is possible to prevent the liquid LQ from leaking.

In the ninth and tenth embodiments described above, the land surface 475 and the lower surface 425B of the porous member 425 are formed to be substantially flush with each other. However, it is also allowable that any difference in height is present. For example, the lower surface 425B of the porous member 425 may be provided at a position (position in the +Z direction) slightly higher than the land surface 475. Similarly, any difference in height may be present between the lower surface 425B of the porous member 425 and the lower surface 435B of the porous member 435.

In the ninth and tenth embodiments described above, the lower surface 435B of the porous member 435 provided at the suction port 432 is substantially parallel to the surface of the substrate P (XY plane). However, the lower surface 435B of the porous member 435 provided at the suction port 432 may be inclined with respect to the surface of the substrate P supported by the substrate stage PST so that the distance with respect to the surface of the substrate P is gradually increased in relation to the direction to make separation from the optical path space K1. Similarly, the lower surface 425B of the porous member 425 provided at the recovery port 422 may be inclined with respect to the surface of the substrate P supported by the substrate stage PST so that the distance with respect to the surface of the substrate P is gradually increased in relation to the direction to make separation from the optical path space K1.

In the ninth and tenth embodiments described above, the position of the suction member 430 may be fixed by the second support mechanism 492. Alternatively, for example, an actuator (driving mechanism) may be provided for the second support mechanism 492, and the suction member 430 may be supported movably by the second support mechanism 492. Further alternatively, an elastic member (flexible member) such as rubber or spring may be provided between the second support mechanism 492 and the suction member 430, and the suction member 430 may be movable (capable of making swinging movement) with respect to the second support mechanism 492. Similarly, the position of the gas nozzle member 440 explained in the tenth embodiment may be fixed, or the gas nozzle member 440 may be supported movably.

In the ninth and tenth embodiments described above, a fin-shaped member may be provided on the lower surface 435B of the porous member 435 arranged at the suction port 432. When the fin-shaped member is provided, it is possible to guide the flow of the gas to be generated. A fin-shaped member may be provided on the lower surface 425B of the porous member 425 arranged at the recovery port 422. When the fin-shaped member is provided, it is possible to increase the liquid contact area on the lower surface 425B of the porous member 425 arranged at the recovery port 422. Therefore, it is possible to improve the performance for holding the liquid LQ on the lower surface of the nozzle member 470. It is possible to prevent the liquid LQ from leaking more reliably.

In the ninth and tenth embodiments described above, the nozzle member 470 and the suction member 430 may be provided in an integrated manner. The recovery port 422 and the suction port 432 may be formed for the integrated member respectively.

In the embodiments described above, the flow of the gas, which is directed to the center of the optical path space K1, is generated by the gas supply mechanism 3, 404 and the gas suction mechanism 403. However, the flow of the gas can be generated in any direction by changing the direction and the attachment position of the blow port for the gas. For example, it is possible to generate the gas flow (cyclone) which circumscribes the optical path space K1 or which is directed to the center of the optical path space (optical axis of the projection optical system) while circumscribing the optical path space K1. The optical path space K1 may be surrounded by the gas flow allowed to flow in the optical axis direction of the projection optical system (air curtain type). The gas flow, which flows in the optical axis direction of the projection optical system, may flow to the outside of the optical path space K1 after restraining the liquid LQ existing in the optical path space K1. For example, in the embodiment shown in FIGS. 26 to 28, the blow port 442 or the gas nozzle member 440 for blowing the gas may be installed on the side nearer to the optical path space K1 than the suction member 430.

In the embodiment described above, the liquid immersion mechanism 401 supplies the liquid LQ in the Y axis direction with respect to the optical path space K1. However, for example, the recovery ports 412 may be provided on the both sides in the X axis direction respectively with respect to the optical path space K1, and the liquid LQ may be supplied in the X axis direction with respect to the optical path space K1. The structure of the liquid immersion mechanism 401 including, for example, the nozzle member 70 is not limited to the structure described above. For example, it is also possible to use those described in European Patent Publication No. 1420298 and International Publication Nos. 2004/055803, 2004/057589, 2004/057590, and 2005/029559.

As described above, pure water is used as the liquid LQ in the embodiment of the present invention. Pure water is advantageous in that pure water is available in a large amount with ease, for example, in the semiconductor production factory, and pure water exerts no harmful influence, for example, on the optical element (lens) and the photoresist on the substrate P. Further, pure water exerts no harmful influence on the environment, and the content of impurity is extremely low. Therefore, it is also expected to obtain the function to clean the surface of the substrate P and the surface of the optical element provided at the end surface of the projection optical system PL. When the purity of pure water supplied from the factory or the like is low, it is also allowable that the exposure apparatus is provided with an ultra pure water-producing device.

It is approved that the refractive index n of pure water (water) with respect to the exposure light beam EL having a wavelength of about 193 nm is approximately 1.44. When the ArF excimer laser beam (wavelength: 193 nm) is used as the light source of the exposure light beam EL, then the wavelength is shortened on the substrate P by 1/n, i.e., to about 134 nm, and a high resolution is obtained. Further, the depth of focus is magnified about n times, i.e., about 1.44 times as compared with the value obtained in the air. Therefore, when it is enough to secure an approximately equivalent depth of focus as compared with the case of the use in the air, it is possible to further increase the numerical aperture of the projection optical system PL. Also in this viewpoint, the resolution is improved.

In the embodiment of the present invention, the first optical element LS1 is attached to the end portion of the projection optical system PL. The optical element makes it possible to adjust the optical characteristics of the projection optical system PL, for example, the aberration (for example, spherical aberration and comatic aberration). The optical element, which is attached to the end portion of the projection optical system PL, may be an optical plate which is usable to adjust the optical characteristics of the projection optical system PL. Alternatively, the optical element may be a plane parallel plate or parallel flat plate through which the exposure light beam EL is transmissive.

When the pressure, which is generated by the flow of the liquid LQ, is large between the substrate P and the first optical element LS1 at the end portion of the projection optical system PL, it is also allowable that the optical element is tightly fixed so that the optical element is not moved by the pressure, without allowing the optical element to be exchangeable.

In the embodiment of the present invention, the space between the projection optical system PL and the surface of the substrate P is filled with the liquid LQ. However, for example, the following arrangement is also allowable. That is, the space is filled with the liquid LQ in such a state that a cover glass composed of a parallel flat plate is attached to the surface of the substrate P.

In the case of the projection optical system according to the embodiment described above, the optical path space, which is on the image plane side of the optical element arranged at the end portion, is filled with the liquid. However, it is also possible to adopt such a projection optical system that the optical path space, which is on the side of the mask in relation to the optical element arranged at the end portion, is also filled with the liquid, as disclosed in International Publication No. 2004/019128.

The liquid LQ is water in the embodiment of the present invention. However, the liquid LQ may be any liquid other than water. For example, when the light source of the exposure light beam EL is the $F_2$ laser, the $F_2$ laser beam is not transmitted through water. Therefore, those preferably usable as the liquid LQ may include, for example, fluorine-based fluids such as fluorine-based oil and perfluoropolyether (PFPE) through which the $F_2$ laser beam is transmissive. In this case, the portion, which makes contact with the liquid LQ, is subjected to a liquid-attracting treatment by forming, for example, a thin film with a substance having a molecular structure containing fluorine having small polarity. Alternatively, other than the above, it is also possible to use, as the liquid LQ, those (for example, cedar oil) which have the transmittance with respect to the exposure light beam EL, which have the refractive index as high as possible, and which are stable against the photoresist applied to the surface of the substrate P and the projection optical system PL.

Those having refractive indexes of about 1.6 to 1.8 may be used as the liquid LQ. Further, the optical element LS1 may be formed of a material having a refractive index (for example, not less than 1.6) higher than those of silica glass and calcium fluoride. It is also possible to use, as the liquid LQ, various liquids including, for example, supercritical liquids.

The substrate P, which is usable in the respective embodiments described above, is not limited to the semiconductor wafer for producing the semiconductor device. Those applicable include, for example, the glass substrate for the display device, the ceramic wafer for the thin film magnetic head, and the master plate (synthetic silica glass, silicon wafer) for the mask or the reticle to be used for the exposure apparatus.

As for the exposure apparatus EX, the present invention is also applicable to the scanning type exposure apparatus (scanning stepper) based on the step-and-scan system for performing the scanning exposure with the pattern of the mask M by synchronously moving the mask M and the substrate P as well as the projection exposure apparatus (stepper) based on the step-and-repeat system for performing the full field exposure with the pattern of the mask M in a state in which the mask M and the substrate P are allowed to stand still, while successively step-moving the substrate P.

As for the exposure apparatus EX, the present invention is also applicable to the exposure apparatus based on the system in which the full field exposure is performed on the substrate P by using a projection optical system (for example, the dioptric type projection optical system having a reduction magnification of ⅛ and including no catoptric element) with a reduction image of a first pattern in a state in which the first pattern and the substrate P substantially stand still. In this case, the present invention is also applicable to the full field exposure apparatus based on the stitch system in which the full field exposure is further performed thereafter on the substrate P by partially overlaying a reduction image of a second pattern with respect to the first pattern by using the projection optical system in a state in which the second pattern and the substrate P substantially stand still. As for the exposure apparatus based on the stitch system, the present invention is also applicable to the exposure apparatus based on the step-and-stitch system in which at least two patterns are partially overlaid and transferred on the substrate P, and the substrate P is successively moved. The embodiments described above have been explained as exemplified by the exposure apparatus provided with the projection optical system PL by way of example. The present invention is applicable to the exposure apparatus and the exposure method in which the projection optical system PL is not used. Even when the projection optical system PL is not used as described above, then the exposure light beam is irradiated onto the substrate via an optical member such as a lens, and the liquid immersion area is formed in a predetermined space between such an optical member and the substrate.

The present invention is also applicable to the twin-stage type exposure apparatus. The structure and the exposure operation of the twin-stage type exposure apparatus are disclosed, for example, in Japanese Patent Application Laid-open Nos. 10-163099 and 10-214783 (corresponding to U.S. Pat. Nos. 6,341,007, 6,400,441, 6,549,269, and 6,590,634), Japanese Patent Application Laid-open No. 2000-505958 (PCT) (corresponding to U.S. Pat. No. 5,969,441), and U.S. Pat. No. 6,208,407. The disclosures thereof are incorporated herein by reference within a range of permission of the domestic laws and ordinances of the state designated or selected in this international application.

The present invention is also applicable to the exposure apparatus which is provided with the substrate stage which retains the substrate P and the measuring stage which carries various photoelectric sensors and/or fiducial members formed with fiducial marks, as disclosed, for example, in Japanese Patent Application Laid-open Nos. 11-135400 and 2000-164504.

In the embodiments described above, the exposure apparatus is adopted, in which the space between the projection optical system PL and the substrate P is locally filled with the liquid. However, the present invention is also applicable to the liquid immersion exposure apparatus to perform the exposure in a state in which the entire surface of the substrate as the exposure objective is immersed in the liquid, as disclosed, for example, in Japanese Patent Application Laid-open Nos. 6-124873 and 10-303114 and U.S. Pat. No. 5,825,043. The structure and the exposure operation of the exposure apparatus as described above are disclosed in detail, for example, in U.S. Pat. No. 5,825,043. The contents of the description of United States patent are incorporated herein by reference within a range of permission of the domestic laws and ordinances of the state designated or selected in this international application.

In the embodiments described above, the light-transmissive type mask is used, in which the predetermined light-shielding pattern (or phase pattern or dimming or light-reducing pattern) is formed on the light-transmissive substrate. However, in place of such a mask, as disclosed, for example, in U.S. Pat. No. 6,778,257, it is also allowable to use an electronic mask on which a transmissive pattern, a reflective pattern, or a light-emitting pattern is formed on the basis of the electronic data of the pattern to be transferred.

The present invention is also applicable to the exposure apparatus (lithography system) in which the substrate P is exposed with a line-and-space pattern by forming interference fringes on the substrate P as disclosed in International Publication No. 2001/035168.

As described above, the exposure apparatus EX according to the embodiment of the present invention is produced by assembling the various subsystems including the respective constitutive elements as defined in claims so that the predetermined mechanical accuracy, the electric accuracy, and the optical accuracy are maintained. In order to secure the various accuracies, those performed before and after the assembling include the adjustment for achieving the optical accuracy for the various optical systems, the adjustment for achieving the mechanical accuracy for the various mechanical systems, and the adjustment for achieving the electric accuracy for the various electric systems. The steps of assembling the various subsystems into the exposure apparatus include, for example, the mechanical connection, the wiring connection of the electric circuits, and the piping connection of the air pressure circuits in correlation with the various subsystems. It goes without saying that the steps of assembling the respective individual subsystems are performed before performing the steps of assembling the various subsystems into the exposure apparatus. When the steps of assembling the various subsystems into the exposure apparatus are completed, the overall adjustment is performed to secure the various accuracies as the entire exposure apparatus. It is desirable that the exposure apparatus is produced in a clean room in which, for example, the temperature and the cleanness are managed.

Figure 29:
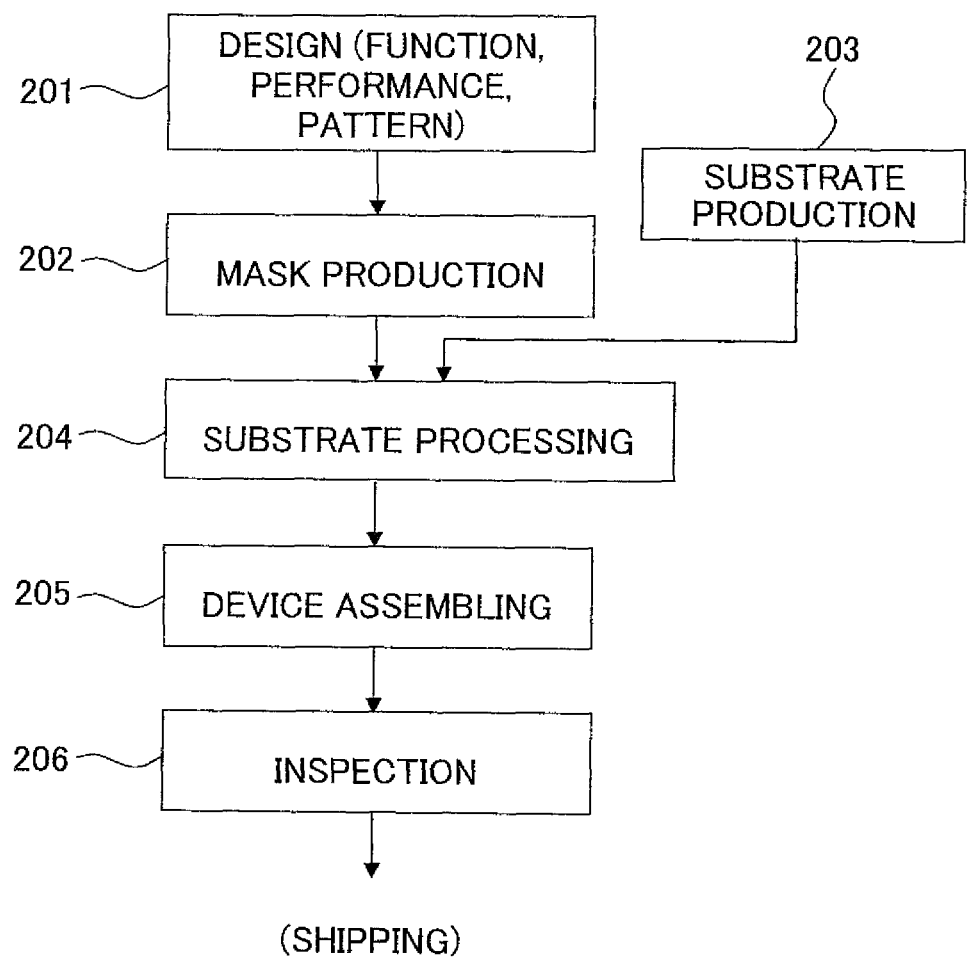
FIG. 29 shows a flow chart illustrating exemplary steps of producing a microdevice.

As shown in FIG. 29, the microdevice such as the semiconductor device is produced by performing, for example, a step 201 of designing the function and the performance of the microdevice, a step 202 of manufacturing a mask (reticle) based on the designing step, a step 203 of producing a substrate as a base material for the device, a substrate-processing (exposure process) step 204 of exposing the substrate with the pattern of the mask by using the exposure apparatus EX of the embodiment described above and developing the exposed substrate, a step of assembling the device (including a dicing step, a bonding step, and a packaging step) 205, and an inspection step 206.

INDUSTRIAL APPLICABILITY

As for the type of the exposure apparatus EX, the present invention is not limited to the exposure apparatus for the semiconductor device production for exposing the substrate P with the semiconductor device pattern. The present invention is also widely applicable, for example, to the exposure apparatus for producing the liquid crystal display device or for producing the display as well as the exposure apparatus for producing, for example, the thin film magnetic head, the image pickup device (CCD), the reticle, or the mask.

What is claimed is:

1. A liquid immersion exposure apparatus in which a substrate is exposed with an exposure beam via a liquid immersion area formed on a portion of a surface of the substrate, the apparatus comprising:
    a projection system;
    a first nozzle member having an aperture through which the exposure beam is projected, the first nozzle member having a liquid supply inlet and a liquid recovery outlet;
    a second nozzle member having a gas supply inlet via which a gas is supplied to a space surrounding the liquid immersion area during the exposure;
    a driving system having a motor, which moves the second nozzle member relative to the first nozzle member using the motor; and
    a stage system having a holder which holds the substrate and which is movable relative to and below the projection system, the first nozzle member and the second nozzle member.

2. The apparatus according to claim 1, further comprising:
    a support frame; and a first supporting system connected to the support frame and configured to support the first nozzle member.

3. The apparatus according to claim 1, further comprising:
a support frame; and
a second supporting system connected to the support frame and configured to support the second nozzle member, the second supporting system having the driving system.

4. The apparatus according to claim 3, further comprising a first supporting system connected to the support frame and configured to support the first nozzle member.

5. The apparatus according to claim 3, wherein the support frame supports the projection system.

6. The apparatus according to claim 5, further comprising an anti-vibration device disposed between the support frame and the projection system.

7. The apparatus according to claim 5, wherein the projection system is supported by the support frame via an anti-vibration device.

8. The apparatus according to claim 1, wherein the driving system moves the second nozzle using Lorentz force.

9. The apparatus according to claim 1, wherein:
the projection system has a final optical element; and
the driving system moves the second nozzle member in a direction substantially parallel to an optical axis of the final optical element of the projection system.

10. The apparatus according to claim 1, wherein:
the projection system has a final optical element; and
the driving system moves the second nozzle member in a direction substantially perpendicular to an optical axis of the final optical element of the projection system.

11. The apparatus according to claim 1, wherein:
the projection system has a final optical element; and
the driving system rotates the second nozzle member around an axis substantially perpendicular to an optical axis of the final optical element of the projection system.

12. The apparatus according to claim 1, further comprising a controller, wherein the controller controls the driving system on the basis of information on a contact angle between immersion liquid to be supplied from the liquid supply inlet and the surface of the substrate.

13. The apparatus according to claim 1, further comprising a controller, wherein the controller controls the driving system on the basis of information on affinity between immersion liquid to be supplied from the liquid supply inlet and the surface of the substrate.

14. The apparatus according to claim 1, further comprising a controller, wherein the controller controls the driving system based on a condition for moving the stage system.

15. The apparatus according to claim 14, wherein the condition includes a moving velocity of the stage system.

16. The apparatus according to claim 15, wherein the substrate is exposed with the exposure beam while moving the substrate in a scanning direction and the moving velocity includes a scanning velocity at which the substrate is moved during scanning exposure.

17. The apparatus according to claim 1, further comprising a detector which obtains positional information of the second nozzle member.

18. The apparatus according to claim 17, wherein the driving system moves the second nozzle member based on the positional information obtained using the detector.

19. The apparatus according to claim 1, wherein the gas supply inlet faces downwardly.

20. The apparatus according to claim 1, wherein the gas supply inlet is arranged such that the surface of the substrate is opposite to the gas supply inlet during the exposure.

21. The apparatus according to claim 1, wherein the gas supply inlet supplies the gas in an inclined direction.

22. The apparatus according to claim 1, wherein the gas supply inlet is arranged such that a path of the exposure beam is surrounded by the gas supply inlet.

23. The apparatus according to claim 1, wherein the second nozzle member has an aperture through which the exposure beam is projected.

24. The apparatus according to claim 1, wherein the second nozzle member has a looped shape.

25. The apparatus according to claim 1, further comprising a suction device configured to discharge gas from a gap between the first and second nozzle members.

26. The apparatus according to claim 1, wherein a flow rate of the gas supplied via the gas supply inlet is adjustable.

27. The apparatus according to claim 26, wherein the flow rate of the gas is adjusted on the basis of information on a contact angle between immersion liquid to be supplied from the liquid supply inlet and the surface of the substrate.

28. The apparatus according to claim 26, wherein the flow rate of the gas is adjusted based on a condition for moving the stage system.

29. The apparatus according to claim 28, wherein the condition includes a moving velocity of the stage system.

30. The apparatus according to claim 1, wherein the gas supply inlet is arranged radially outward of the liquid recovery outlet with respect to a path of the exposure beam.

31. The apparatus according to claim 1, wherein the second nozzle member is movable by the driving system such that a distance between the second nozzle member and the substrate in a direction parallel to an optical axis of a final optical element of the projection system is adjusted.

32. A device manufacturing method comprising:
exposing a substrate using the apparatus defined in claim 1; and
processing the exposed substrate.

33. A liquid immersion exposure method comprising:
exposing a substrate with an exposure beam from a projection system via a liquid immersion area formed on a portion of a surface of the substrate;
supplying immersion liquid from above the substrate via a liquid supply inlet of a first nozzle member having an aperture through which the exposure beam is projected;
collecting the immersion liquid from above the substrate via a liquid recovery outlet of the first nozzle member;
supplying a gas via a gas supply inlet of a second nozzle member to a space surrounding the liquid immersion area; and
moving the second nozzle member relative to the first nozzle member using a motor.

34. The method according to claim 33, wherein the second nozzle member is moved in a direction substantially parallel to an optical axis of a final optical element of the projection system.

35. The method according to claim 33, wherein the second nozzle member is moved in a direction substantially perpendicular to an optical axis of a final optical element of the projection system.

36. The method according to claim 33, wherein the second nozzle member is rotated around an axis substantially perpendicular to an optical axis of a final optical element of the projection system.

37. The method according to claim 33, wherein the second nozzle member is moved on the basis of information on a contact angle between immersion liquid to be supplied from the liquid supply inlet and the surface of the substrate.

38. The method according to claim 33, wherein the second nozzle member is moved on the basis of information on affinity between immersion liquid to be supplied from the liquid supply inlet and the surface of the substrate.

39. The method according to claim 33, wherein the nozzle member is moved based on a moving condition of the substrate.

40. The method according to claim 39, wherein the moving condition includes a moving velocity of the substrate.

41. The method according to claim 40, wherein the substrate is exposed with the exposure beam while moving the substrate in a scanning direction and the moving velocity includes a scanning velocity at which the substrate is moved during scanning exposure.

42. The method according to claim 33, further comprising obtaining positional information of the second nozzle member.

43. The method according to claim 42, wherein the second nozzle member is moved based on the obtained positional information.

44. The method according to claim 33, wherein the gas supply inlet is arranged such that the surface of the substrate is opposite to the gas supply inlet during the exposure.

45. The method according to claim 33, wherein the gas supply inlet supplies the gas in an inclined direction.

46. The method according to claim 33 wherein the gas supply inlet is arranged such that a path of the exposure beam is surrounded by the gas supply inlet.

47. The method according to claim 33, further comprising discharging gas from a gap between the first and second nozzle members.

48. The method according to claim 33, further comprising adjusting a flow rate of the gas to be supplied via the gas supply inlet.

49. The method according to claim 48, wherein the flow rate of the gas is adjusted on the basis of information on a contact angle between immersion liquid to be supplied from the liquid supply inlet and the surface of the substrate.

50. The method according to claim 48, wherein the flow rate of the gas is adjusted based on a condition for moving the substrate.

51. The method according to claim 50, wherein the condition includes a moving velocity of the substrate.

52. The method according to claim 33, wherein the gas supply inlet is arranged radially outward of the liquid recovery outlet with respect to a path of the exposure beam.

53. The method according to claim 33, wherein the second nozzle member is moved such that a distance between the second nozzle member and the substrate in a direction parallel to an optical axis of a final optical element of the projection system is adjusted.

54. A device manufacturing method comprising:
exposing a substrate using the method defined in claim 33; and
processing the exposed substrate.

* * * * *